(12) United States Patent
Ishida

(10) Patent No.: US 8,789,321 B2
(45) Date of Patent: Jul. 29, 2014

(54) ROOF STRUCTURE, CLAMP FOR SOLAR CELL MODULE, AND METHOD FOR MOUNTING SOLAR CELL MODULE

(75) Inventor: Kensuke Ishida, Yasu (JP)

(73) Assignee: Kaneka Corporation, Osaka (JP)

( * ) Notice: Subject to any disclaimer, the term of this patent is extended or adjusted under 35 U.S.C. 154(b) by 0 days.

(21) Appl. No.: 13/578,604

(22) PCT Filed: Feb. 8, 2011

(86) PCT No.: PCT/JP2011/052580
§ 371 (c)(1),
(2), (4) Date: Aug. 10, 2012

(87) PCT Pub. No.: WO2011/099462
PCT Pub. Date: Aug. 18, 2011

(65) Prior Publication Data
US 2012/0304559 A1 Dec. 6, 2012

(30) Foreign Application Priority Data

Feb. 13, 2010 (JP) .................................. 2010-029579
Feb. 13, 2010 (JP) .................................. 2010-029583

(51) Int. Cl.
*E04D 13/18* (2014.01)
(52) U.S. Cl.
USPC .......................................... 52/173.3; 52/509
(58) Field of Classification Search
USPC ................................. 52/173.3, 509
See application file for complete search history.

(56) References Cited

U.S. PATENT DOCUMENTS 297,862 A * 4/1884 Smith .............................. 52/520
1,971,932 A * 8/1934 Guiterman ........................ 52/24

(Continued)

FOREIGN PATENT DOCUMENTS

| JP | 08232413 | 9/1996 |
| JP | 2001090273 | 4/2001 |

(Continued)

OTHER PUBLICATIONS

Machine translation of JP 2007-291814, date pulled Sep. 5, 2013, p. 1-9.*

(Continued)

*Primary Examiner* — Elizabeth A Plummer
(74) *Attorney, Agent, or Firm* — Alleman Hall McCoy Russell & Tuttle LLP

(57) ABSTRACT

It is an object to develop a roof structure having a high capacity for water interception, being safe from leaking of rain, and ensuring a certain level of mounting strength even in breaking of one piece of roof members. Solar cell modules (10) are mounted on a fundamental roof structure (3) with slate tiles (roof member) (2) via eaves-side mounting brackets (eaves-side clamps) (5) and intermediate mounting brackets (clamps) (6). The intermediate mounting brackets (6) each are attached to an end portion of a specific roof member so that a lower plate (72) is positioned between the specific roof member and an underlying roof member. The lower plate (72) is fixed by a screw or the like driven in a hole (100). The specific roof member is arranged over the underlying roof member in which the screw is driven, thereby protecting an attaching hole (12) from rainwater seepage. An upper plate 73 overlaps the specific roof member with a fastening element (117, 118, 119) driven into the attaching hole (12). An overlying roof member is arranged over the specific roof member, thereby also protecting the attaching hole (12) from rainwater seepage.

8 Claims, 45 Drawing Sheets

(56) References Cited

U.S. PATENT DOCUMENTS

| | | | |
|---|---|---|---|
| 2,659,323 A * | 11/1953 | Alvarez, Jr. | 52/302.1 |
| 4,432,341 A * | 2/1984 | Howe et al. | 126/623 |
| 4,677,248 A * | 6/1987 | Lacey | 136/244 |
| 5,398,476 A * | 3/1995 | Knight | 52/698 |
| 6,052,961 A * | 4/2000 | Gibbs | 52/518 |
| 6,341,454 B1 * | 1/2002 | Koleoglou | 52/173.3 |
| 6,453,629 B1 * | 9/2002 | Nakazima et al. | 52/173.3 |
| 7,155,870 B2 * | 1/2007 | Almy | 52/544 |
| 7,328,534 B2 * | 2/2008 | Dinwoodie | 52/173.3 |
| 8,141,306 B2 * | 3/2012 | Masuda et al. | 52/173.3 |
| 8,276,329 B2 * | 10/2012 | Lenox | 52/173.3 |
| 8,309,840 B2 * | 11/2012 | Stevens et al. | 136/251 |
| 2004/0000334 A1 * | 1/2004 | Ressler | 136/251 |
| 2010/0101157 A1 * | 4/2010 | Posnansky | 52/90.1 |
| 2011/0094560 A1 * | 4/2011 | Keenihan et al. | 136/244 |
| 2011/0314751 A1 * | 12/2011 | Jette | 52/173.3 |
| 2011/0314753 A1 * | 12/2011 | Farmer et al. | 52/173.3 |
| 2012/0272591 A1 * | 11/2012 | Posnansky | 52/173.3 |

FOREIGN PATENT DOCUMENTS

| | | |
|---|---|---|
| JP | 2002235406 A | 8/2002 |
| JP | 2002276096 | 9/2002 |
| JP | 2003082824 | 3/2003 |
| JP | 2007291814 | 11/2007 |
| JP | 2008274646 | 11/2008 |
| WO | 2006043658 A1 | 4/2006 |

OTHER PUBLICATIONS

ISA Japan, International Search Report of PCT/JP2011/052580, Mar. 8, 2011, WIPO, 5 pages.

International Bureau of WIPO, Translation of the International Preliminary Report on Patentability of PCT/JP2011/052580, Feb. 8, 2011, Switzerland, 8 pages.

* cited by examiner

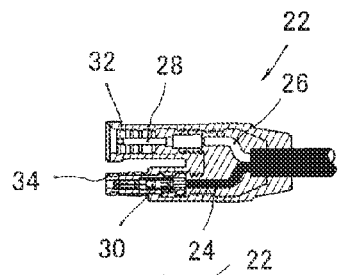
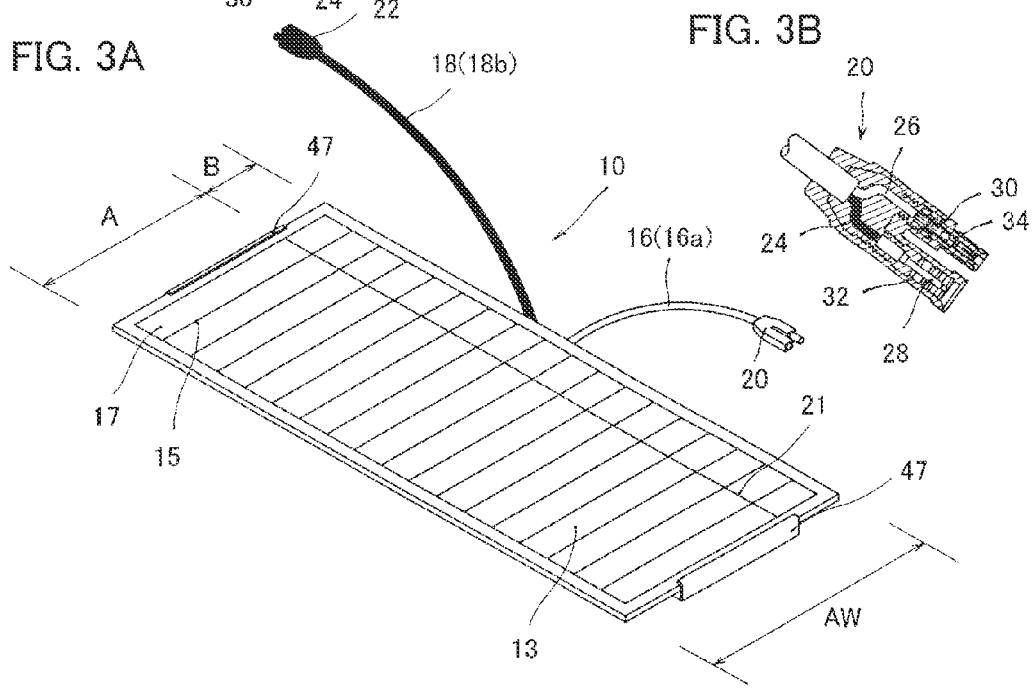

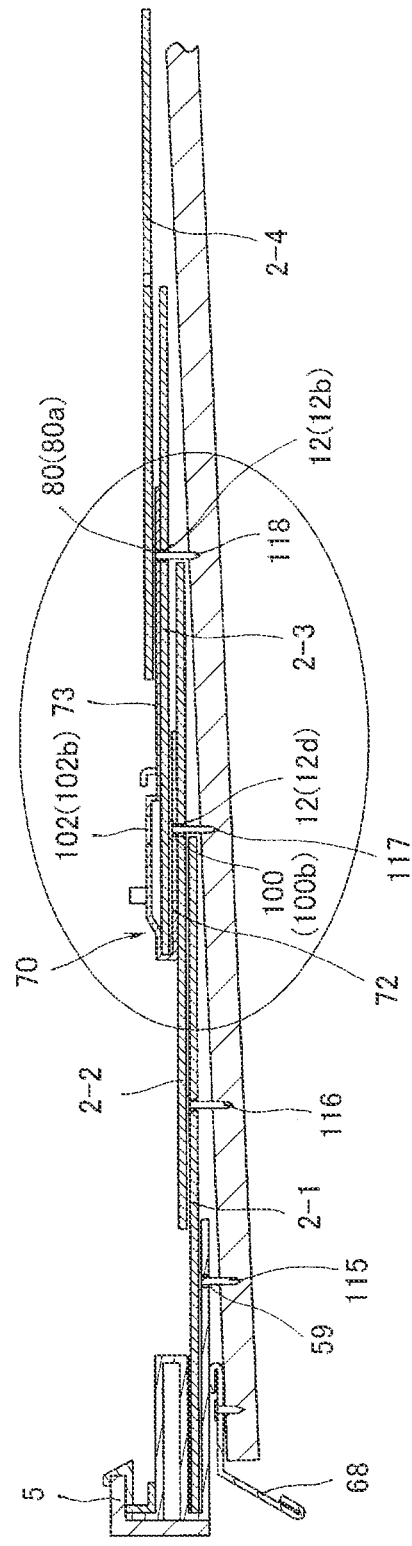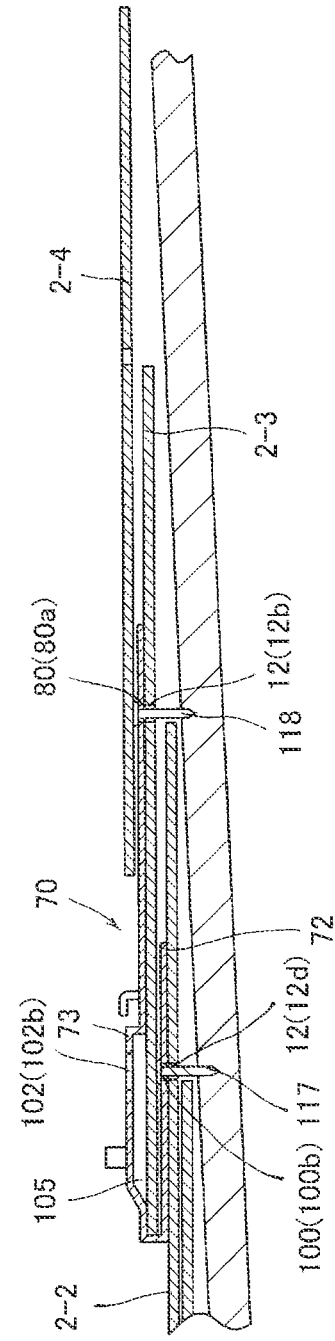

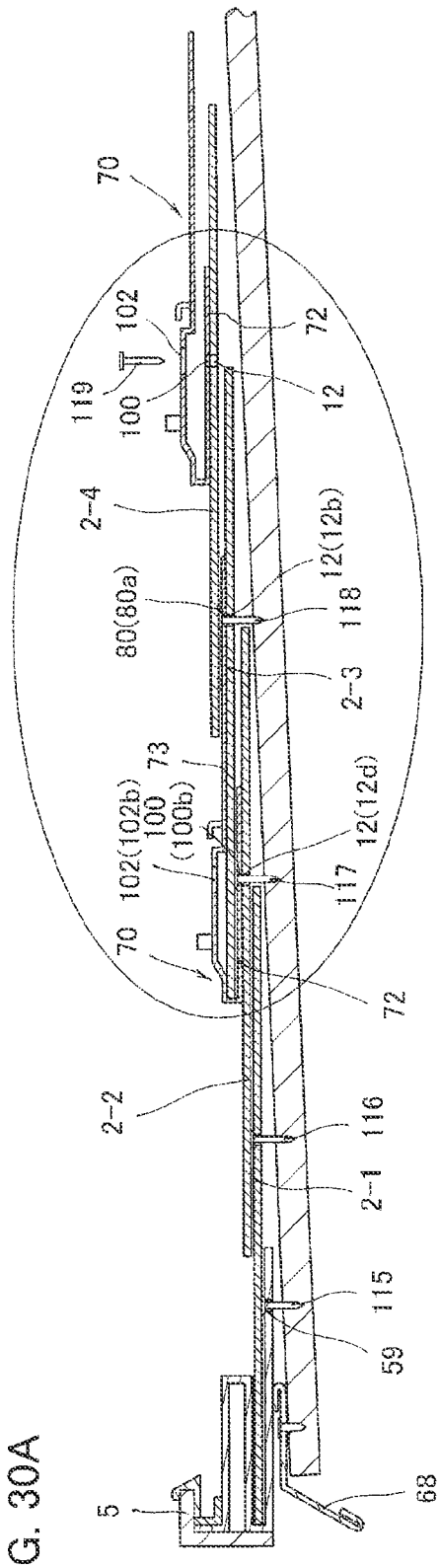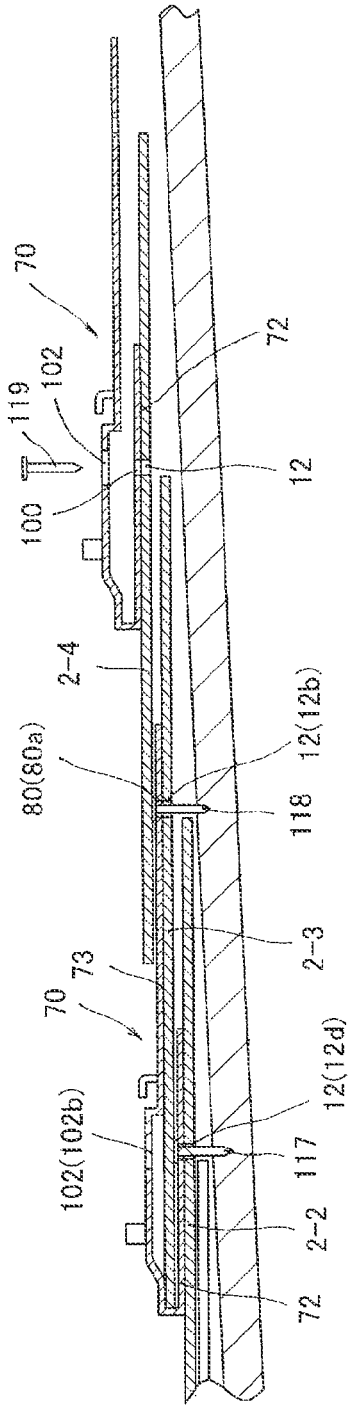
FIG. 30A
FIG. 30B

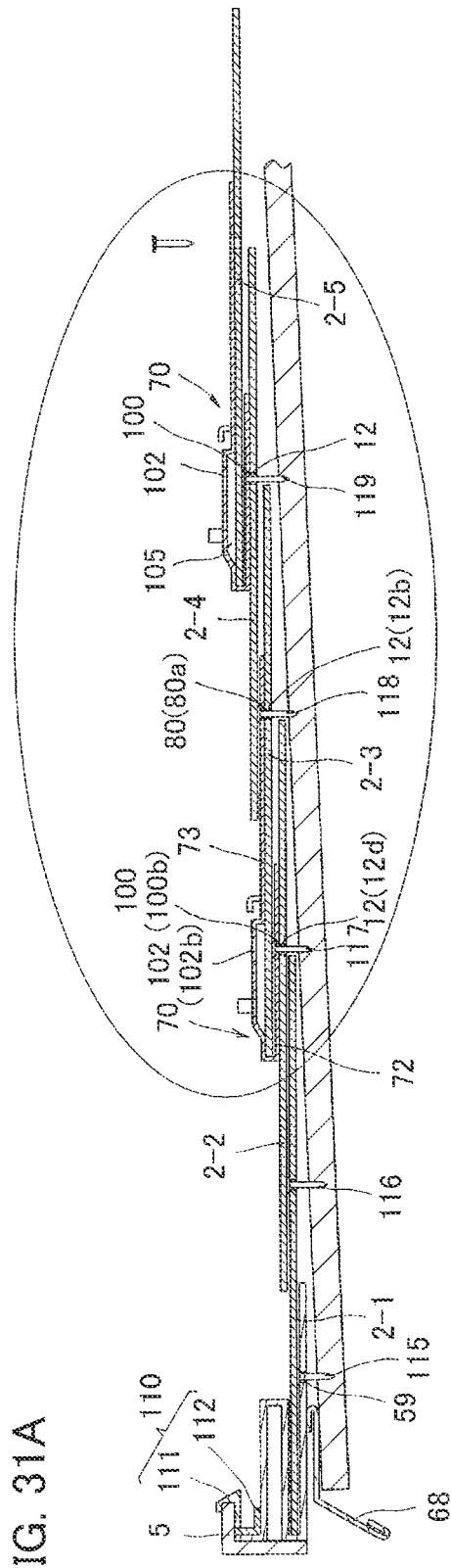
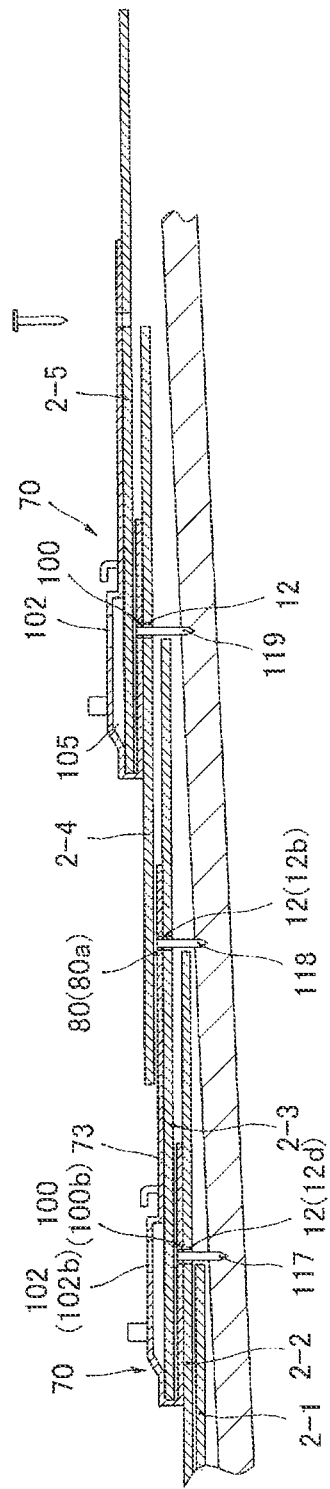
FIG. 31A
FIG. 31B

FIG. 34
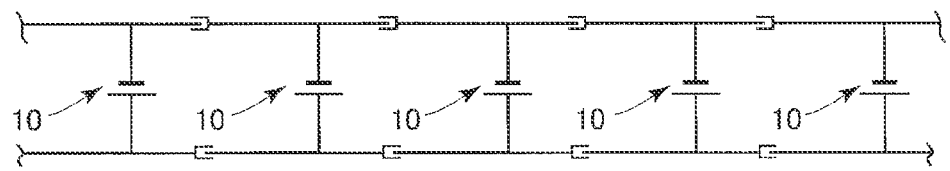
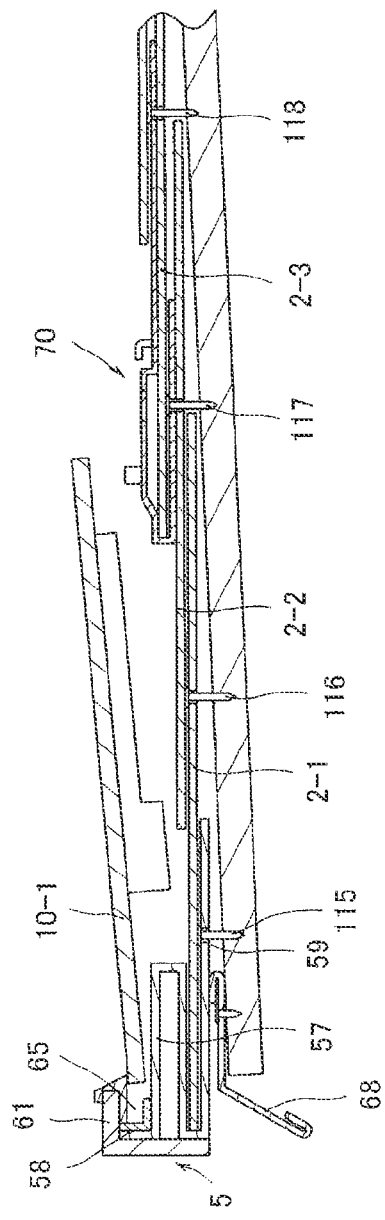
FIG. 35

ROOF STRUCTURE, CLAMP FOR SOLAR CELL MODULE, AND METHOD FOR MOUNTING SOLAR CELL MODULE

TECHNICAL FIELD

The present invention relates to a roof structure on which solar cell modules are arranged. The present invention also relates to a clamp used for achieving said roof structure and a method for mounting a solar cell module on a roof.

BACKGROUND ART

A solar cell module is formed by integrating solar cell panels and miscellaneous accessories such as terminals and generates electricity upon receipt of sunlight.
Recently, an increasing number of homes have employed a photovoltaic system with solar cell modules arranged on their house roofs for providing for electricity consumed by the houses with electricity generated by the solar cell modules.

A means to mount solar cell modules on a house roof includes a structure in which solar cell modules functioning as roof tiles (roof members) are arranged on a roof base and a structure in which solar cell modules are further arranged on a roof with slates or the like.

The latter structure, disclosed in Patent Document 1, specified below for example, is a roof structure in which solar cell modules are mounted by mounting brackets attached to the known slate roof. Specifically, a slanted form of a roof is made by wood and other materials and undergoes procedures such as boarding and attaching of a waterproof sheet, whereby a roof base structure is formed. On the roof base, slate tiles are arranged in a planar fashion. More specifically, slate tiles are arranged on the roof base in a row to form a plurality of rows, each of the tiles being partly overlapped by the adjacent roof member and exposed at a remaining part. Thus, the slate tiles are arranged outspread planarly like fish scales.
Then, holes are drilled in the slate tiles, on which mounting brackets are screwed.

In the roof structure disclosed in Patent Document 1, slate tiles are arranged on a roof base first, and then screws or nails are driven in mounting brackets attached to the slate tiles. At this time, the screws or nails are driven in a boarding of the base through the mounting brackets, the slate tiles, and the waterproof sheet, thereby securing the mounting brackets to the slate tiles.
Thereafter, solar cell modules are screwed to the mounting brackets.

The mounting brackets disclosed in Patent Document 1 each include an upper plate and a lower plate, which define a receptacle therebetween. The upper plate and the lower plate each have two holes formed at the same positions in a height direction respectively.
When the mounting brackets disclosed in Patent Document 1 each are mounted on a roof, a slate tile of the existing roof is fitted in the receptacle of the mounting bracket.
More specifically, the lower plate is inserted in between a specific slate tile and a tile underlying the specific slate tile so that the upper plate is arranged on the specific slate tile.

Then, two holes are drilled in the slate tile through the two holes having been formed in the upper plate. As described above, the lower plate has two holes at the same positions in a height direction as those of the upper plate, so that two prepared holes are drilled from the upper plate through the slate tile and the lower plate until reaching the roof base. The mounting bracket is secured by driving the screws or nails into the two prepared holes.

PATENT DOCUMENT

Patent Document 1: Japanese Patent No. 3609298

DISCLOSURE OF INVENTION

Technical Problem

The roof structure in the known art is susceptible to rain leakage. Specifically, the known roof (roof without solar cell modules) is waterproofed by slate tiles and prevents rain leakage doubly by a waterproof sheet further arranged underneath the tiles. Thus, if the slate tiles have a crack, the waterproof sheet on the roof base keeps rainwater from leaking inside.
The roof structure in the known art, disclosed in Patent Document 1, relies exclusively on slate tiles and a waterproof sheet for a waterproof property.

However, in the roof structure in the known art, disclosed in Patent Document 1, existing slate tiles are drilled, which might make holes not only in the slate tiles but also in the waterproof sheet of the roof base. In some cases, holes might penetrate into the board of the base.
Furthermore, in the roof structure disclosed in Patent Document 1, since there are gaps between the solar cell modules and the slate tiles, rainwater can flow through the gaps between the slate tiles underneath the solar cell modules and seep into the building through the holes of the screws or nails described above. Hence, the roof structure in the known art is susceptible to rain leakage.

Additionally, in the roof structure in the known art, the mounting brackets each are attached by the screws or nails driven in the above-mentioned two prepared holes. The two prepared holes have an identical configuration, in which each hole penetrates from the upper plate through the slate tiles and the lower plate until reaching the roof base. Specifically, the prepared holes, having the same cross-section, each reach the roof base through the first slate tile inserted in the receptacle of the mounting bracket and the second slate tile underlying the first tile. In sum, the mounting bracket in the known art is secured by the two screws or nails driven in the roof base through the first slate tile and the second slate tile.

Thus, in a case where the first or the second slate tile breaks for a reason such as a mistake in arranging the slate tiles or changes in the tiles due to aging, both the two screws become non-functional. That might displace the mounting brackets, causing concerns over a loosening of mountings of the solar cell modules.

Buildings are used over many decades, being subject to shocks, which often crack slate tiles.
Since two screws or nails are driven in the same slate tile in the roof structure in the known art, cracks in the tiles render the screws or nails securing the mounting bracket non-functional.

In terms of the above-mentioned problems of the known art, the present invention therefore aims to improve an arrangement structure of solar cell modules so as to develop a roof structure having a high capacity for water interception and being safe from rain leakage.

Further, in terms of the above-mentioned problems of the known art, the present invention aims to improve an arrangement structure of solar cell modules so as to develop a roof structure ensuring a certain level of mounting strength even if pieces of the roof members break.

Solution to Problem

In order to solve the above-mentioned problem, an aspect of the present invention provided herein is a roof structure having a fundamental roof structure and a plurality of solar cell modules arranged on the fundamental roof structure, wherein the fundamental roof structure is formed by a plurality of roof members each provided with an attaching hole, and wherein the roof members are arranged outspread planarly in a row to form a plurality of rows on a roof base, are each partly overlapped by the adjacent roof member and partly exposed, and are each fixed to the roof base by a fastening element driven into the attaching hole, the roof structure including a plurality of clamps, wherein the clamps each comprise a plate-like holding part having a throughhole, the holding part being partly or entirely sandwiched between the roof members at their overlapping part and the fastening element being driven into the attaching hole of the roof member located below the holding part through the throughhole, so that an overlying roof member located above covers the throughhole with at least a part other than the attaching hole, and the solar cell modules being mounted on the fundamental roof structure via the clamps.

Herein, the fastening element signifies a broader concept of a screw, a nail, or the like. The roof structure in the present aspect has the fundamental roof structure, on which solar cell modules are arranged, as well as the known art. Specifically, the roof structure in the present aspect has a plurality of roof members, such as slate tiles, each of which is partly overlapped by the adjacent roof member and partly exposed. Further, the roof members are arranged outspread planarly in a row to form a plurality of rows on the roof base. The roof members each are fixed to the roof base by the fastening element driven into the attaching hole provided in the roof member. In this aspect, though the solar cell modules are mounted via a plurality of clamps as well as in the known art, at least a part other than the attaching hole of the overlying roof member covers the hole for attaching the clamp. In sum, the attaching hole of the clamp is substantially covered with the overlying roof member. The roof members are each partly overlapped by the adjacent roof member and partly exposed, like fish scales, and are arranged outspread planarly in a row to form a plurality of rows. In this aspect, the attaching hole is located below the overlapping parts of the roof members, so as to be covered with the overlying roof member, which prevents water leakage. Consequently, the roof structure in the present aspect has a high waterproof property.

Preferably, the holding part mainly consists of a lower plate and an upper plate, the lower plate and the upper plate being integrated with a gap therebetween, the upper plate being longer than the lower plate. The clamp is attached either to an end portion of a specific roof member or near the end portion so that the lower plate is positioned between the specific roof member and an underlying roof member located below at least a part of the specific roof member.

Further preferably, the lower plate and the upper plate each have a hole, the fastening element being driven in the hole of the lower plate so as to be driven into the attaching hole of the underlying roof member located below the specific roof member, so that the specific roof member covers the hole of the lower plate with at least a part other than the attaching hole, and the upper plate being positioned between the specific roof member and the overlying roof member located above the specific roof member and the fastening element being driven in the hole of the upper plate so as to be driven into the attaching hole of the specific roof member, so that the overlying roof member located above the specific roof member covers the hole of the upper plate with at least a part other than the attaching hole.

The clamp employed in the preferred aspects has the integrated lower and upper plates and is attached to the fundamental roof structure by using the throughholes provided respectively in the lower plate and the upper plate. As described above, the roof members are each partly overlapped by the adjacent roof member and partly exposed like fish scales and are arranged outspread planarly in a row to form a plurality of rows on the roof base. For simplification of the description, a roof member to which the clamp is attached is referred to as a "specific roof member," a roof member underlapping the "specific roof member" is referred to as an "underlying roof member," and a roof member overlapping the "specific roof member" is referred to as an "overlying roof member."

The clamp employed in these aspects is attached to the end portion or near the end portion of the specific roof member. At this time, the lower plate of the clamp is positioned between the "specific roof member" and the "underlying roof member." The fastening element is driven in the throughhole of the lower plate and the attaching hole of the "underlying roof member," thereby fixing the lower plate of the clamp to the fundamental roof structure.

As described above, the roof members are each partly overlapped by the adjacent roof member and partly exposed like fish scales and are arranged outspread planarly in a row to form a plurality of rows on the roof base. Specifically, at least a part of the "specific roof member" is arranged on the "underlying roof member" in which the fastening element is driven. Thus, the "specific roof member" covers the attaching hole of the "underlying roof member," thereby protecting the attaching hole from rainwater seepage.

Further, the upper plate overlaps the "specific roof member" with the fastening element driven in the throughhole of the upper plate and the attaching hole of the "specific roof member." The fastening element fixes the upper plate of the clamp to the fundamental roof structure. At least a part of the "overlying roof member" is arranged on the "specific roof member" in which the fastening element is driven, so that the "overlying roof member" covers the attaching hole of the "specific roof member," thereby protecting the attaching hole from rainwater seepage.

The roof structure in these aspects is intended to attach the clamps in construction of the fundamental roof structure. Furthermore, the roof members are preferably attached from the eaves-side row toward the ridge in actual construction of the roof structure in these aspects. Most of the roof members offered commercially are provided with attaching holes before shipment from factories, and the use of such roof members previously provided with attaching holes is recommended in execution of these aspects.

The procedures recommended in actual construction of the roof structure in these aspects are as follows.

The roof members are placed on the roof base from the eaves side. One roof member is placed on the roof base, for example. This roof member serves as the above-mentioned "underlying roof member." Then, the clamp is placed on the "underlying roof member" placed on the roof base. The clamp has the integrated lower and upper plates as described above, so that the lower plate of the clamp is brought into contact with the "underlying roof member."

The attaching hole previously provided in the "underlying roof member" and the throughhole of the lower plate of the clamp are aligned, and the fastening element such as a wood screw or a nail is driven to the aligned holes, thereby fixing the lower plate to the roof.

Subsequently, the "specific roof member" is inserted in between the lower plate and the upper plate of the clamp. The attaching hole previously provided in the "specific roof member" and the hole of the upper plate of the clamp are aligned, and the fastening element such as the wood screw or the nail is driven to the aligned holes, thereby fixing the upper plate to the roof.

Preferably, the lower plate and the upper plate each have a plurality of holes, and the fastening element driven in the lower plate is arranged at a shifted position column-wise relative to the fastening element driven in the upper plate.

In the roof structure in this preferred aspect, the fastening elements are fastened at shifted positions column-wise, thereby stabilizing the clamp.

Preferably, the clamp has an intermediate plate located on the upper plate and a holding plate located on the intermediate plate, the lower plate and the upper plate defining a first receptacle opening in one direction relative to the clamp, a part of the upper plate and the intermediate plate defining a second receptacle opening in a direction opposite to that of the first receptacle, and a part of the intermediate plate and the holding plate defining a third receptacle opening in the same direction as that of the first receptacle, so that the first receptacle holds an eaves-side edge of the specific roof member, the second receptacle holds a ridge-side edge of the solar cell module, and the third receptacle holds an eaves-side edge of the solar cell module of a row located adjacently toward a ridge.

Herein, in this specification, the "eaves side" and the "ridge side" are terms used to denote a lower side and an upper side of a roof inclination respectively and do not limit either an external appearance of the roof or a type of the roof.

In the roof structure in this preferred aspect, the clamp has the three receptacles, whereby the edge of the roof member and the edges of the solar cell modules are held. That stabilizes the clamp.

Preferably, the holding plate is fixed to the intermediate plate and is detachable from the intermediate plate.

According to this preferred aspect, the holding plate can be detached from the intermediate plate. Detachment of the holding plate from the intermediate plate breaks one side of the receptacle, thereby releasing a hold on the eaves-side edge of the solar cell module, which can then be demounted. Therefore, in a case of failure of one of a number of the solar cell modules, only the failed solar cell module can be demounted.

Preferably, the intermediate plate is fixed to the upper plate and is detachable from the upper plate.

In this preferred aspect, the intermediate plate is detachable, so that the second receptacle defined by the intermediate plate and the upper plate can be disassembled and assembled. Therefore, the second receptacle can be assembled after placing of the ridge-side edge of the solar cell module on the intermediate plate, and thereby arriving at a structure for preventing of separation of the solar cell module.

Consequently, the roof structure in this aspect is readily constructed.

Preferably, the upper plate and the lower plate are continuous with each other via an erecting wall extending substantially upward in a vertical direction from the lower plate, the upper plate has a lower portion and an upper portion continuous with the lower portion via a step or a slope, both the lower portion and the upper portion being formed of flat plates, and the intermediate plate has a first flat plate and a second flat plate located above a level of the first flat plate, the first flat plate and the second flat plate being arranged substantially in parallel, so that the upper portion of the upper plate and the first flat plate of the intermediate plate are attachable so as to slidably move in a horizontal direction.

Preferably, the intermediate plate has a front erecting wall extending substantially upward in a vertical direction from a front end of the second flat plate, and the holding plate is formed by a front plate of a flat-plate shape and a folded part of a flat-plate shape extending in a horizontal direction from an upper edge of the front plate in a substantially L-shaped cross section, so that the holding plate is attachable to the front erecting wall from the front side.

Further preferably, at least one selected from a group consisting of the first receptacle, the second receptacle and the third receptacle has a seal material and/or a cushioning, the upper plate has hooks for hanging a cable, the fastening element is a screw, and the roof member is a slate tile.

Another aspect of the present invention is a clamp for a solar cell module for mounting a solar cell module on a building, wherein the building has a fundamental roof structure formed by a plurality of roof members arranged outspread planarly in a row to form a plurality of rows on a roof base, the roof members each being previously provided with an attaching hole, wherein the clamp includes a lower plate and an upper plate each having an attaching hole, the holes being distantly positioned, and an intermediate plate located on the upper plate and a holding plate located on the intermediate plate, the lower plate and the upper plate defining a first receptacle opening in one direction relative to the clamp, a part of the upper plate and the intermediate plate defining a second receptacle opening in a direction opposite to that of the first receptacle, and a part of the intermediate plate and the holding plate defining a third receptacle opening in the same direction as that of the first receptacle, so that the first receptacle is designed to hold an eaves-side edge of a specific roof member, the second receptacle is designed to hold a ridge-side edge of the solar cell module, and the third receptacle is designed to hold an eaves-side edge of the solar cell module of a row located adjacently toward a ridge.

The present aspect is the clamp for a solar cell module for achieving the above-mentioned roof structure, thereby mounting the solar cell module on a roof without rainwater seepage.

Preferably, the upper plate is longer than the lower plate.

Preferably, the holding plate is fixed to the intermediate plate and is detachable from the intermediate plate.

Preferably, the intermediate plate is fixed to the upper plate and is detachable from the upper plate.

Preferably, the upper plate and the lower plate are continuous with each other via an erecting wall extending substantially upward in a vertical direction from the lower plate, the upper plate has a lower portion and an upper portion continuous with the lower portion via a step or a slope, both the lower portion and the upper portion being formed of flat plates, and the intermediate plate has a first flat plate and a second flat plate located above the level of the first flat plate, the first flat plate and the second flat plate being arranged substantially in parallel, so that the upper portion of the upper plate and the first flat plate of the intermediate plate being attachable so as to slidably move in a horizontal direction.

Preferably, the intermediate plate has a front erecting wall extending substantially upward in a vertical direction from a front end of the second flat plate, and the holding plate is formed by a front plate of a flat-plate shape and a folded part of a flat-plate shape extending in a horizontal direction from an upper edge of the front plate in a substantially L-shaped cross section and, so that the holding plate is attachable to the front erecting wall from the front side.

Preferably, at least one selected from a group consisting of the first receptacle, the second receptacle and the third receptacle has a seal material and/or a cushioning, and the upper plate has hooks for hanging a cable.

Still another aspect of the present invention relates to a method for constructing a roof and is a method for mounting a solar cell module on a building by using the above-mentioned clamp, including the steps of arranging the roof member on the roof base of the building, placing the lower plate of a clamp on the roof member, positioning the attaching hole of the roof member with the hole of the lower plate so as to drive the fastening element in the positioned holes, inserting the specific roof member in between the lower plate and the upper plate of the clamp so as to hold the specific roof member in the first receptacle, further positioning the attaching hole of the specific roof member with the hole of the upper plate so as to drive the fastening element in the positioned holes, and placing another roof member on the specific roof member so that the other roof member covers the attaching hole of the specific roof member.

The method for mounting a solar cell module in the present aspect ensures efficient mounting of a solar cell module by a simple procedure.

Yet another aspect of the present invention is a roof structure having a fundamental roof structure and a plurality of solar cell modules arranged on the fundamental roof structure, wherein the fundamental roof structure is formed by a plurality of roof members each provided with an attaching hole, and wherein the roof members are arranged outspread planarly in a row to form a plurality of rows on a roof base, are each partly overlapped by the adjacent roof member and partly exposed, and are each fixed to the roof base by a fastening element driven into the attaching hole, the roof structure having a plurality of clamps, wherein the clamps each comprise a plate-like holding part having a plurality of holes, at least one of the holes being communicated with the attaching hole of a specific roof member with the fastening element driven in the communicated holes and at least one of the remaining holes being communicated with the attaching hole of the roof member of an adjacent row to the specific roof member with the fastening element driven in the communicated holes, and the solar cell modules being mounted on the fundamental roof structure via the clamps.

The roof structure in the present aspect, as well as the known art, has the fundamental roof structure, on which solar cell modules are arranged. Specifically, the roof structure in the present aspect has a plurality of roof members such as slate tiles, which are arranged in a row to form a plurality of rows on the roof base, and each of which is partly overlapped by the adjacent roof member and exposed at a remaining part, so that the slate tiles are arranged outspread planarly. The roof members each are fixed to the roof base by the fastening element driven into the attaching hole provided in the roof member.

In the roof structure in the present aspect, the clamp has a plurality of holes, some of which are communicated with the attaching hole of the specific roof member, so that the fastening member is driven into the communicated holes. Some of the remaining holes are communicated with the attaching hole of the roof member of a row adjacent to the roof member column-wise, so that the fastening element is driven into the communicated holes. Therefore, according to the present aspect, the clamp is attached over a plurality of roof members. Consequently, that ensures a certain level of mounting strength even in breaking of one piece of roof members.

Additionally, the present aspect uses the roof members each provided with the attaching hole, so that the work with a drill or the like on site is not indispensable. The method of utilizing the attaching hole having been formed in manufacturing of the roof member is recommended due to it causing no damage to the roof member.

Preferably, the holding part is partly or entirely sandwiched between the roof members at their overlapping part, and the fastening elements are driven through the holes into the attaching hole of the underlying roof member located below the holding part, so that the overlying roof member covers the holes with at least a part other than the attaching hole.

In the roof structure in the known art disclosed in Patent Document 1, holes are formed in the existing slate tiles with a drill, which may form holes in not only the slate tiles but also a waterproof sheet of the roof base. In some cases, a hole may be formed in a board of the base. Further, in the roof structure disclosed in the Patent Document 1, there is a gap between the solar cell module and the slate tile. Rainwater intruding in the gap might flow on the slate tile located below the solar cell module and intrude into a building through the above-mentioned holes for screws or nails. Therefore, the roof structure in the known art might cause rain leakage. This preferred aspect dispels such a concern.

Though the solar cell module is mounted via a plurality of clamps in this aspect as well as the known art, this aspect makes the overlying roof member to cover the holes for attaching the clamps with at least a part other than the attaching hole thereof, so that the attaching hole of the clamp is substantially covered with the overlying roof member.

Specifically, the roof members are arranged in a row to form a plurality of rows on the roof base, being each overlapped by the adjacent roof member with the remaining part exposed, and outspread planarly like fish scales. This aspect places the attaching hole under the overlapping part of the roof members, so that the overlying roof member covers the attaching hole, thereby preventing water leakage. Consequently, the roof structure in this aspect has a high waterproof property.

Preferably, the holding part mainly consists of integrated lower and upper plates, the upper plate being longer than the lower plate and the lower plate and the upper plate each having a hole, and the clamp is attached either to an end portion of a specific roof member or near the end portion, the lower plate being positioned between the specific roof member and an underlying roof member located below at least a part of the specific roof member, and the fastening element being driven in the hole of the lower plate and into the attaching hole of the roof member located below the specific roof member, so that the specific roof member covers the hole of the lower plate with at least a part other than the attaching hole, and the upper plate being positioned between the specific roof member and an overlying roof member located above the specific roof member, and the fastening element being driven in the hole of the upper plate and into the attaching hole of the specific roof member, so that the overlying roof member located above the specific roof member covers the hole of the upper plate with at least a part other than the attaching hole.

The clamp employed in this preferred aspect has the integrated lower and upper plates and is attached to the fundamental roof structure by using the holes provided respectively in the lower plate and the upper plate. As described above, the roof members are arranged in a row to form a plurality of rows on the roof base, being each overlapped by the adjacent roof member with the remaining part exposed. Thus, the roof members are arranged outspread planarly like fish scales. For simplification of the description, a roof member to which the clamp is attached is referred to as a "specific roof member," a roof member underlapping the "specific roof member" is referred to as an "underlying roof member," and a roof member overlapping the "specific roof member" is referred to as an "overlying roof member."
The clamp employed in this aspect is attached to the end portion or near the end portion of the specific roof member, with the lower plate thereof positioned between the "specific roof member" and the "underlying roof member." The fastening element is inserted in the hole of the lower plate and the attaching hole of the "underlying roof member," thereby fixing the lower plate of the clamp to the fundamental roof structure.
As described above, the roof members are arranged in a row to form a plurality of rows on the roof base, each of the roof members being partly overlapped by the adjacent roof member and exposed at a remainder part, and outspread planarly like fish scales. Further, at least a part of the "specific roof member" is arranged on the "underlying roof member," in which the fastening element is driven. Thus, the "specific roof member" covers the attaching hole of the "underlying roof member," thereby protecting the attaching hole from rainwater seepage.
Further, the upper plate overlaps the "specific roof member" with the fastening element driven in the throughhole of the upper plate and the attaching hole of the "specific roof member." The fastening element fixes the upper plate of the clamp to the fundamental roof structure. At least a part of the "overlying roof member" is arranged on the "specific roof member," in which the fastening element is driven, so that the "overlying roof member" covers the attaching hole of the "specific roof member," thereby protecting the attaching hole from rainwater seepage.

Preferably, the lower plate and the upper plate each have a plurality of holes, and the fastening element driven in the lower plate is arranged at a shifted position column-wise relative to the fastening element driven in the upper plate.

According to the roof structure in this preferred aspect, the fastening elements are driven at shifted positions, column-wise, thereby stabilizing the clamp.

Preferably, the clamp has an intermediate plate located on the upper plate and a holding plate located on the intermediate plate, the lower plate and the upper plate defining a first receptacle opening in one direction relative to the clamp, a part of the upper plate and the intermediate plate defining a second receptacle opening in a direction opposite to that of the first receptacle, and a part of the intermediate plate and the holding plate defining a third receptacle opening in the same direction as that of the first receptacle, so that the first receptacle holds an eaves-side edge of the specific roof member, the second receptacle holds a ridge-side edge of the solar cell module, and the third receptacle holds an eaves-side edge of the solar cell module of a row located adjacently toward a ridge.

In the roof structure in this preferred aspect, the clamp has the three receptacles, whereby the edge of the roof member and the edges of the solar cell modules are held. That stabilizes the clamp.

Preferably, the holding plate is fixed to the intermediate plate and is detachable from the intermediate plate.

According to this preferred aspect, the holding plate can be detached from the intermediate plate. Detachment of the holding plate from the intermediate plate breaks one side of the receptacle, thereby releasing the hold on the eaves-side edge of the solar cell module, which can then be demounted.

Therefore, in a case of failure of one of a number of the solar cell modules, only the failed solar cell module can be demounted.

Preferably, the intermediate plate is fixed to the upper plate and is detachable from the upper plate.

In this preferred aspect, the intermediate plate is detachable, so that the second receptacle defined by the intermediate plate and the upper plate can be disassembled and assembled. Therefore, the second receptacle can be assembled after placing of the ridge-side edge of the solar cell module on the intermediate plate, and whereby a structure for preventing a separation of the solar cell module is accomplished.
Consequently, the roof structure in this aspect is readily constructed.

Preferably, the upper plate and the lower plate are continuous with each other via an erecting wall extending substantially upward in a vertical direction from the lower plate, the upper plate has a lower portion and an upper portion continuous with the lower portion via a step or a slope, both the lower portion and the upper portion being formed of flat plates, and the intermediate plate has a first flat plate and a second flat plate located above the level of the first flat plate, the first flat plate and the second flat plate being arranged substantially in parallel, so that the upper portion of the upper plate and the first flat plate of the intermediate plate are attachable so as to slidably move in a horizontal direction.

Preferably, the intermediate plate has a front erecting wall extending substantially upward in a vertical direction from a front end of the second flat plate, and the holding plate is formed by a front plate of a flat-plate shape and a folded part of a flat-plate shape extending in a horizontal direction from an upper edge of the front plate in a substantially L-shaped cross section, so that the holding plate is attachable to the front erecting wall from the front side.

Preferably, at least one selected from a group consisting of the first receptacle, the second receptacle, and the third receptacle has a seal material and/or a cushioning, the upper plate has hooks for hanging a cable, the fastening element is a screw, and the roof member is a slate tile.

Yet still another aspect of the present invention is a clamp for a solar cell module for mounting a solar cell module on a building, wherein the building has a plurality of roof members each provided with an attaching hole, the roof members being arranged outspread planarly in a row to form a plurality of rows on a roof base in such a manner that each of the roof members is overlapped by the adjacent roof member with constant overlapping parts and exposed at a remaining part without overlapping and each being fixed to the roof base by a fastening element driven into the attaching hole, the clamp mainly consisting of a lower plate and an upper plate each having an attaching hole, the holes of the lower plate and the upper plate having an interval equal to the length of the overlapping part subtracted from the width of the roof member.

This aspect provides the clamp for a solar cell module for achieving the above-mentioned roof structure and ensures a certain level of mounting strength even in a case of breaking one piece of the roof members.

Preferably, the upper plate is longer than the lower plate, wherein the clamp has an intermediate plate located on the upper plate and a holding plate located on the intermediate plate, the lower plate and the upper plate defining a first receptacle opening in one direction relative to the clamp, a part of the upper plate and the intermediate plate defining a second receptacle opening in a direction opposite to that of the first receptacle, and a part of the intermediate plate and the holding plate defining a third receptacle opening in the same direction as that of the first receptacle, so that the first receptacle is designed to hold an eaves-side edge of the specific roof member, the second receptacle is designed to hold a ridge-side edge of the solar cell module, and the third receptacle is designed to hold an eaves-side edge of the solar cell module of a row located adjacently toward a ridge.

This aspect provides the clamp for a solar cell module for achieving the above-mentioned roof structure and enabling mounting solar cell modules on a roof with rain leakage prevention.

Preferably, the holding plate is fixed to the intermediate plate and is detachable from the intermediate plate.

Preferably, the intermediate plate is fixed to the upper plate and is detachable from the upper plate.

Preferably, the upper plate and the lower plate are continuous with each other via an erecting wall extending substantially upward in a vertical direction from the lower plate, the upper plate has a lower portion and an upper portion continuous with the lower portion via a step or a slope, both the lower portion and the upper portion being formed of flat plates, and the intermediate plate has a first flat plate and a second flat plate located above the level of the first flat plate, the first flat plate and the second flat plate being arranged substantially in parallel, so that the upper portion of the upper plate and the first flat plate of the intermediate plate are attachable so as to slidably move in a horizontal direction.

Preferably, the intermediate plate has a front erecting wall extending substantially upward in a vertical direction from a front end of the second flat plate, and the holding plate is formed by a front plate of a flat-plate shape and a folded part of a flat-plate shape extending in a horizontal direction from an upper edge of the front plate in a substantially L-shaped cross section, so that the holding plate is attachable to the front erecting wall from the front side.

Preferably, at least one selected from a group consisting of the first receptacle, the second receptacle, and the third receptacle has a seal material and/or a cushioning, and the upper plate has hooks for hanging a cable.

A further aspect of the present invention is a method for mounting a solar cell module on a building by using the above-mentioned clamp for a solar cell module, including the steps of arranging the roof member on the roof base of the building, placing the lower plate of the clamp on the roof member; positioning the attaching hole of the roof member with the hole of the lower plate so as to drive the fastening element into the positioned holes, inserting the specific roof member in between the lower plate and the upper plate of the clamp so as to hold the specific roof member in the first receptacle, further positioning the attaching hole of the specific roof member with the hole of the upper plate so as to drive the fastening element in the positioned holes, and placing another roof member on the specific roof member so that the other roof member covers the attaching hole of the specific roof member.

The method for mounting a solar cell module in the present aspect ensures efficient mounting of solar cell modules by a simple procedure.

Advantageous Effect of Invention

The roof structure of the present invention has an advantageous effect of no concern over rain leakage. That renders a building durable and long lasting.

Further, the clamp for a solar cell module of the present invention has an advantageous effect of mounting a solar cell module on a roof with preventing rain leakage.

Still further, the method for mounting a solar cell module of the present invention has an advantageous effect of efficient mounting of a solar cell module by a simple procedure.

Furthermore, the roof structure of the present invention ensures a mounting strength of solar cells even in a case of breaking one piece of the roof members, thereby achieving an advantageous effect of being durable for long-time use.

BRIEF DESCRIPTION OF DRAWINGS

FIGS. 3A to 3C are explanatory views of a solar cell module employed in the roof structure of the embodiment, FIG. 3A being a perspective view of the solar cell module seen from the front, FIG. 3B being an enlarged cross section of a connector of a first cable, FIG. 3C being an enlarged cross section of a connector of a second cable;

FIGS. 29A and 29B are views of the roof structure in arranging slate tiles of a fourth row, FIG. 29A being a cross section thereof and FIG. 29B being an enlarged view of an inside of a circle in FIG. 29A;

FIGS. 30A and 30B are views of the roof structure with lower plates of the intermediate mounting brackets of a second row attached to the slate tiles of the fourth row, FIG. 30A being a cross section thereof and FIG. 30B being an enlarged view of an inside of a circle in FIG. 30A;

FIGS. 31A and 31B are views of the roof structure with slate tiles of a fifth row inserted in first receptacles of the intermediate mounting brackets of the second row, FIG. 31A being a cross section thereof and FIG. 31B being an enlarged view of an inside of a circle in FIG. 31A;

FIG. 34 is an electric schematic diagram showing a connection structure of the solar cell modules;

FIG. 35 is a cross section of the roof structure in mounting the solar cell modules of a first row on the eaves-side brackets;

DESCRIPTION OF EMBODIMENTS

Figure 1:
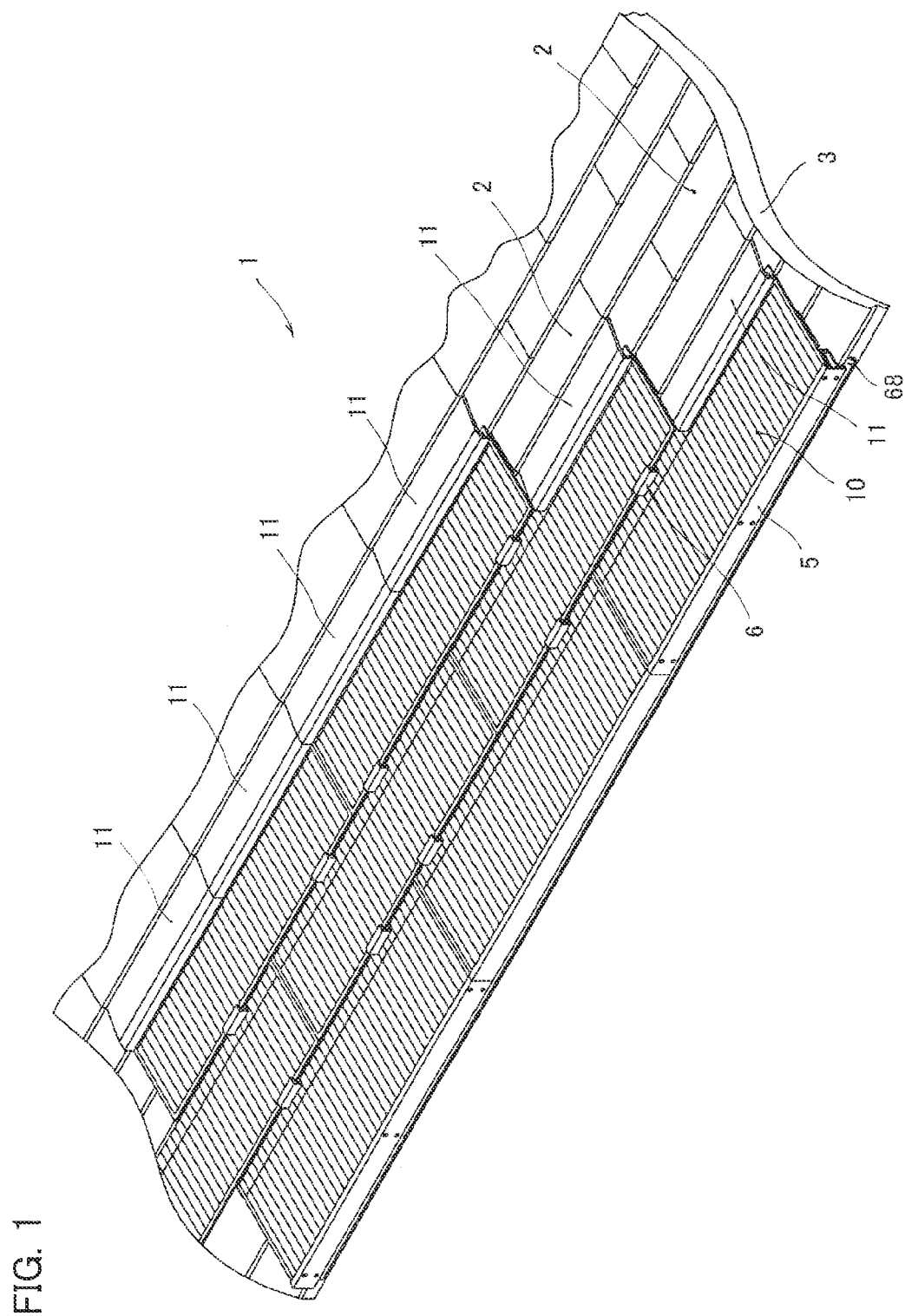
FIG. 1 is a perspective view showing an appearance of a roof structure of an embodiment of the present invention.

Now, embodiments of the present invention will be described in detail below. Referring to FIG. 1, a roof structure 1 of the present embodiment is constructed by a fundamental roof structure 3 shingled with slate tiles (roof member) 2 and solar cell modules 10 mounted thereon via eaves-side mounting brackets (eaves-side clamps) 5 and intermediate mounting brackets (clamps) 6. There are also provided flashing boards 11 partly attached to necessary parts.

Figure 2:
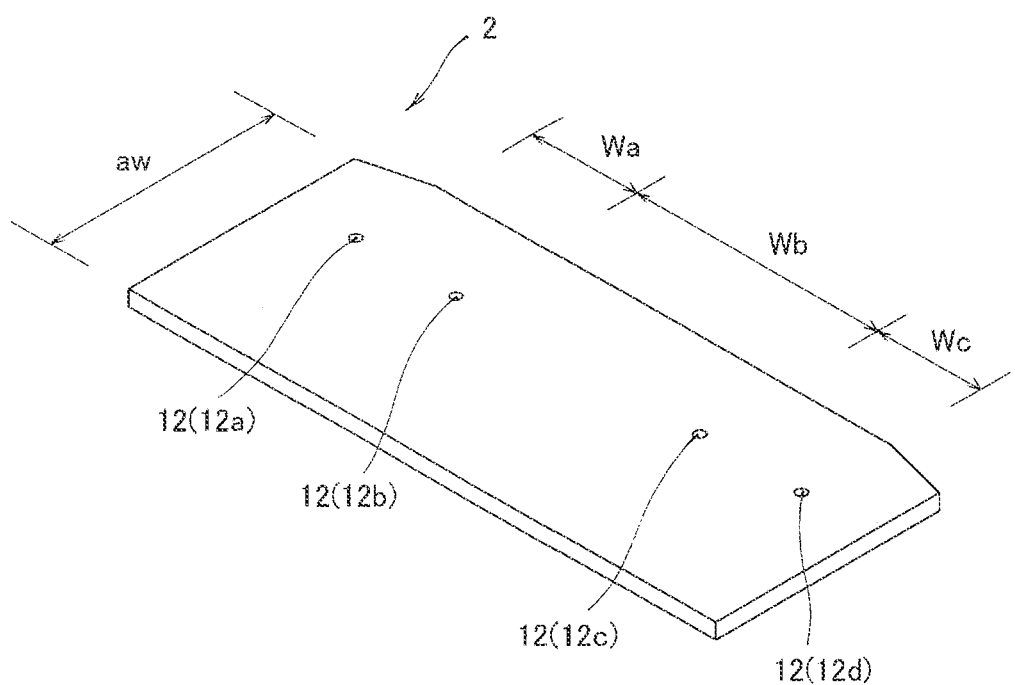
FIG. 2 is a perspective view of a slate tile employed in the roof structure of the embodiment.

Each slate tile 2 is, as shown in FIG. 2, a thin plate formed by materials such as cement with a substantially rectangular shape. The slate tile 2 has four attaching holes 12, provided in advance, in a line near the center, in a shorter direction. In this embodiment, the attaching holes 12 have uneven intervals, the interval between the two holes 12b and 12c in the central part being longer than the intervals between the other pairs of holes.

More specifically, the four holes are denoted as a hole 12a, a hole 12b, a hole 12c, and a hole 12d from the left in the figure. An interval Wa between the hole 12a and the hole 12b and an interval Wc between the hole 12c and the hole 12d, which are the intervals between the holes of either side, are the same, while an interval Wb between the holes 12b and 12c in the central part is longer than the above-mentioned intervals Wa and Wc.

Next, a structure of the solar cell modules 10 will be described in detail below. As described below, in this embodiment, the solar cell modules 10 are arranged with an edge from which cables 16 and 18 are extracted facing toward a ridge, so that the edge from which the cables 16 and 18 are extracted is described as an upper edge for the sake of description.

Figure 4:
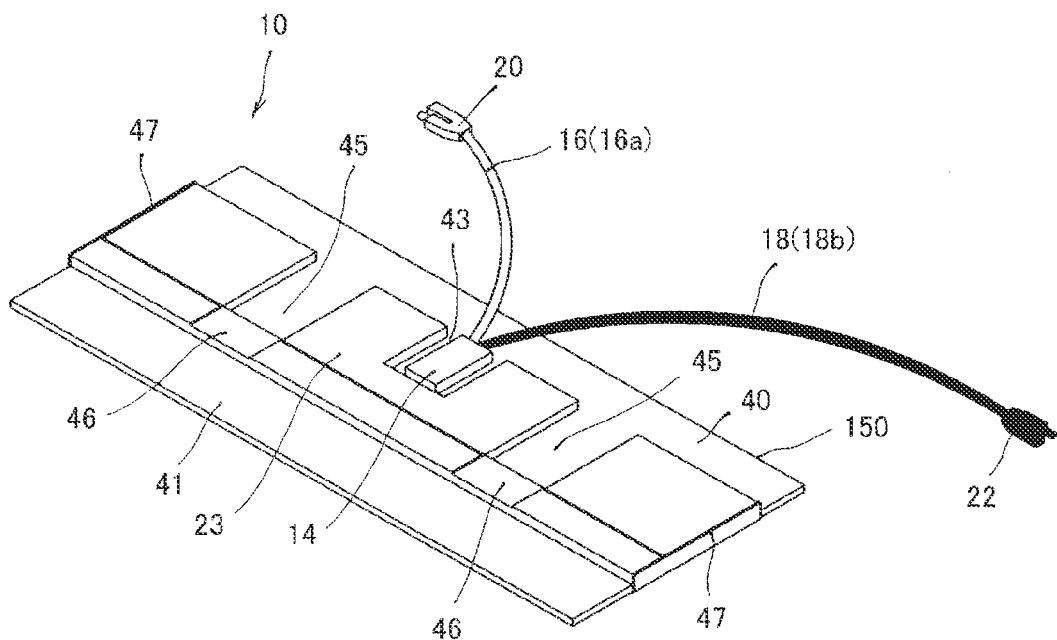
FIG. 4 is a perspective view of the solar cell module in FIG. 3A seen from the back.

Each solar cell module 10 employed in the present embodiment, as shown in FIGS. 3A to 3C, 4, and 5, includes a solar cell panel 13, a terminal box 14 (see FIG. 4) attached to a back of the solar cell panel 13, the two cables 16 and 18 extracted from the terminal box 14, connectors 20 and 22 connected to the cables 16 and 18 respectively, and a heat-insulating and reinforcing member 23 (see FIG. 4).

The solar cell panel 13 is formed in a substantially rectangular and planate shape as shown in FIG. 3A. The solar cell panel 13 is preferably 900 to 1200 mm long in its longer direction and 230 to 650 mm long in its shorter direction. Herein, the length of the solar cell panel 13 in the longer direction is about twice as much as that of the slate tile 2. Meanwhile, the length AW of the solar cell panel 13 in the shorter direction is about 1.3 to 1.6 times as much as the length aw of the slate tile 2 in the shorter direction. More specifically, the solar cell panel 13 has the length AW in the shorter direction equivalent to the length of two overlapped slate tiles 2.

The solar cell panel 13 employed in the present embodiment is an integrated solar cell. The solar cell panel 13 may be one, for example, formed by laminating a conducting film or a semiconducting film on a glass substrate and forming a plurality of parallel grooves 15 in the resulting laminated body so as to form a predetermined number of one-cell batteries (unit solar cells) 17, which are electrically connected in series. The solar cell panel 13 in the present embodiment can obtain a voltage of 100 volts for one panel.

As described above, the unit solar cells 17 are electrically connected in series and connected to the terminal box 14. Herein, for convenience of drawing figures, the number of the grooves 15 is drawn less than the actual number.

As for a characteristic configuration, the solar cell panel 13 in the present embodiment has a dividing groove 21 crossing the unit solar cells 17. The dividing groove 21 is located at about 30 to 50 mm inside from the upper edge, which is an edge from which the cables 16 and 18 are extracted. The solar cell panel 13 is divided by the dividing groove 21 into an area A situated at a lower part in the figure and an area B situated at an upper part in the figure. The area B becomes hidden behind a solar cell module 10 of a ridge-side row, when the solar cell modules 10 are arranged on the roof. Thus, in this embodiment, only the unit solar cells 17 in the larger area A at the lower part in the figure are connected to the terminal box 14, whereas those in the area B not contributing to electric generation due to being under shadow are not connected to the terminal box 14.

As shown in FIG. 4, the terminal box 14 is fixed to the back of the solar cell panel 13 with glue or the like. The terminal box 14 is fixed in substantially the center of longer edges of the solar cell panel 13 and in an area adjacent to a longer edge 150. More specifically, the terminal box 14 is fixed to the back and upper part of the solar cell panel 13. However, an upper edge of the terminal box 14 is located not at the same level of that of the solar cell panel 13, but slightly inside the upper edge of the panel 13. More specifically, the upper edge of the terminal box 14 is located at about 30 to 50 mm inside from that of the panel 13.

The terminal box 14 has therein a positive electrode connection terminal (not shown) to which a positive electrode of the solar cell panel 13 is connected and a negative electrode connection terminal (not shown) to which a negative electrode of the solar cell panel 13 is connected. In the terminal box 14, the positive electrode connection terminal is connected with two positive conductors 24, covered in black, while the negative electrode connection terminal is connected with two negative conductors 26, covered in white.

The first cable 16 is a two-core cable formed by tying one of the two positive conductors 24 and one of the two negative conductors 26. Meanwhile, the second cable 18 is a two-core cable formed by tying the other of the two positive conductors 24, and the other of the two negative conductors 26.

As shown in FIGS. 3A to 3C, 4, and 5, the first cable 16 and the second cable 18 differ in color. The first cable 16 has the positive conductor 24 and the negative conductor 26 arranged in a white insulation tube 16a, whereas the second cable 18 has the positive conductor 24 and the negative conductor 26 arranged in a black insulation tube 18b.

Further, the first cable 16 and the second cable 18 differ in length, one being long and the other being short. Specifically, the first cable 16 is shorter than the second cable 18. The entire length of the first cable 16 is less than 50% of the length of the longer edge of the rectangular solar cell panel 13, while that of the second cable 18 is 50% or more of the length of the longer edge of the solar cell panel 13.

However, the total length of the first cable 16 and the second cable 18 is longer than the length of the longer edge of the solar cell panel 13.

As shown in FIGS. 3A to 3C, the first cable 16 and the second cable 18 are provided with a first connector 20 and a second connector 22, respectively, at one of their ends. The first connector 20 and the second connector 22 differ in color, but have the same configuration. In the present embodiment, the first connector 20 is white, whereas the second connector 22 is black.

As shown in FIGS. 3A to 3C and 6, the first connector 20 and the second connector 22 each have a pin terminal 28 and a socket terminal 30. Further, the first connector 20 and the second connector 22 each have a female portion 32 and a male portion 34, the above-mentioned pin terminal 28 being within the female portion 32 and the socket terminal 30 being within the male portion 34.

As shown in FIGS. 3B and 3C, in the present embodiment, the pin terminal 28 of the first connector 20 is connected with the positive conductor 24, whereas the socket terminal 30 of the first connector 20 is connected with the negative conductor 26. On the other hand, the pin terminal 28 of the second connector 22 is connected with the negative conductor 26, whereas the socket terminal 30 of the second connector 22 is connected with the positive conductor 24. That means, in the first connector 20, the pin terminal 28 is a positive electrode, while the socket terminal 30 is a negative electrode. In contrast, in the second connector 22, the pin terminal 28 is a negative electrode, while the socket terminal 30 is a positive electrode. Thus, in the first connector 20 and the second connector 22, it is possible to electrically connect the same kinds of electrodes by engaging the female portion 32 of one connector with the male portion 34 of the other connector so as to connect the pin terminal 28 of the one connector to the socket terminal 30 of the other connector.

Next, the heat-insulating and reinforcing member 23 will be described. As shown in FIG. 4, the heat-insulating and reinforcing member 23 is a member made of foamed resin and attached to the back of the solar cell panel 13 so as to secure a strength and heat insulating properties of the solar cell module 10. The heat-insulating and reinforcing member 23 is, as shown in FIG. 4, located in the central part of the back of the solar cell panel 13 and has a wiring storage space 41 formed by cutting out a portion of the heat-insulating and reinforcing member 23 along the vicinity of a lower side in the figure.

Further, there is provided a cut out portion 43 for the terminal box at a position where the terminal box 14 is fixed. Therefore, the terminal box 14 is surrounded by the heat-insulating and reinforcing member 23 on three sides. Cut out portions 45 are also provided on both sides of the cut out portion 43 for the terminal box.

The heat-insulating and reinforcing member 23 becomes thin at parts below the cut out portions 45, forming trough-like portions 46.

The heat-insulating and reinforcing member 23 is further cut out at a portion 40 adjacent to the longer edge 150 near the upper part of the solar cell panel. This portion is a part placed on an anterior part of a front end area B of the intermediate mounting bracket 6. Herein, the cut out portion 45 and the trough-like portions 46 can be used for passing the first cable 16 and/or the second cable 18 therethrough in connecting the connectors of any two adjacent solar cell modules 10 situated at the eaves side and the ridge side when the solar cell modules 10 are arranged on a roof.

The solar cell panel 13 has side gaskets 47 at both its shorter edges. The side gaskets 47 are made of a resin material.

Next, brackets will be described below.

Figure 7:
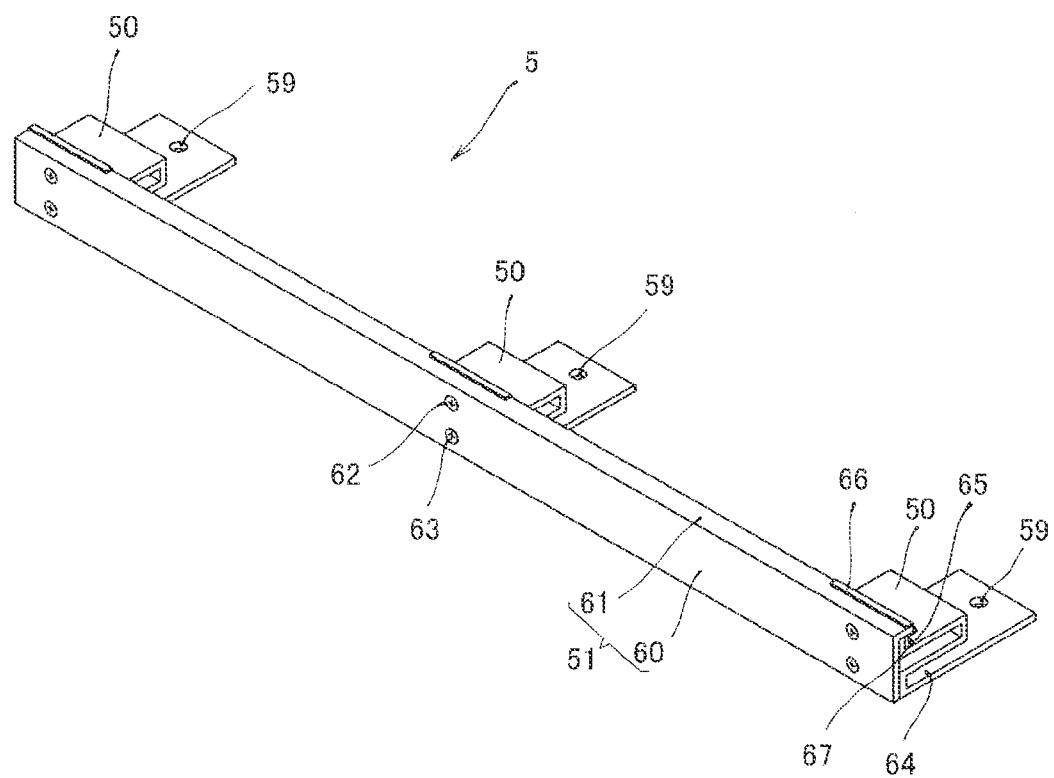
FIG. 7 is a perspective view of an eaves-side mounting bracket (eaves-side clamp) employed in the roof structure of the embodiment.
Figure 8:
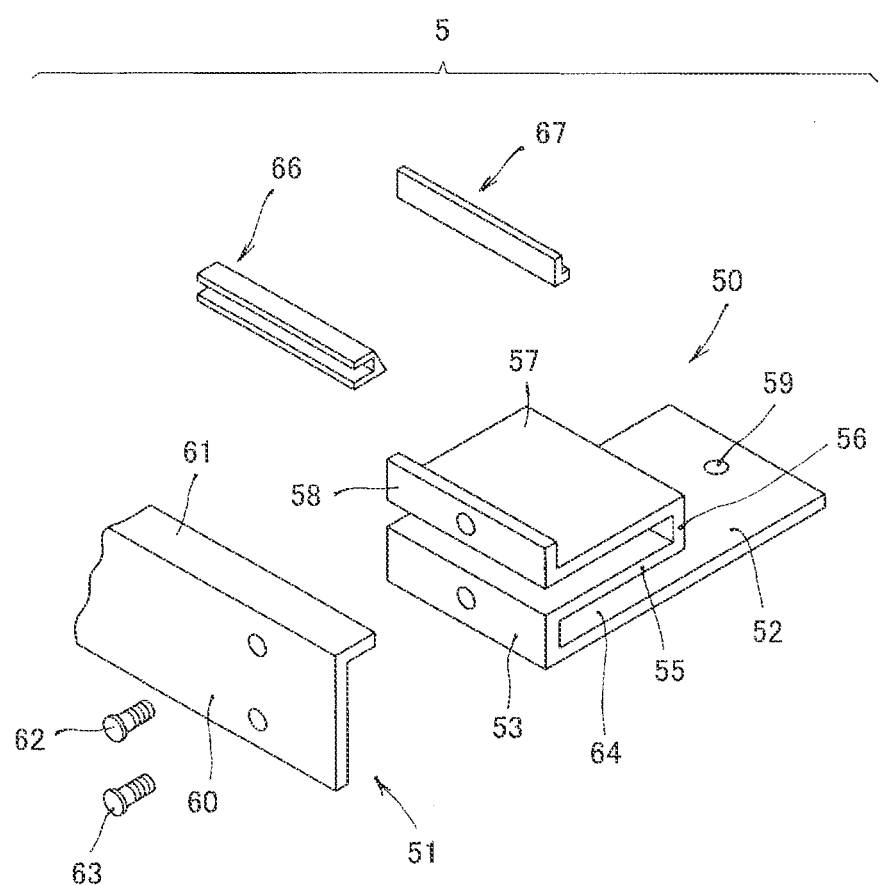
FIG. 8 is an exploded perspective view of the eaves-side mounting bracket in FIG. 7.

FIGS. 7 and 8 each illustrate the eaves-side mounting bracket (eaves-side clamp) 5. The eaves-side mounting bracket 5 mainly consists of three fixing pieces 50 and a connecting piece 51 connecting the fixing pieces 50, as shown in FIG. 7. The fixing pieces 50 each are formed by bending a galvanized steel sheet in zigzag, as shown in FIG. 8, including a lower plate 52, a first front erecting portion 53 erecting from a proximal edge of the lower plate 52, an upper plate 55 continuous from the first front erecting portion 53 and opposite to the lower plate 52, a rear erecting portion 56 continuous from a distal edge of the upper plate 55 and erecting from the upper plate 55, a supporting plate 57 continuous to the rear erecting portion 56 and opposite to the upper plate 55, and a second front erecting portion 58 continuous to a proximal edge of the supporting plate 57 and erecting from the supporting plate 57. Each edge is bent at a substantially vertical angle.

In sum, the fixing pieces 50 each have three plates arranged opposite to and substantially parallel to one another, the lower plate 52, the upper plate 55, and the supporting plate 57, which are arranged continuous by the first front erecting portion 53 and the rear erecting portion 56.

Among the above-mentioned three plates, the lower plate 52, the upper plate 55, and the supporting plate 57, only the lower plate 52, located undermost, is longer than the other plates. The lower plate 52 has one attaching hole 59.

The attaching hole 59 is located outside the underneath of the upper plate 55 and the supporting plate 57.

The first front erecting portion 53 and the second front erecting portion 58 are in the same plane.

The connecting piece 51 is an elongated member of about one meter in length with an "L" shaped cross section. Specifically, referring to FIG. 8, the connecting piece 51 mainly consists of a front portion 60 of a substantially rectangular shape and a cover-plate composing portion 61 projecting to one side by bending a longer edge of the front portion 60 in small measure at a right angle.

Referring to FIG. 7, the three fixing pieces 50 are attached to the connecting piece 51 at appropriate and regular intervals. With the fixing pieces 50 attached to the connecting piece 51, outer faces of the first front erecting portion 53 and the second front erecting portion 58 of each fixing piece 50 are brought into contact with an inner face of the front portion 60 of the connecting piece 51. Further, screws 62, 63 are driven in the front portion 60 of the connecting piece 51 into the first and the second front erecting portions 53, 58 of the fixing piece 50, thereby fixing the fixing piece 50 to the connecting piece 51.

Additionally, with the fixing piece 50 attached to the connecting piece 51, an "L" shaped corner of the connecting piece 51 contacts with an end face of the second front erecting portion 58 of the fixing piece 50. The cover-plate composing portion 61 faces to the fixing piece 50. Hence, the cover-plate composing portion 61 is opposed in parallel to the supporting plate 57 of the fixing piece 50.

Figure 9:
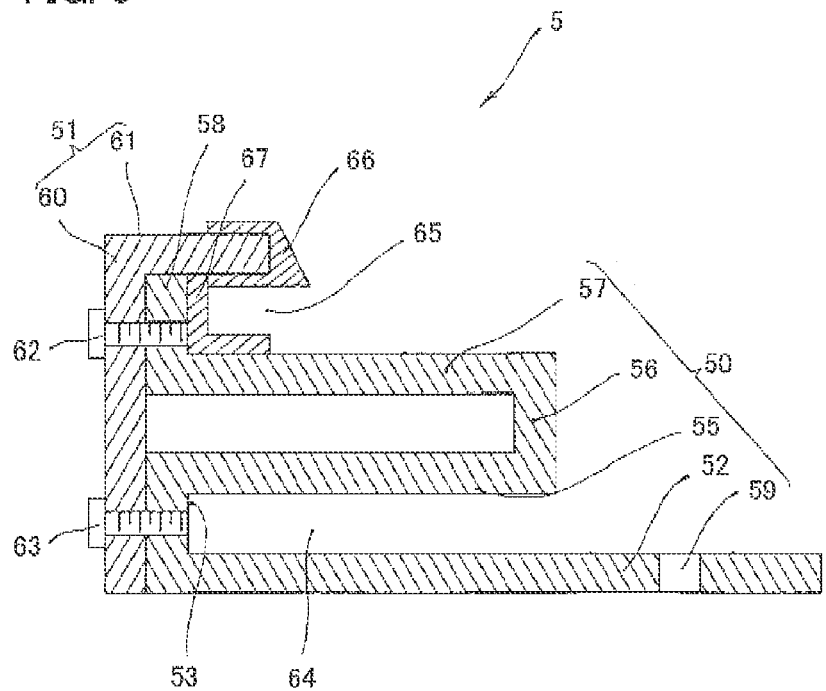
FIG. 9 is a cross section of the eaves-side mounting bracket in FIG. 7.

In this embodiment, the fixing piece 50 is formed by bending a galvanized steel sheet in a zigzag, so that, as shown in FIG. 9, the lower plate 52, the first front erecting portion 53, and the upper plate 55 define a roof-member holding receptacle 64.

Similarly, the supporting plate 57, the second front erecting portion 58, and the cover-plate composing portion 61 define a module holding receptacle 65.

There is provided a cover 66 made of an elastic body such as rubber on the connecting piece 51 at a part defining the module holding receptacle 65. There is also provided a protector 67 made of an elastic body such as rubber on the fixing piece 50 at a part defining the module holding receptacle 65.

Next, the intermediate mounting bracket (clamp) 6 will be described in detail below, making reference to FIG. 10 to FIG. 13.

Figure 11:
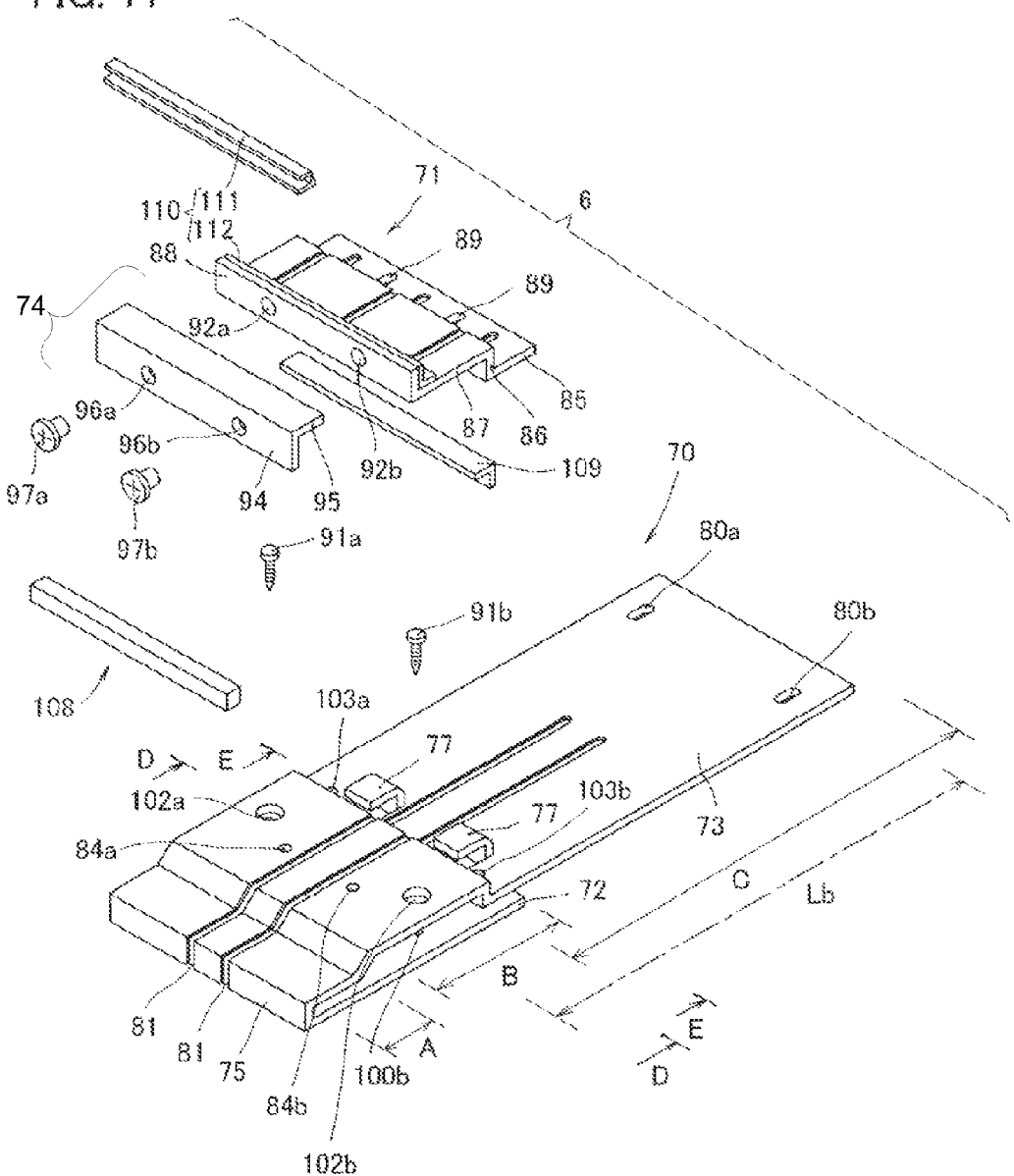
FIG. 11 is an exploded perspective view of the intermediate mounting bracket in FIG. 10.

Referring to FIG. 11, the intermediate mounting bracket 6 mainly consists of a holding-part composing member 70, an intermediate plate 71, and a holding plate 74.

The holding-part composing member 70 is formed by bending a plate, so as to include a lower plate 72, an upper plate 73, and an erecting portion (erecting wall) 75 connecting both plates.

Specifically, the lower plate 72 is a flat plate with a forward end in its longer direction folded back at 180 degrees so as to form the upper plate 73.

There is a gap of a few millimeters between the lower plate 72 and the upper plate 73.

When comparing the lengths of the lower plate 72 and the upper plate 73, the upper plate 73 is twice or more the length of the lower plate 72, and more precisely, about two to three times longer than that.

The upper plate 73, as shown in FIG. 11, has lower portions and an upper portion. Specifically, the upper plate 73 is divided into three areas A, B, and C in its longer direction, as seen in the figure. The lower portion includes a front end area A and a rear end area C and the upper portion includes a central area B. Herein, the entire length of the upper portion (the central area B) is about only one-third to one-quarter of the total.

It can be said that a large part of the upper portion (central area B) faces the lower plate 72.

The lower portion (front end area A, rear end area C) and the upper portion (central area B) of the upper plate 73 are both parallel to the lower plate 72.

There are provided two hooks 77 at positions adjacent to the central area B in the rear end area C. The hooks 77 are formed by making "U" shaped cutouts in the upper plate 73 and removing the portion of the cutouts, facing the upper portion (central area B).

Figure 12:
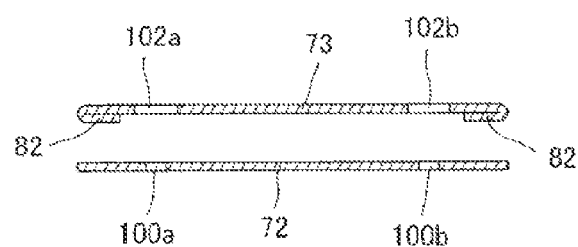
FIG. 12 is a cross section taken along the line D-D in FIG. 11.

The lower plate 72 has holes 100, 101 in two rows and two columns. Specifically, as shown in FIG. 12, there are provided two attaching holes 100a, 100b adjacent to the erecting portion 75.

Figure 13:
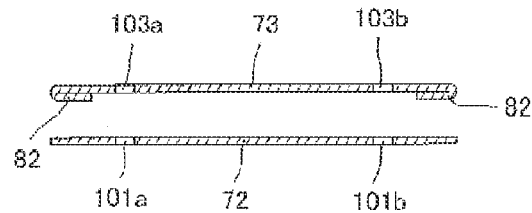
FIG. 13 is a cross section taken along the line E-E in FIG. 11.

Additionally, as shown in FIG. 13, there are provided two attaching holes 101a, 101b in parallel to the two attaching holes 100a, 100b. In sum, the lower plate 72 has four holes 100a, 100b, 101a, 101b in total.

On the other hand, the upper plate 73 has holes 102a, 102b, 103a, 103b at positions corresponding to the holes of the lower plate 72 described above, respectively.

Herein, the two attaching holes 102 (102a, 102b) adjacent to the erecting portion 75 among the four holes 102a, 102b, 103a, 1031 formed in the upper plate 73 are located in the upper portion (area B) and have larger diameters than those of the holes 100a, 100b located beneath. In contrast, the holes 103a, 103b away from the erecting portion 75 are located in the lower portion (rear end area C) and have substantially the same diameters as those of the holes 101a, 101b located beneath.

The upper plate 73 further has attaching holes 80a, 80b at positions adjacent to the rear end (positions away from the erecting portion 75). The attaching holes 80a, 80b of the upper plate 73 are slightly elongated holes.

The upper portion (central area B) of the upper plate 73 has two female screw holes 84a, 84b.

Figure 28:
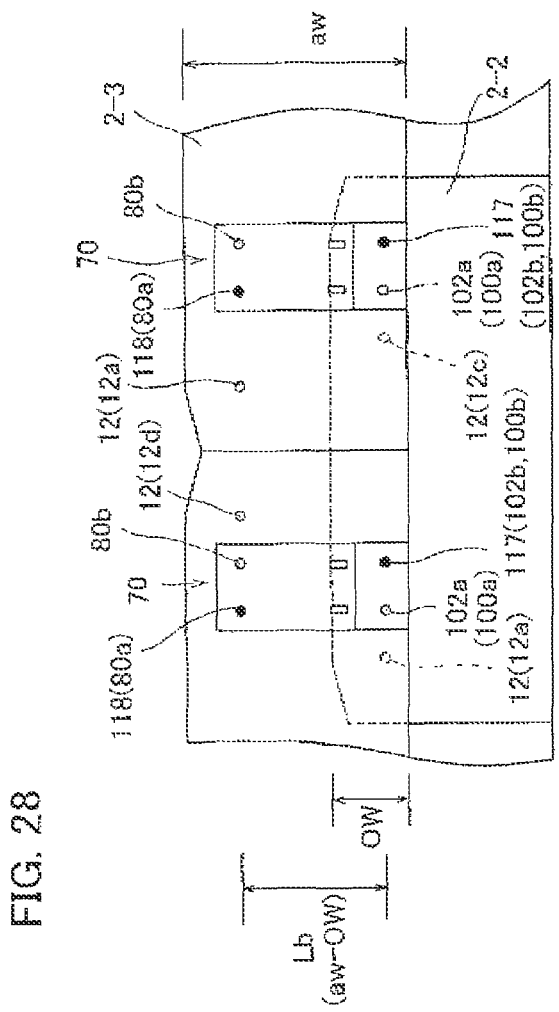
FIG. 28 is a plan view showing a state with the holding-part composing members of the intermediate mounting brackets of the first row screwed to the slate tiles of the third row.

The distance Lb between the two attaching holes 100a, 100b (sic. 102a, 102b) adjacent to the erecting portion 75 in the lower plate 72 and the attaching holes 80a, 80b adjacent to the rear end in the upper plate 73 satisfies a formula "Lb=aw−OW," as shown in FIG. 28, assuming that the slate tile 2 has a width "aw" and a width "OW" of an overlapping part.

In other words, the interval between each hole of the lower plate 72 and each hole of the upper plate 73 is a width of an exposed part of the roof member. Herein, the exposed part means a part excluding a part overlapped with an adjacent roof member located in the ridge side from the roof member in issue.

As to the detail of the holding-part composing member 70, there are provided two weld beads 81 in the longer direction at positions from the central part of the upper plate 73 to the erecting portion 75. In this embodiment, the weld beads 81 each come around from the intermediate part of the rear end area C through the upper portion (central area B) and the front end area A up to the erecting portion 75.

The holding-part composing member 70 has folded parts 82 (FIGS. 12 and 13) at both ends in a width direction and at positions corresponding to the above-mentioned weld beads 81.

The weld beads 81 and the folded parts 82 described above both are provided so as to improve a rigidity of the holding-part composing member 70.

Figure 14:
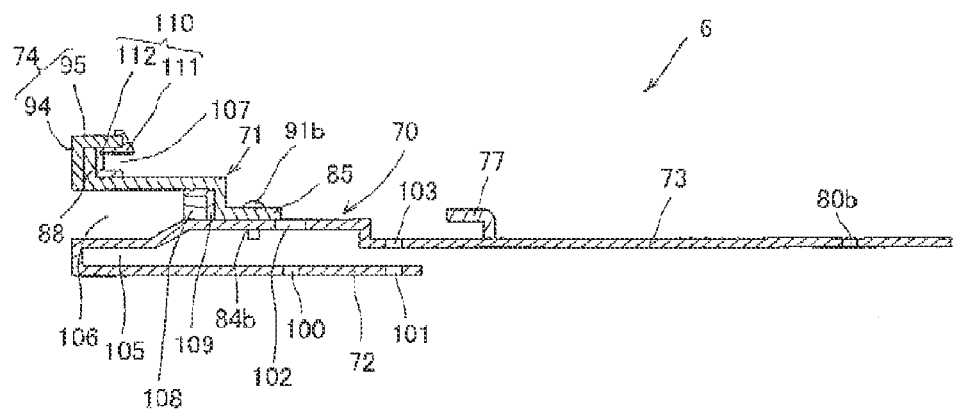
FIG. 14 is a cross section of the intermediate mounting bracket in FIG. 10.
Figure 15:
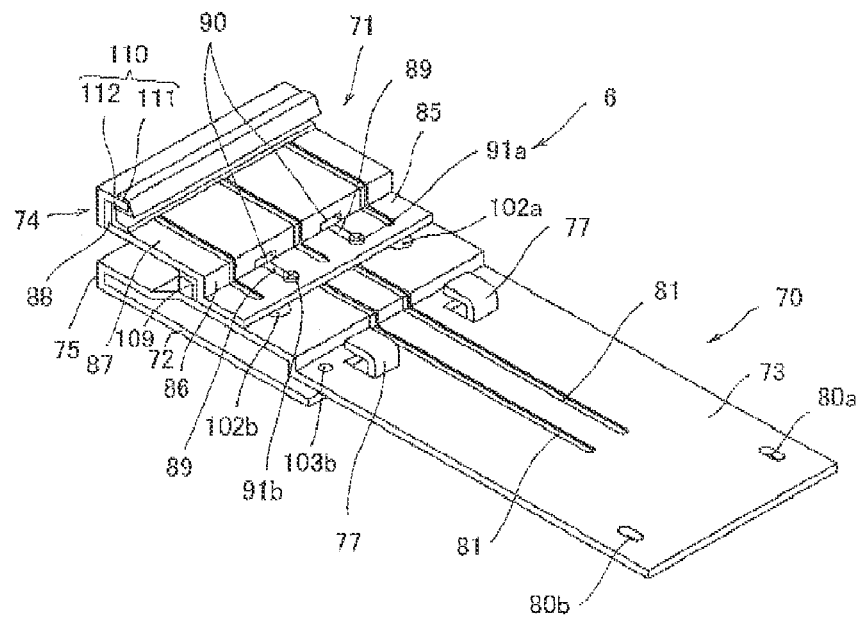
FIG. 15 is a perspective view of the intermediate mounting bracket (clamp) employed in the roof structure of the embodiment.

The intermediate plate 71 is, as shown in FIGS. 11, 14, and 15, formed by bending a board in a step-like pattern.

Specifically, the intermediate plate 71 has a first flat plate 85, a first step 86, a second flat plate 87, and a second step (front erecting wall) 88 formed in this order.

The first flat plate 85 has two elongated holes 89. The elongated holes 89 come to a wall surface of the first step 86, which also has elongated-hole continuations 90. The elongated-hole continuations 90 each have a rectangular shape with a width longer than that of a main part of the above-mentioned elongated hole 89. More specifically, the width is large enough for the insertion of a head of screws 91a and/or 91b. In contrast, the main part of the elongated hole 89 is designed in size being large enough for the insertion of the neck of screws 91a and/or 91b but impossible for the insertion of the head.

The second step 88 has two female screw holes 92a, 92b.

The intermediate plate 71 has three weld beads formed over the entire length thereof. The intermediate plate 71 further has folded parts (not shown) at both ends over the entire length thereof.

The holding plate 74 is a member of an L-shaped cross section, consisting of a front plate 94 and a folded part 95.

The front plate 94 has two holes 96a, 96b.

Figure 10:
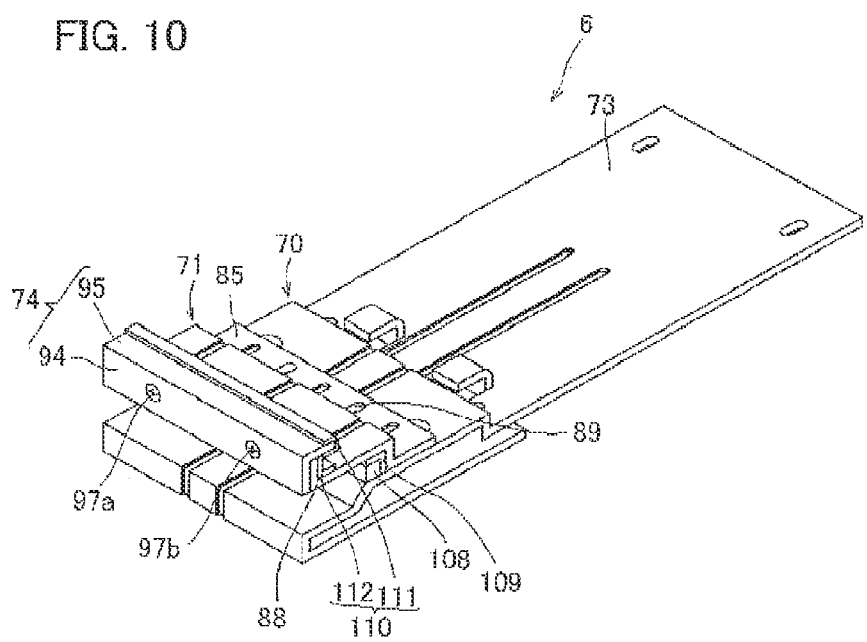
FIG. 10 is a perspective view of an intermediate mounting bracket (clamp) employed in the roof structure of the embodiment.

The intermediate mounting bracket (clamp) 6 is assembled, as shown in FIGS. 10 and 14, so that the intermediate plate 71 is placed on the holding-part composing member 70 with the holding plate 74 attached to the intermediate plate 71.

Specifically, the first flat plate 85 of the intermediate plate 71 is placed in contact with the portion (area B) of the holding-part composing member 70. The elongated holes 89 of the first flat plate 85 are respectively aligned with the female screw holes 84a, 84b of the holding-part composing member 70, and the screws 91a, 91b are inserted and driven into the aligned holes, thereby securing the intermediate plate 71 to the upper portion (area B) of the holding-part composing member 70.

Herein, in this embodiment, as shown in FIG. 15, the elongated holes 89 of the first flat plate 85 each come around the wall surface of the first step 86, with the width of the elongated-hole continuation 90 being larger than that of the main part of the above-mentioned elongated hole 89 and enough for the insertion of the head of the screws 91a and 91b. Therefore, with the screws 91a and 91b loosened, gaps formed between the heads of the screws and the first flat plate 85 allow the intermediate plate 71 to slide while the screws 91a and 91b are inserted in the female screw holes 84 of the holding-part composing member 70, so that the intermediate plate 71 is attached and detached.

The holding plate 74 is attached to the second step 88 by engaging the two screws 97a, 97b through the holes 96a, 96b with the female screw holes 92a, 92b of the intermediate plate 71. Specifically, the rear surface of the front plate 94 of the holding plate 74 is brought into contact with a surface of the second step 88, so that the holes 96a, 96b of the holding plate 74 are aligned with the female screw holes 92a, 92b of the second step 88 respectively, and the screws 97a, 97b are driven into the aligned holes.

The intermediate mounting bracket 6, in which the holding-part composing member 70, the intermediate plate 71, and the holding plate 74 are attached together, as shown in FIGS. 10 and 14, has a first receptacle 105, a second receptacle 106, and a third receptacle 107: the first receptacle 105 is defined by the lower plate 72 and the upper plate 73 and opens in one direction of the intermediate mounting bracket 6, the second receptacle 106 is defined by a part of the upper plate 73 and the intermediate plate 71 attached to the upper plate 73 and opens in a direction opposite to that of the above-mentioned first receptacle 105, and the third receptacle 107 is defined by a part of the intermediate plate 71 and the holding plate 74 attached to the intermediate plate 71 and opens in the same direction as that of the first receptacle 105.

The second receptacle 106 is arranged with an elastomeric foam (cushioning) 108 and a sealing member (seal material) 109. The sealing member 109 is made of an elastic body such as rubber, covering a wall surface and a ceiling surface of the second receptacle 106.

Similarly, the third receptacle 107 is also arranged with a sealing member 110. The sealing member 110 is made of an elastic body such as rubber, covering a wall surface and a ceiling surface of the third receptacle 107. Herein, the sealing member 110 consists of sealing pieces (seal material) 111, 112. The sealing piece 111 is substantially of a laterally-facing U-shaped cross section and attached to an edge in a projecting direction of the folded part 95. The sealing piece 112 is of an L-shaped cross section and attached to the second flat plate 87 and the second step 88.

Next, a construction procedure of the roof structure 1 of the present embodiment will be described in detail below. The roof structure 1 in this embodiment is constructed in such a manner that the slate tiles 2 are arranged outspread planarly in a row to form a plurality of rows on a roof base having been firstly formed. In arrangement of the slate tiles 2, the eaves-side mounting brackets (eaves-side clamps) 5 and the intermediate mounting brackets (clamps) 6 are attached.

In short, in this embodiment, the fundamental roof structure 3 is constructed before arrangement of the solar cell modules 10.

The specific processes are as follows.

Figure 16:
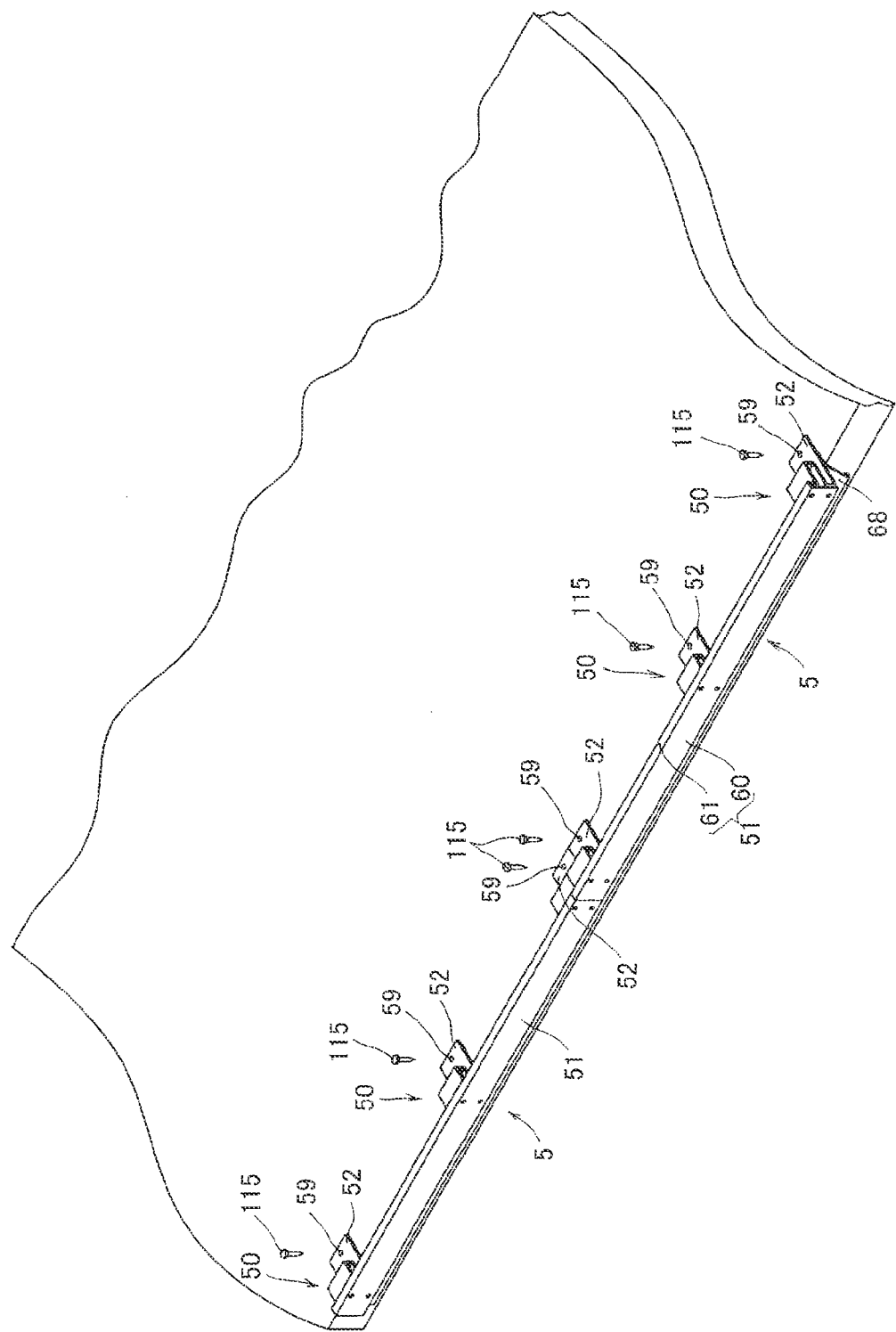
FIG. 16 shows a construction process of the roof structure of the embodiment and is a perspective view of the roof structure with the eaves-side mounting brackets attached to an eave of a roof base.

Referring to FIG. 16, a drip 68 at the eaves of the slate tile 2 and then the eaves-side mounting brackets (eaves-side clamps) 5 are arranged along the eaves of the roof base. The front portion 60 of the connecting piece 51 of the eaves-side mounting bracket 5 comes to a position protruding a plate thickness (ml in FIG. 19) of the eaves-side mounting bracket 5 from a length (t1 in FIG. 19) of the slate tile 2 protruding from the eaves side.

The eaves-side mounting bracket 5 is attached by inserting fastening elements 115 such as wood screws or nails into the attaching holes 59 of the lower plate 52 and engaging the fastening elements 115 with the roof base.

The eaves-side mounting brackets 5 are attached without intervals so as to have no space along the eaves seen from a side of the front portion 60.

Figure 17:
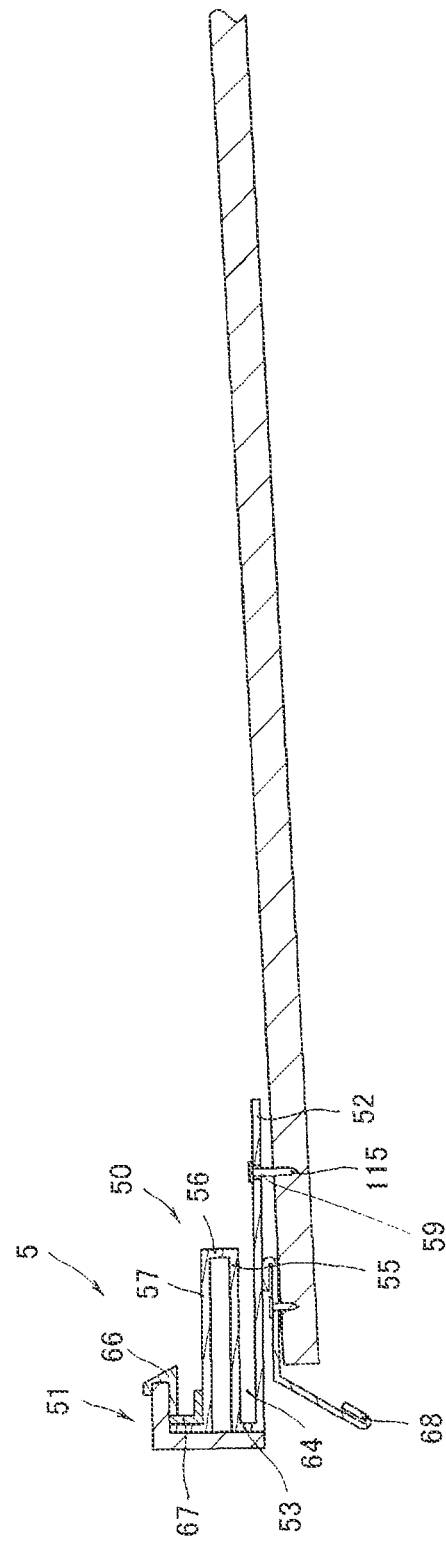
FIG. 17 is a cross section of the roof structure in FIG. 16.

Referring to FIG. 17, with the eaves-side mounting brackets 5 attached along the eaves, the roof-member holding receptacle 64 defined by the lower plate 52, the first front erecting portion 53, and the upper plate 55 opens toward the ridge.

Figure 18:
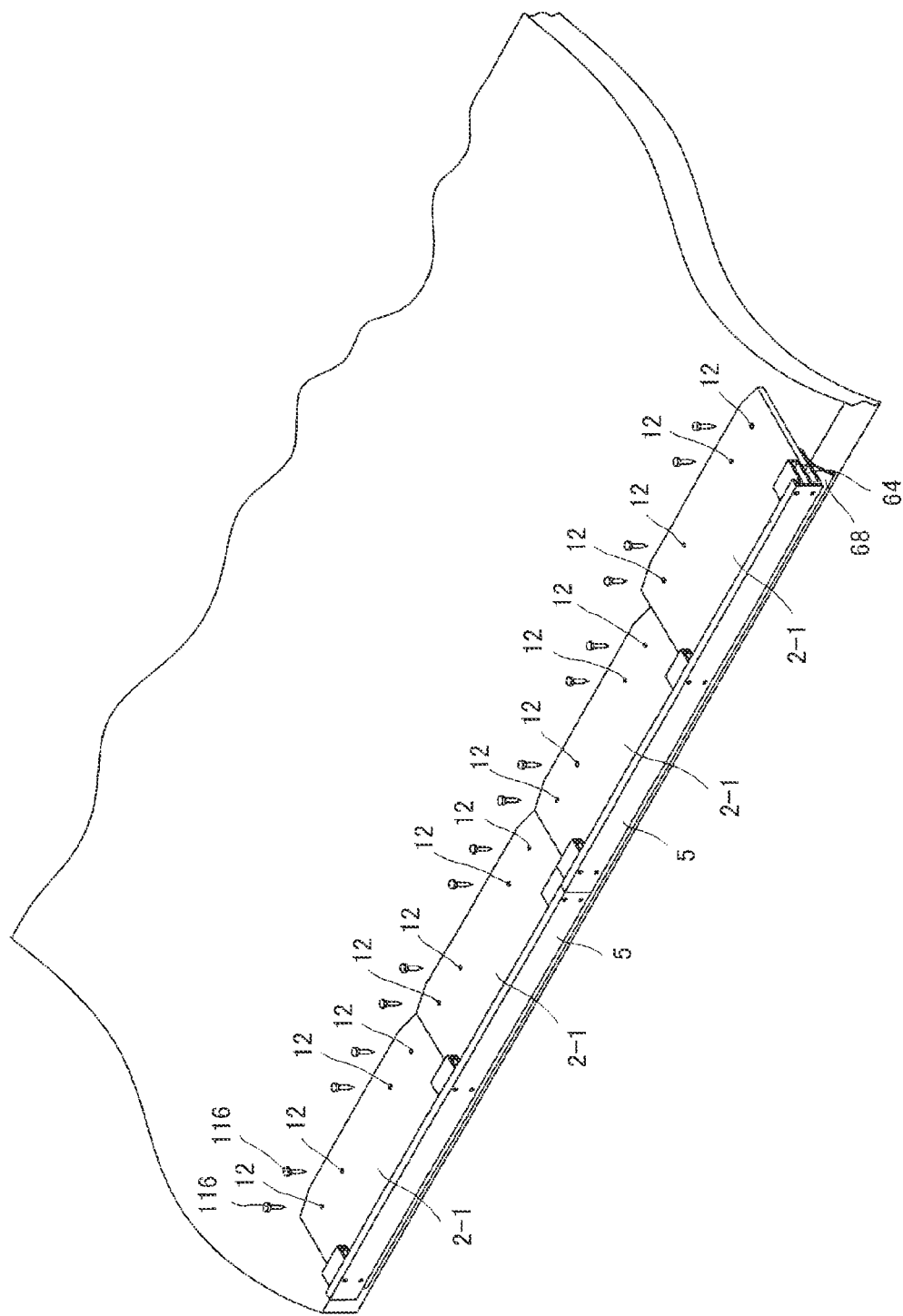
FIG. 18 shows a process following the process in FIGS. 16 and 17 and is a perspective view of the roof structure with slate tiles of a first row arranged.

As for the next process, slate tiles 2-1 of an eaves-side first row are arranged. The slate tiles each are held at its eaves-side edge by being fit into the roof-member holding receptacle 64 of the eaves-side mounting bracket 5 described above (FIG. 18).

The slate tiles each cover the entire upper area of the lower plate 52 of the eaves-side mounting bracket 5, so that the slate tile 2-1 of the eaves-side first row covers the attaching holes 59 of the eaves-side mounting bracket 5. That protects the attaching holes 59 of the eaves-side mounting bracket 5 from rainwater seepage.

Figure 19:
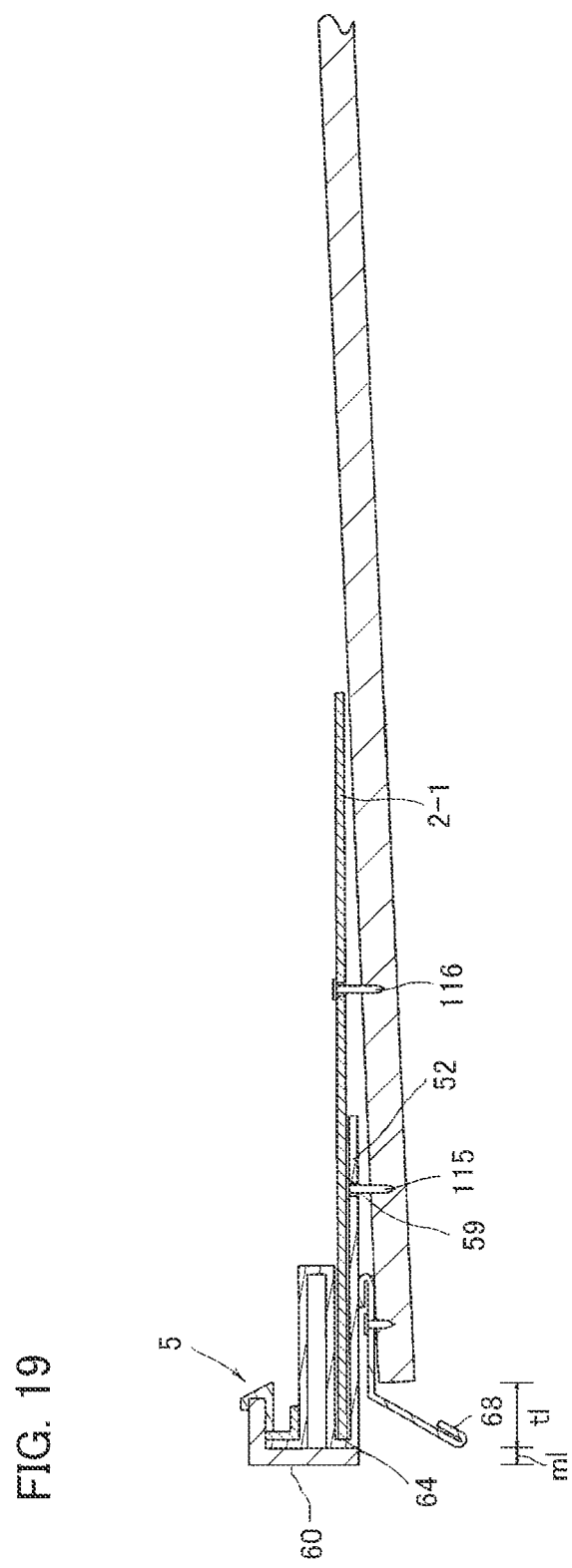
FIG. 19 is a cross section of the roof structure in FIG. 18.

As described above, the slate tiles 2 each have four attaching holes 12, through which nails or the like 116 are inserted and engaged with the roof base, and whereby the middle part of the slate tile 2-1 is fixed. Hence, as shown in FIG. 19, the slate tile 2-1 of the eaves-side first row is held by the eaves-side mounting bracket 5 at its distal part and by the nails or the like 116 at its middle part, so as to be stabilized as a whole.

Subsequently, slate tiles 2-2 of an eaves-side second row are arranged.

Figure 20:
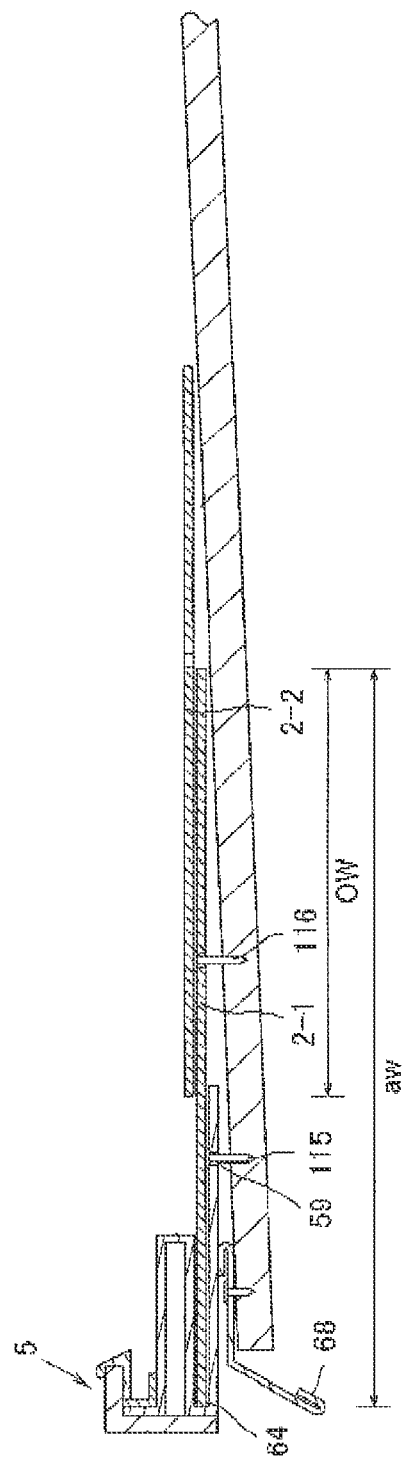
FIG. 20 shows a process following the process in FIG. 19 and is a cross section of the roof structure with slate tiles of a second row arranged.

The slate tiles 2-2 of the second row are arranged in the same manner as the known roofing work, each with a part of the slate tile 2-2 of the second row near the eaves overlapping a part of the previously-arranged slate tile 2-1 of the first row near the ridge (FIG. 20).

The amount of an overlapping part of the slate tile 2-1 of the first row and the slate tile 2-2 of the second row is determined by an experimental rule. However, the slate tile 2-2 of the second row overlaps the slate tile 2-1 of the first row so as to at least cover the attaching holes 12 thereof. As described above, since the attaching holes 12 of the slate tile 2 are aligned in a row near the center of the slate tile 2 in the shorter direction, the width (OW) of the overlapping part of the slate tile 2-1 of the first row and the slate tile 2-2 of the second row is beyond 50% of the length of the slate tile 2 in the shorter direction.

Upon arrangement of the slate tiles 2-2 of the second row, nails or the like 117 are inserted into the four attaching holes 12 of each slate tile 2-2 of the second row so as to be engaged with the roof base. At this time, in this embodiment, the intermediate mounting brackets (clamps) 6 are attached in parallel with this process.

Figure 21:
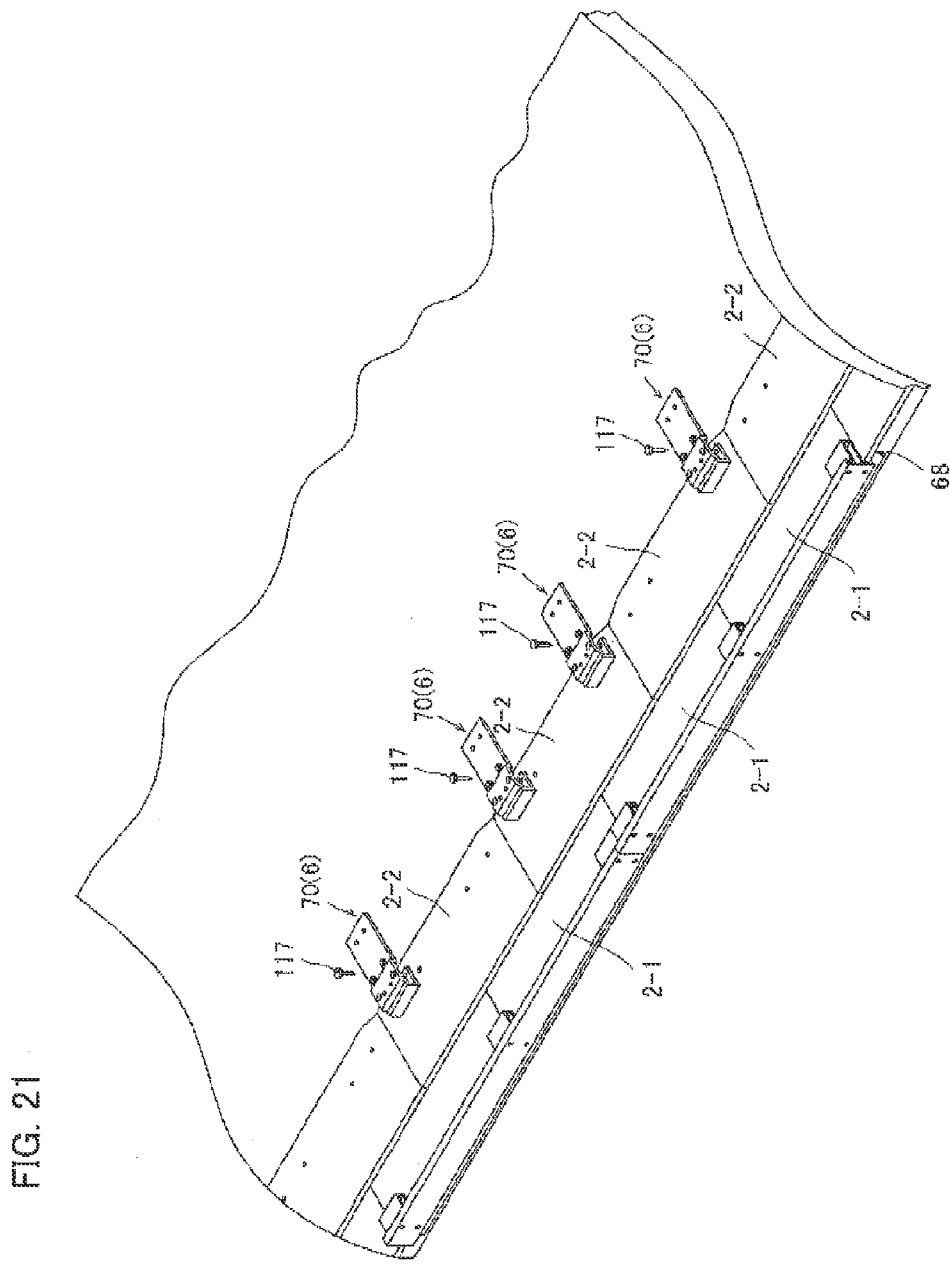
FIG. 21 shows a process following the process in FIG. 20 and is a perspective view in attaching holding-part composing members of intermediate mounting brackets of a first row to the slate tiles of the second row.
Figure 22:
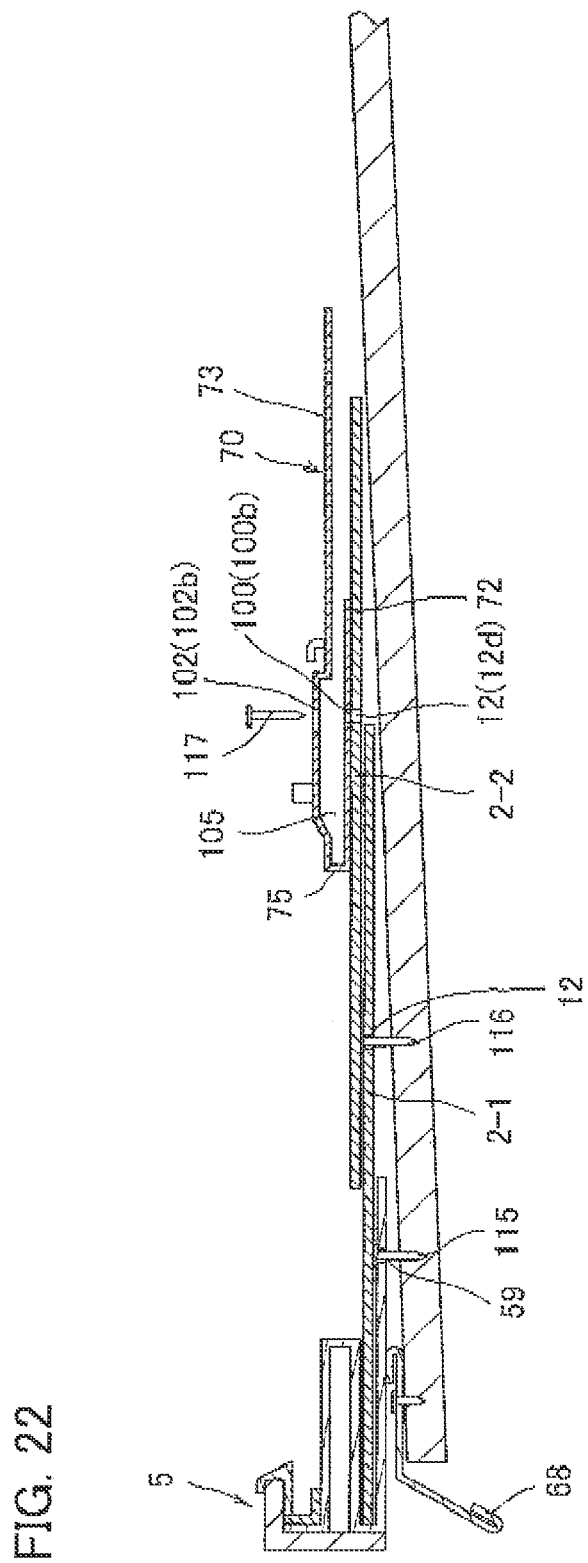
FIG. 22 is a cross section of the roof structure in FIG. 21.

A recommended process is, as shown in FIGS. 21 and 22, to attach only the holding-part composing member 70 with the intermediate plate 71 detached from the assembled intermediate mounting bracket 6.

More specifically, only the holding-part composing member 70 of the intermediate mounting bracket 6 is placed on the previously-arranged slate tile 2-2 of the second row.

Herein, since the holding-part composing member 70 of the intermediate mounting bracket 6 has the lower plate 72 and the upper plate 73, which are connected via the erecting portion 75, the lower plate 72 is placed on the slate tile 2-2 of the second row. Then, the holding-part composing member 70 is attached by using either hole of the two holes 100a, 100b located near the forward end (near the erecting portion 75) among the four holes 100a, 100b, 101a, 101b formed in two rows and two columns in the lower plate 72 of the holding-part composing member 70. Specifically, any hole among the holes 12a, 12b, 12c, 12d in the slate tile 2-2 of the second row and either one of the holes 100a, 100b located near the forward end of the holding-part composing member 70 are visually aligned, and a screw is driven into the aligned holes so as to fix the holding-part composing member 70. At this time, since the slate tile 2-2 of the second row is entirely exposed, the holes 12a, 12b, 12c, 12d of the slate tile are directly viewed. That facilitates aligning of the holes 12a, 12b, 12c, 12d of the slate tile with the holes 100a, 100b of the holding-part composing members 70.

Though the upper plate 73 lies on the lower plate 72, the lower plate 72 has 102a, 102b at positions above the holes 100a, 100b, through the holes 102a, 102b the screw can be inserted into 100a, 100b of the lower plate 72. The holes 102a, 102b of the upper plate 73 are larger than 100a, 100b of the lower plate 72, allowing easy turning of a driver.

With the holding-part composing member 70 fixed, the first receptacle 105 defined by the lower plate 72, the erecting portion 75, and the upper plate 73 opens toward the ridge of the roof.

Further, screws or nails are driven in holes other than the hole used for fixation of the holding-part composing member 70 among the holes 12a, 12b, 12c, 12d of the slate tile of the second row, which is fixed to the roof base.

Figure 23:
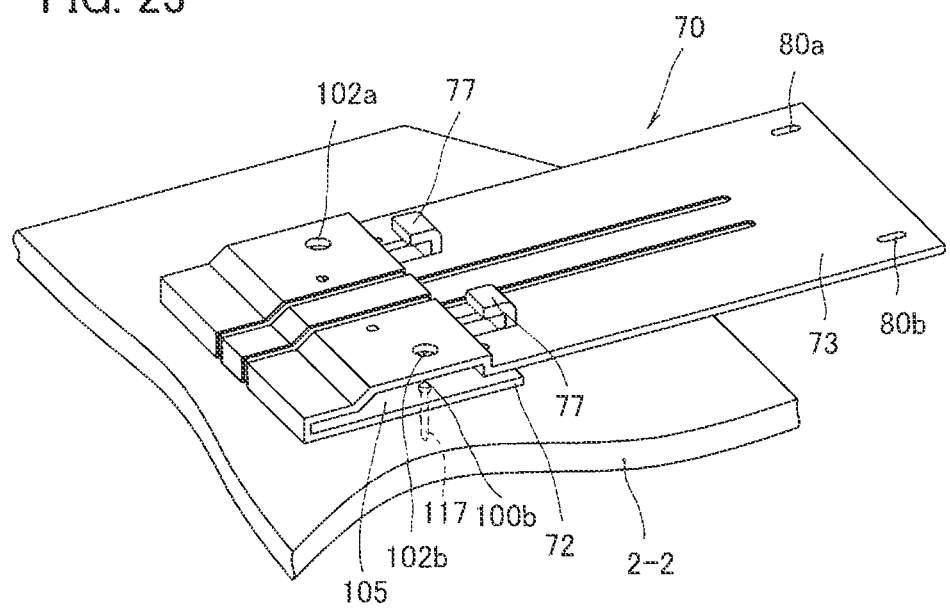
FIG. 23 is an enlarged perspective view of the holding-part composing member in attaching the holding-part composing member of the intermediate mounting bracket of the first row to the slate tile of the second row.
Figure 24:
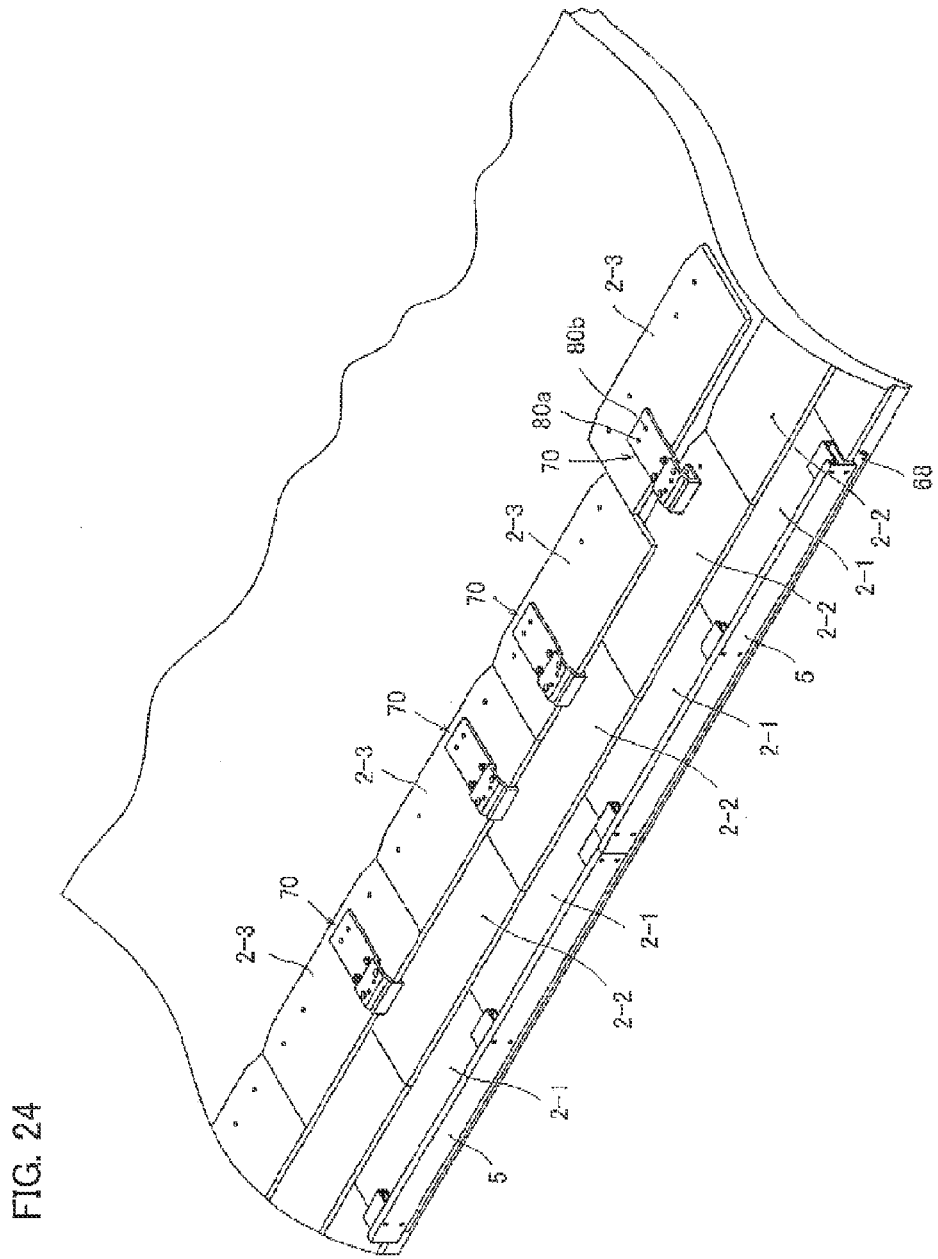
FIG. 24 shows a process following the process in FIG. 23 and is a perspective view in inserting slate tiles of a third row into first receptacles of the intermediate mounting brackets of the first row.

In this way, as shown in FIG. 23, upon completion of the fixation of the slate tiles 2-2 of the second row, slate tiles 2-3 of the third row are arranged as shown in FIG. 24. The slate tiles 2-3 of the third row are each inserted into the first receptacle 105 of the intermediate mounting bracket 6 by its distal part adjacent to the eaves side. As described above, the first receptacle 105 opens toward the ridge of the roof, facilitating insertion of the slate tile 2-3 of the third row.

Figure 25:
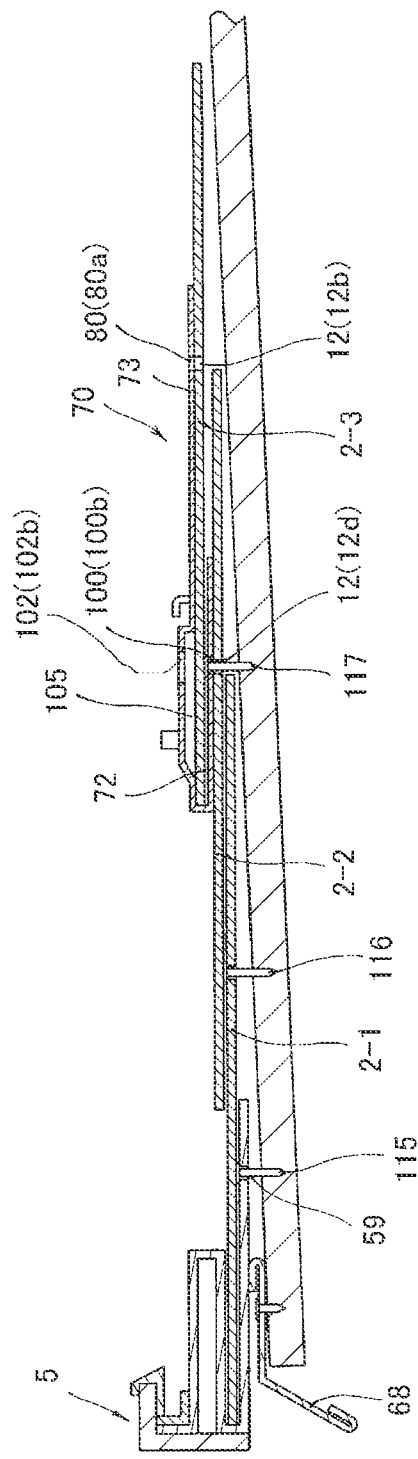
FIG. 25 is a cross section of the roof structure in FIG. 24.

As shown in FIGS. 24 and 25, the eaves-side edge of the slate tile 2-3 of the third row enters the first receptacle 105 deeply. At this time, since the holes 100a, 100b of the lower plate 72, in which the screws are inserted in the previous process, are located within the above-mentioned first receptacle 105, insertion of the eaves-side edge of the slate tile 2-3 of the third row into the first receptacle 105 makes the slate tile 2-3 of the third row cover 100a, 100b of the lower plate 72. More specifically, the above-located slate tile, except the attaching holes, covers 100a, 100b of the lower plate 72. That protects the holes 100a, 100b of the lower plate 72 from rainwater seepage.

Figure 26:
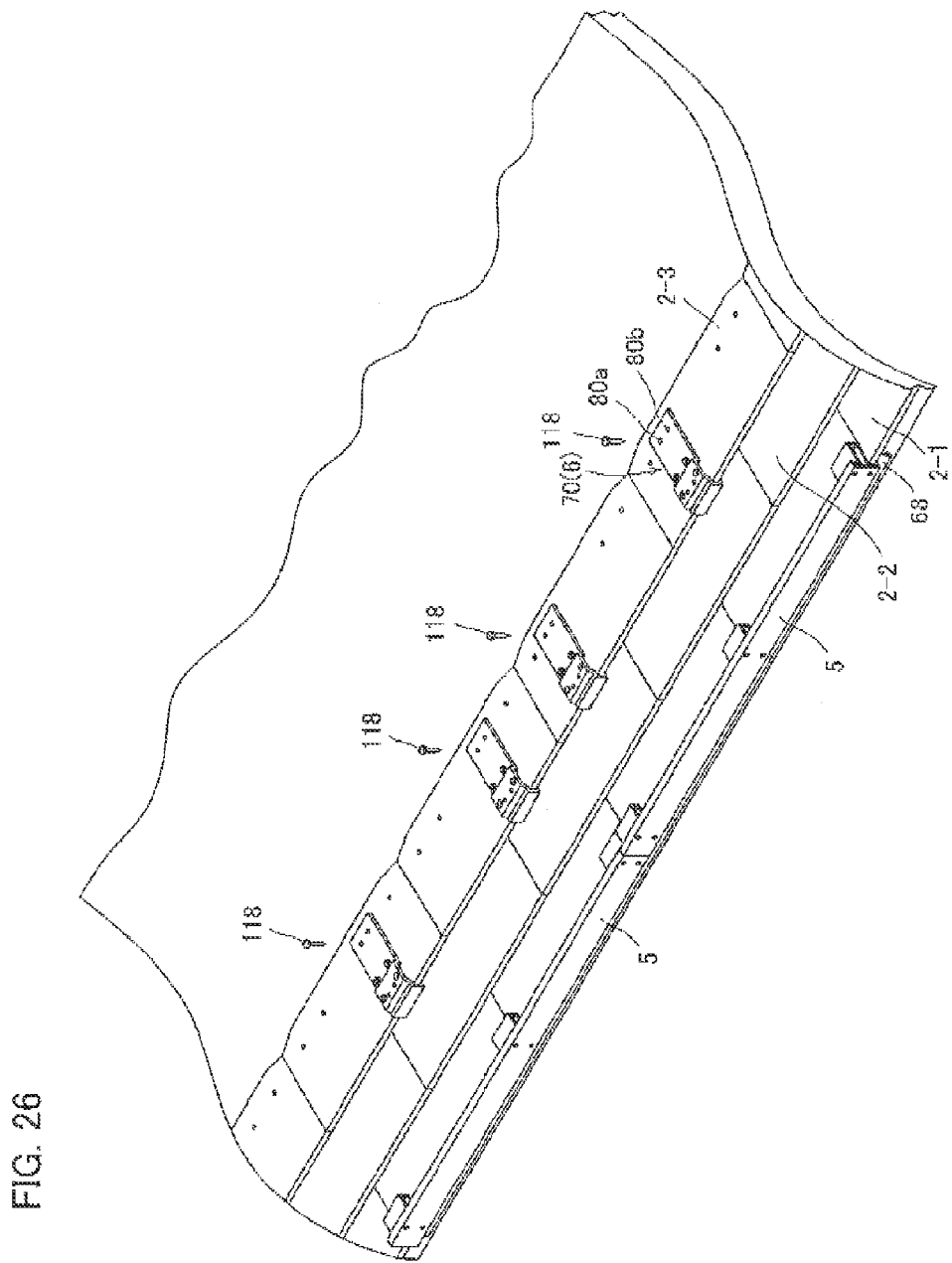
FIG. 26 is a perspective view of screwing the holding-part composing members of the intermediate mounting brackets of the first row to the slate tiles of the third row.
Figure 27:
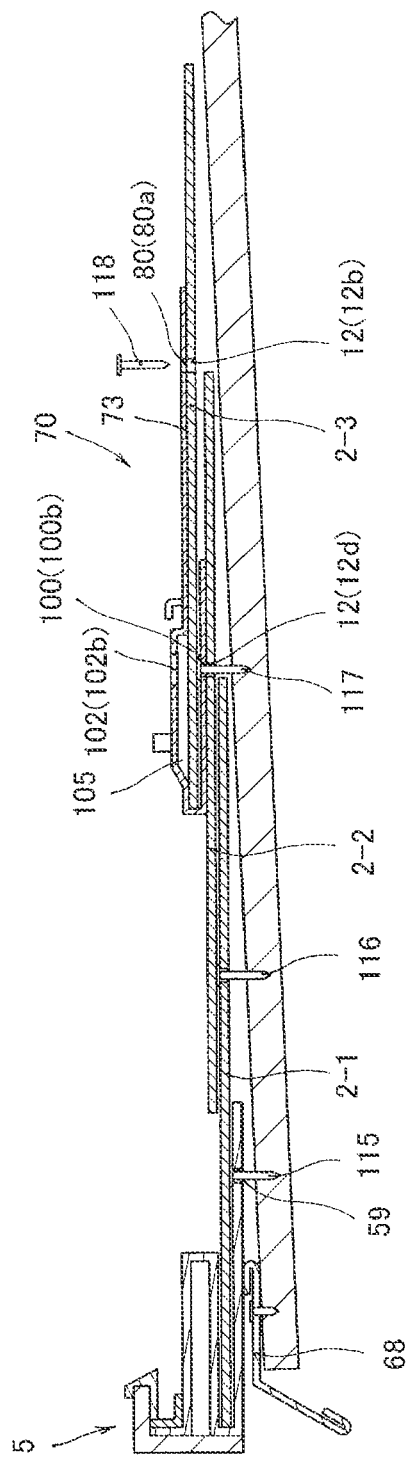
FIG. 27 is a cross section of the roof structure in FIG. 26.

Additionally, the slate tile 2-3 of the third row lies below the entire area of the upper plate 73 of the intermediate mounting bracket 6. In the next process, as shown in FIGS. 26 and 27, either hole of the attaching holes 80a, 80b formed near the rear end of the upper plate 73 of the intermediate mounting bracket 6 and any hole among the holes 12a, 12b, 12c, 12d of the slate tile 2-3 of the third row are aligned. A nail or the like (nail or screw) 118 is inserted into the positioned holes, so as to fix the intermediate mounting bracket 6.

For attachment of the intermediate mounting bracket 6, it is preferable to use a hole (any one among 12a, 12b, 12c, 12d of the slate tile 2-3) with a column-wise shift relative to the hole (the one among 12a, 12b, 12c, 12d of the slate tile 2-2) having been used for insertion of the screw or the like 117 in the slate tile 2-2 of the second row.

More specifically, as shown in FIG. 28, in a case where the attaching hole 100a has been used to fix the lower plate 72 among the attaching holes 100a, 100b located in the forward end among the four attaching holes formed in the lower plate 72, the hole 80b is used among the holes 80a, 80b located at the rear end. In contrast, in a case where the attaching hole 100b has been used to fix the lower plate 72, the hole 80a is used as the hole in the rear end.

In other words, the holes are selected so that a line connecting the hole in which the screw or the like 117 inserted in the forward end with the hole in which the screw or the like 118 is inserted in the rear end becomes oblique relative to a direction of tilt of the roof.

In this embodiment, the intermediate mounting brackets 6 are fixed with the screws shifted in this way, which produces increased intensity of attachment of the intermediate mounting brackets 6.

Either hole of the attaching holes 80a, 80b of the intermediate mounting bracket 6 and any hole among the holes 12a, 12b, 12c, 12d in the slate tile 2-3 of the third row are easily positioned because of the direct view of the holes with the upper plate 73 exposed above the slate tile 2-3 of the third row. The lower plate 72 does not lie under the attaching holes 80a, 80b formed adjacent to the rear end since the entire length of the upper plate 73 is longer than that of the lower plate 72. Thus, the screw or the like 118 is only driven in either hole of the attaching holes 80a, 80b of the upper plate 73 and any hole among the holes 12a, 12b, 12c, 12d of the slate tile 2-3, which can be done visually by eye. This produces high workability.

Subsequently, slate tiles 2-4 of the fourth row are arranged. The arrangement of the slate tiles of the fourth row is done substantially in the same manner as the above-mentioned slate tiles 2-2 of the second row. A part of the slate tile 2-4 of the fourth row near the eaves overlaps a part of the previously-arranged slate tile 2-3 of the third row near the ridge (FIG. 29). The amount of an overlapping part of the slate tile 2-3 of the third row and the slate tile 2-4 of the fourth row is determined by an experimental rule. However, at least, the slate tile 2-4 of the fourth row overlaps the slate tile 2-3 of the third row so as to cover the attaching holes 12 (either one of 12a, 12b, 12c, 12d) thereof.

Thereby, the slate tile 2-4 of the fourth row covers the attaching holes 80a, 80b of the intermediate mounting bracket 6 and the fastening element 118 such as the nail. More specifically, the above-located slate tile 2-4, except the attaching hole (either one among 12a, 12b, 12c, 12d), covers the attaching holes 80a, 80b of the upper plate 73. This protects the attaching holes 80a, 80b of the upper plate 73 from rainwater seepage.

Then, as shown in FIG. 30, as in the case of the arrangement in the second row, upon completion of the arrangement of the slate tiles 2-4 of the fourth row, nails or the like 119 are inserted into the four attaching holes 12 of each slate tile 2-4 of the fourth row so as to be engaged with the roof base. At this time, the intermediate mounting brackets 6 are attached in parallel with this process. Attachment of the intermediate mounting brackets 6 is done in the same manner as the work in the second row. Then, as shown in FIG. 31, slate tiles 2-5 are arranged in the same manner as the slate tiles 2-3 described above.

Figure 32:
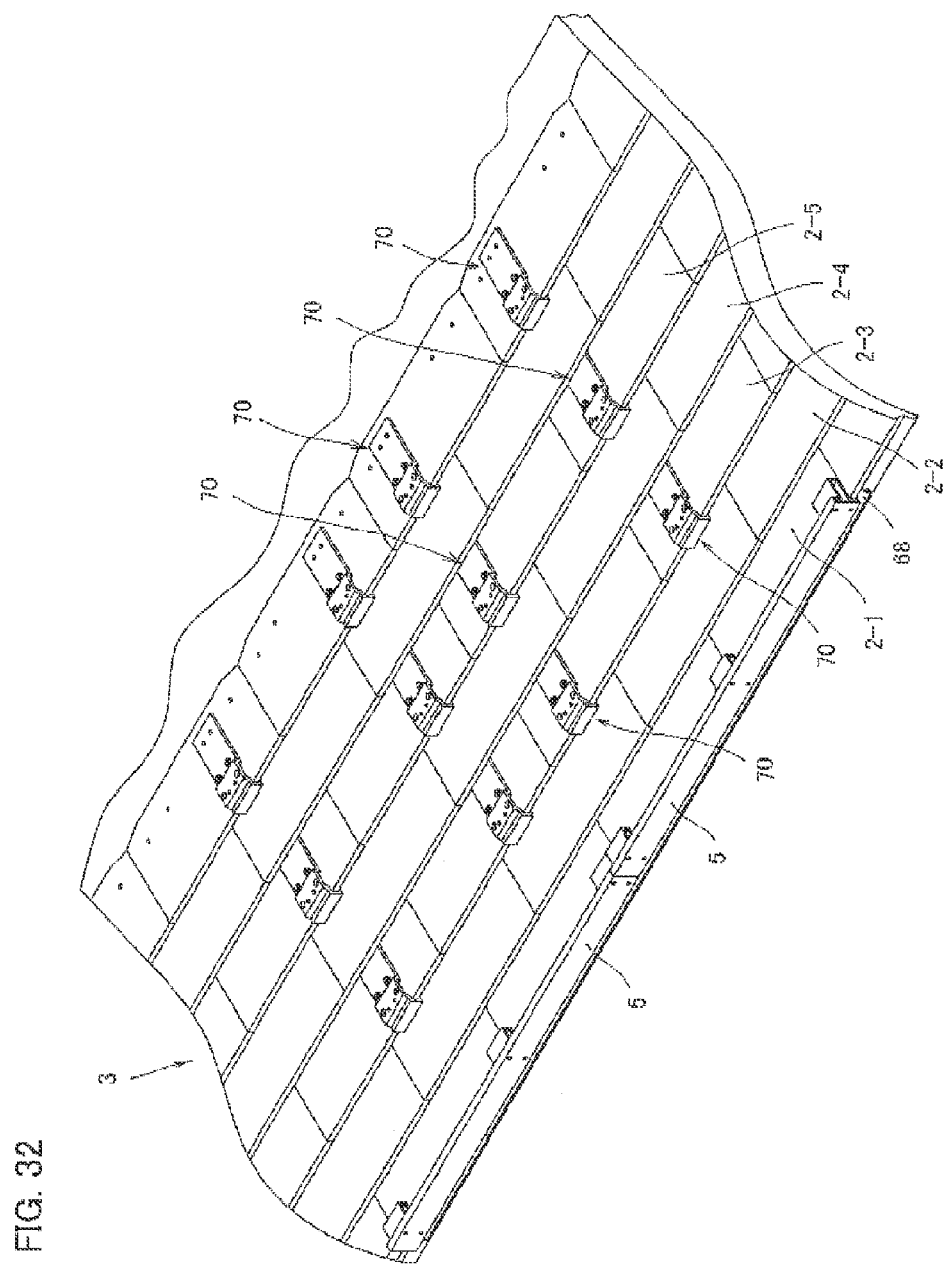
FIG. 32 is a perspective view showing a state with the eaves-side mounting brackets and the holding-part composing members of the intermediate mounting brackets to the slate tiles respectively.

In this way, the slate tiles 2 are arranged in the fifth row, the sixth row, and sequentially up to the ridge. Then, as shown in FIG. 32, the arrangement of the slate tiles 2 on the roof base are completed, thereby accomplishing the fundamental roof structure 3.

As a result, the eaves-side mounting brackets 5 are fixed from the eaves side on the roof and the holding-part composing members 70 of the intermediate mounting brackets 6 are only attached to alternate slate tiles 2.

As described above, in this embodiment, the intermediate mounting brackets 6 (the holding-part composing members 70) are attached by using the four attaching holes 12 of the slate tiles 2. In sum, a plurality of holes for attachment formed in the intermediate mounting brackets 6 (the holding-part composing members 70) and the existing attaching holes 12 of the slate tiles 2 are positioned and communicated with each other by the fastening elements. This avoids the necessity of process such as forming additional holes for attachment in the slate tiles 2 and the deterioration of strength due to the holes additionally formed in the slate tiles 2. Furthermore, the use of the slate tiles 2 without processing facilitates the attachment work.

In this way, the holding-part composing members 70 each have a plurality of holes such as the holes 100 in the lower plate 72 and the attaching holes 80 of the upper plate 73. The fastening members are driven in those holes (holes 100, attaching holes 80) and the attaching holes 12 of the respective below-located roof members (slate tiles 2). Those holes (holes 100, attaching holes 80) are covered with the roof members (slate tiles 2) from above. That keeps the attached parts from being exposed, ensuring the attachment with weather and deterioration resistance.

Subsequently, the solar cell modules 10 are arranged on the fundamental roof structure 3.

Further, in this embodiment, in arrangement of the solar cell modules 10, wiring of the solar cell modules 10 is done.

The solar cell modules 10 are arranged outspread planarly on the fundamental roof structure 3 in a row to form a plurality of rows. However, the wiring is simple and requires only connection of the cables of adjacent solar cell modules 10 of the same row.

Figure 33:
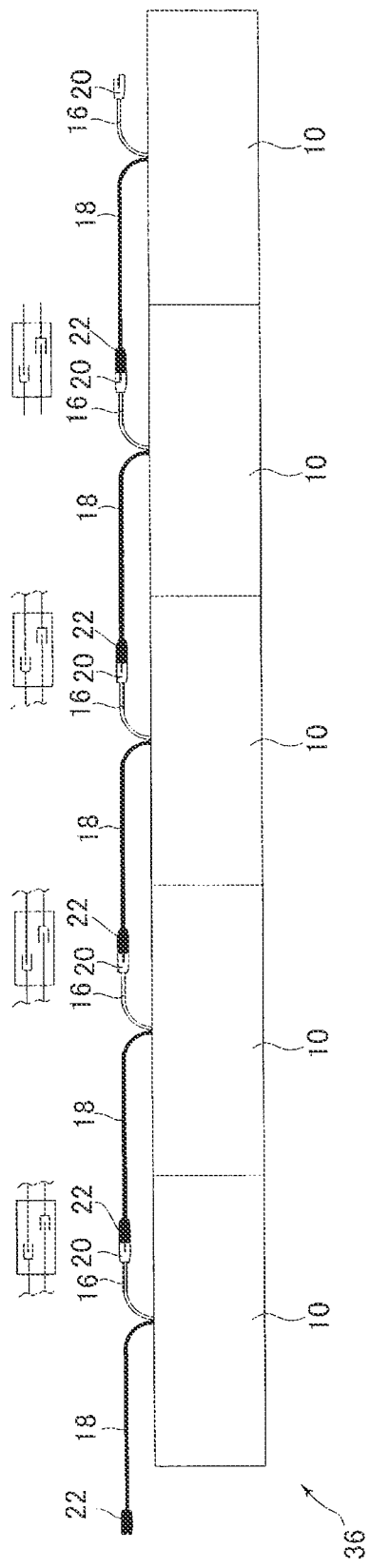
FIG. 33 is a conceptual diagram for explaining a method of connecting solar cell modules.

In this embodiment, as shown in FIG. 33, in adjacent solar cell modules 10, 10, the first connector 20 of one solar cell module 10 and the second connector 22 of the other solar cell module 10 adjacent thereto are connected with each other. That electrically connects the two adjacent solar cell modules parallel, as shown in FIG. 34. Specifically, connection of the first connector 20 in white attached to the first cable 16 in white with the second connector 22 in black attached to the first cable 18 in black allows parallel connection of the adjacent solar cell modules 10. Consequently, in the solar cell modules 10 in this embodiment, all the solar cell modules 10 of the module row 36 are sequentially connected in parallel by connection of the solar cell modules 10 using the cables 16 and 18.

Now, a process of mounting of the solar cell modules 10 on the fundamental roof structure 3 and a cable wiring work performed in parallel will be described below.

The solar cell modules 10 are arranged in order of row from the eaves-side row.

By the construction of the fundamental roof structure 3 previously described, the eaves-side mounting brackets 5 have been attached to the eaves. The eaves-side edge (side from which no cable is extracted) of a solar cell module 10-1 of the first row is engaged with the module holding receptacle 65 of the eaves-side mounting bracket 5.

Specifically, as shown in FIG. 35, the eaves-side mounting bracket 5 has the module holding receptacle 65 defined by the supporting plate 57, the second front erecting portion 58, and the cover-plate composing portion 61, the module holding receptacle 65 opening toward the ridge of a building. Thus, the eaves-side edge of the solar cell module 10-1 is slipped into the module holding receptacle 65 from the ridge side.

Figure 36:
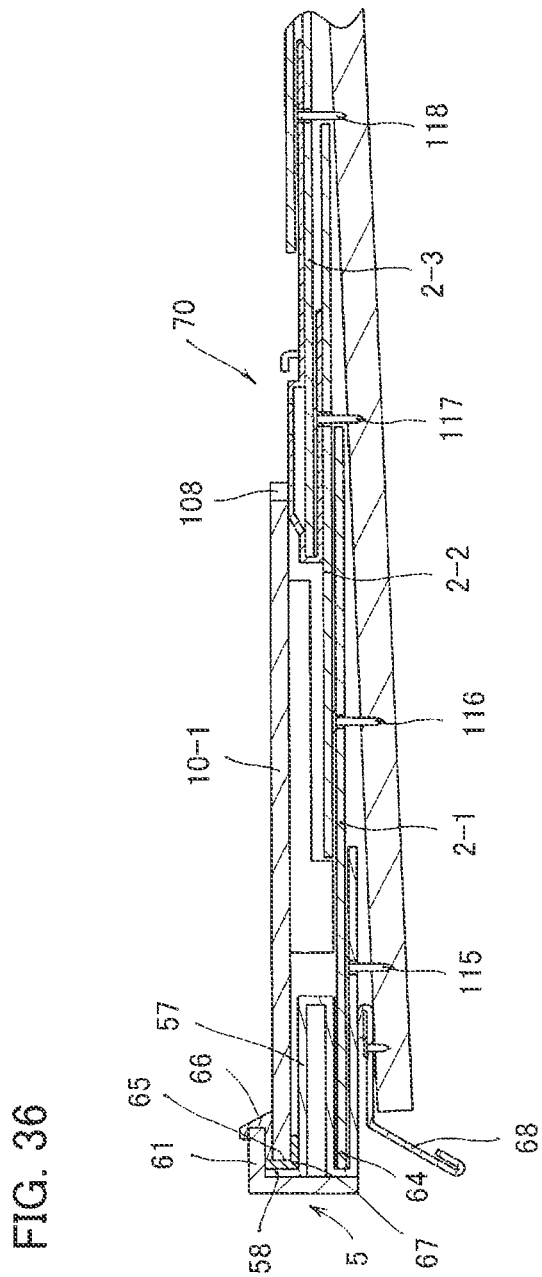
FIG. 36 is a cross section of the roof structure showing a process following FIG. 35.

On the other hand, the ridge-side edge (side from which the cables are extracted) of the solar cell module 10-1 is, as shown in FIG. 36, placed on the front part of the central area B of the holding-part composing member 70 attached to the slate tile 2-2 of the second row.

Figure 37:
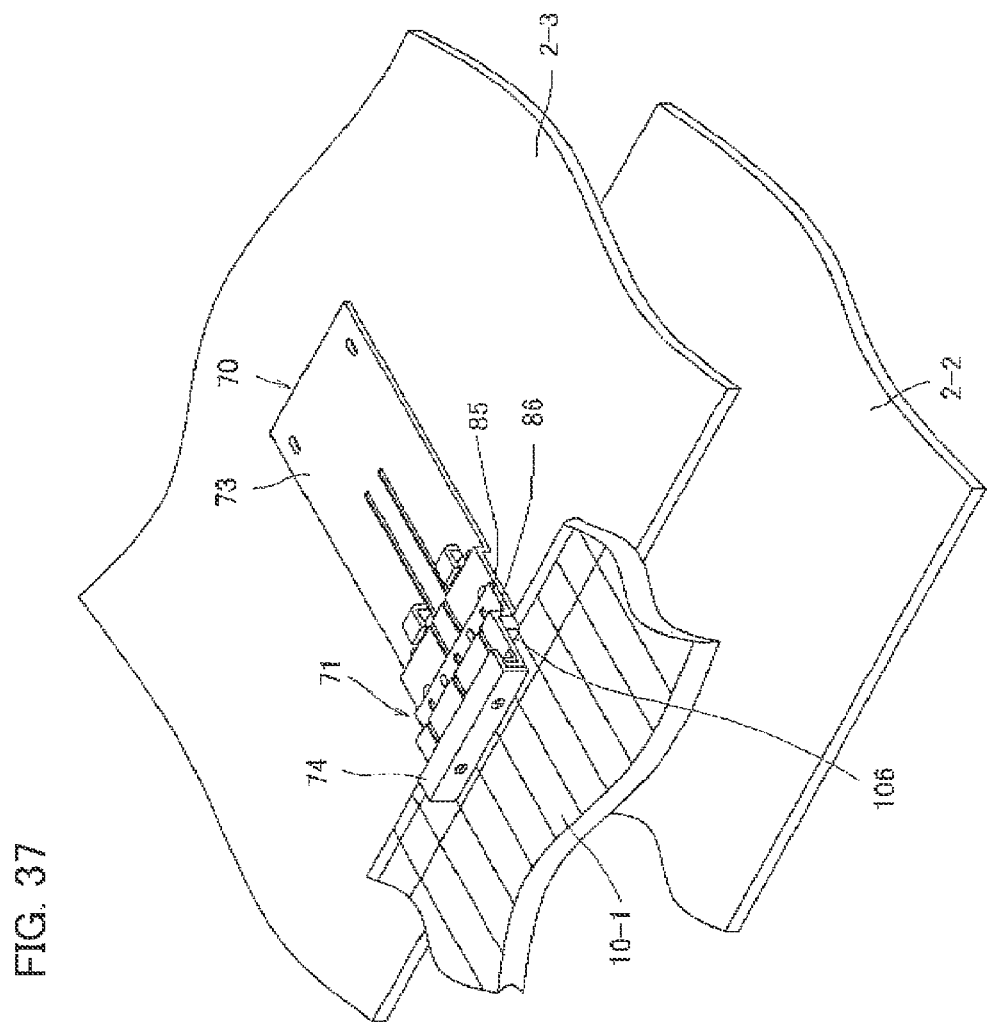
FIG. 37 is a perspective view showing a state with an intermediate plate (including a holding plate) attached to the holding-part composing members of the first row so as to hold a ridge-side edge of the solar cell module.

Then, with the ridge-side edge of the solar cell module 10-1 placed on the front part of the central area B, the intermediate plate 71 and the holding plate 74 are attached to the holding-part composing member 70. In actuality, the intermediate plate 71 and the holding plate 74 have been integrated in advance, so as to be attached to the holding-part composing member 70 (FIG. 37).

More practically, with the screws 91*a*, 91*b* loosely engaged with the female screw holes 84*a*, 84*b* of the holding-part composing member 70 and with the first flat plate 85 of the intermediate plate 71 placed over the area B of the holding-part composing member 70, the intermediate plate 71 is slid to the eaves side. Thereby, the heads of the screws 91*a*, 91*b* are made to pass through the elongated-hole continuations 90 formed on the wall surface of the first step 86 until the screws 91*a*, 91*b* reach the elongated holes 89.

Then, the screws 91*a*, 91*b* are fastened. The solar cell module 10-1 is held at its surface by the rear surface of the intermediate plate 71. In other words, the attachment of the intermediate plate 71 and the holding plate 74 to the holding-part composing member 70 forms the second receptacle 106 defined by the area A of the upper plate 73 of the intermediate mounting bracket 6 and the intermediate plate 71 placed on the upper plate 73. The ridge-side edge of the solar cell module 10-1 is engaged with the second receptacle 106.

Figure 38:
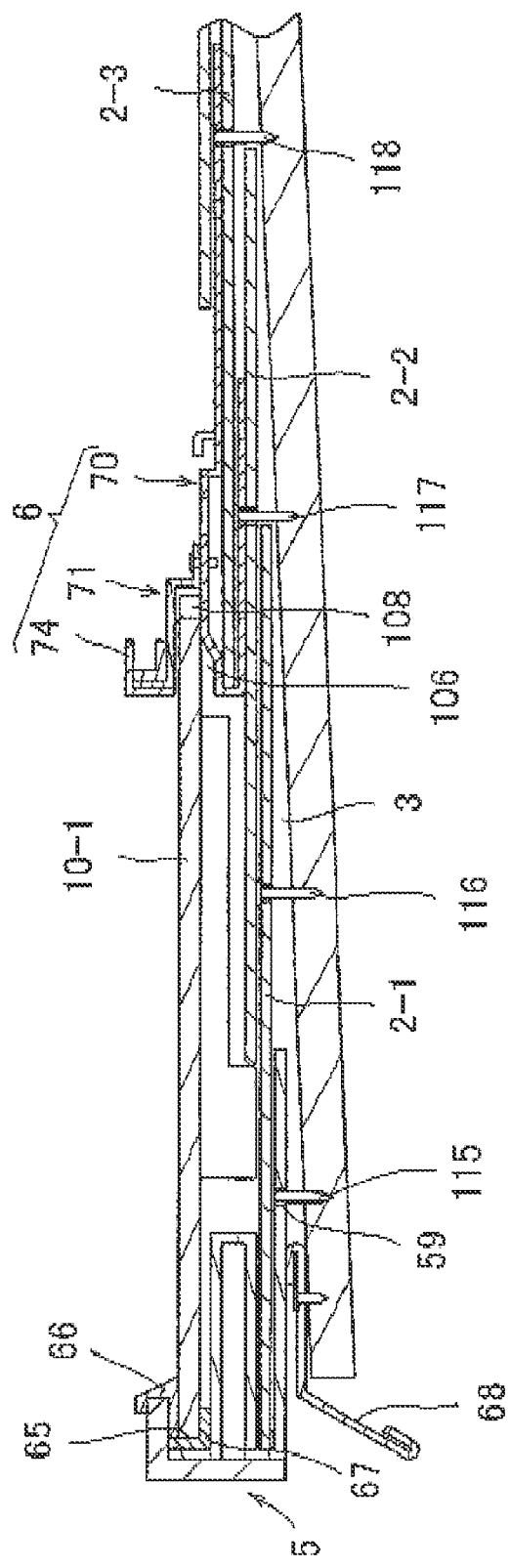
FIG. 38 is a cross section showing a state with the intermediate plate (including the holding plate) attached to the holding-part composing members of the first row in FIG. 36.

In this state, the solar cell module 10-1, as shown in FIG. 38, avoids being disengaged with the fundamental roof structure 3 with its opposed edges held, as its eaves-side edge is engaged with the module holding receptacle 65 of the eaves-side mounting bracket 5 and its ridge-side edge is engaged with the second receptacle 106 of the intermediate mounting bracket 6.

Further, the cover 66 and the protector 67 are attached to the module holding receptacle 65, with which the eaves-side edge is engaged, thereby protecting the eaves side of the solar cell modules 10-1 from being damaged and shaking.

Similarly, the elastomeric foam 108 and the sealing member 109 are attached to the second receptacle 106 of the intermediate mounting bracket 6, thereby protecting the ridge side of the solar cell module 10-1 from being damaged and shaking.

Upon mounting of the solar cell modules 10-1 of the first row in this way, the cable wiring between adjacent solar cell modules is performed.

Specifically, the first cable 16 and the second cable 18 of the adjacent solar cell modules 10-1 are connected.

Herein, in the solar cell module 10 in this embodiment, the first cable 16 is formed shorter than the second cable 18 as described above. Thus, in the solar cell module 10, a worker can determine in a moment whether the connector attached to the cable is the first connector 20 or the second connector 22 by confirming the length of the cable in issue.

Further, in the present embodiment, since the cables 16 and 18 are extracted from the longer edge 150 of the solar cell module 10 near the ridge side, the connection work of the connectors 20, 22 can be done at the outer and upper side of the solar cell module 10. When the solar cell module 10 of the upper row is arranged, the wired cables 16 and 18 (including the connectors 20, 22) are housed in the wiring storage space 41 of the solar cell module 10 of the upper row.

Herein, in this embodiment, the intermediate mounting bracket 6 has the hooks 77, into which the wired cables are put, and whereby the cables are easily treated.

Figure 39:
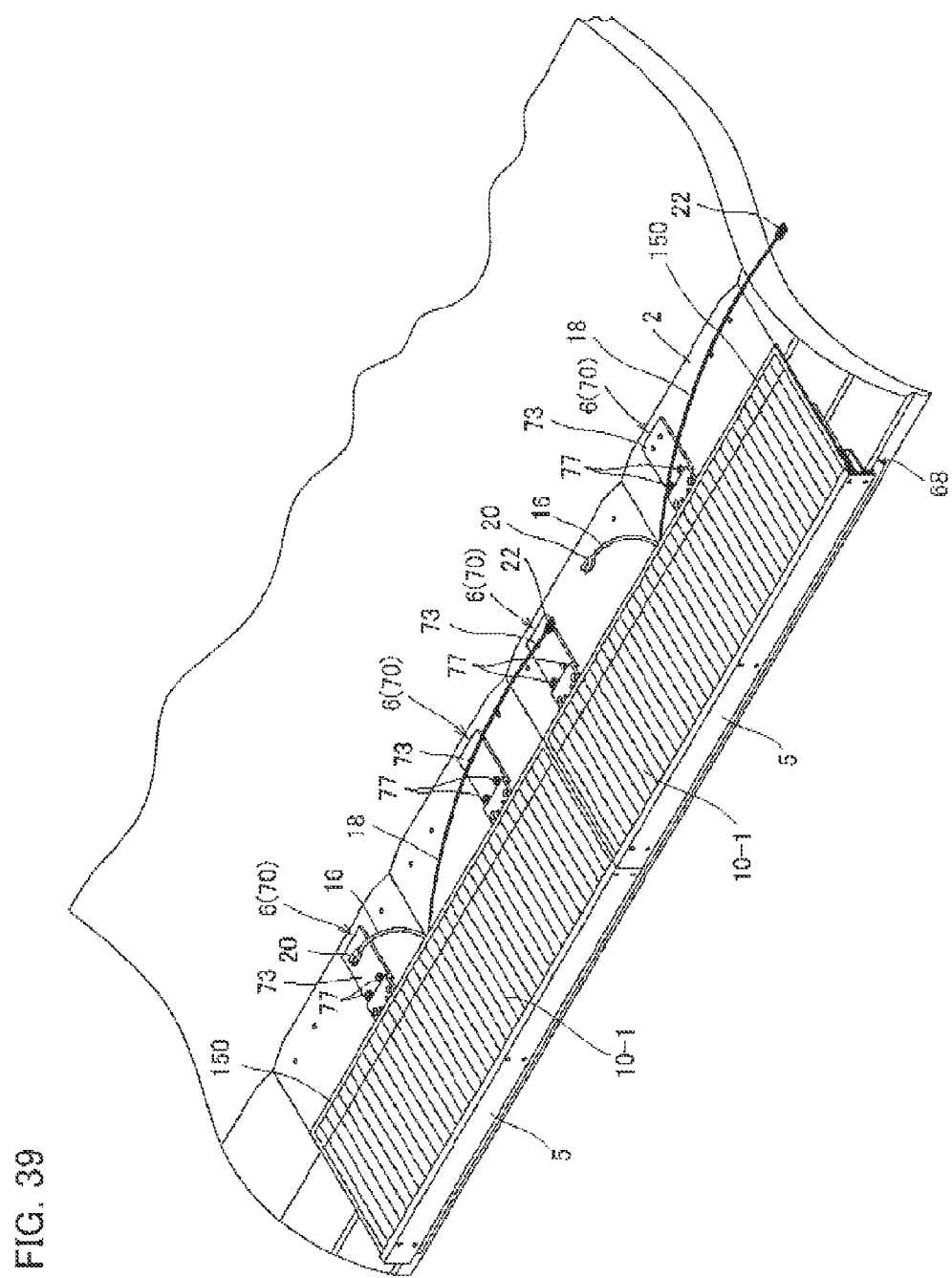
FIG. 39 is a perspective view showing a state with the solar cell modules of the first row mounted.

As shown in FIG. 39, when the solar cell modules 10-1 of the first row have been arranged, the slate tiles 2 of the upper row are still exposed and the hooks 77 disposed at the upper plates 73 of the intermediate mounting brackets 6 are exposed outside.

Figure 40:
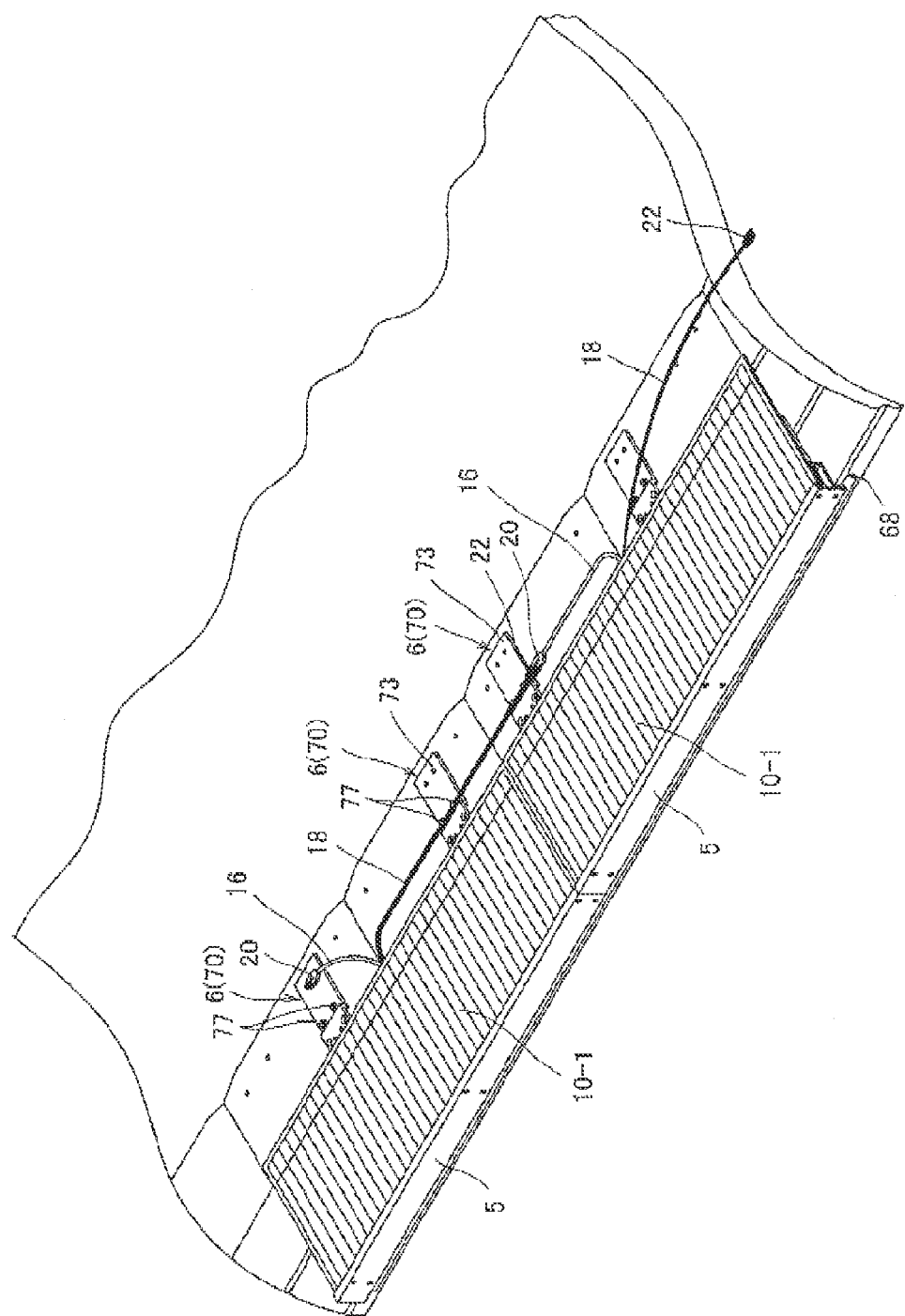
FIG. 40 is a perspective view showing a state of mounting and cabling of the solar cell modules of the first row.
Figure 41:
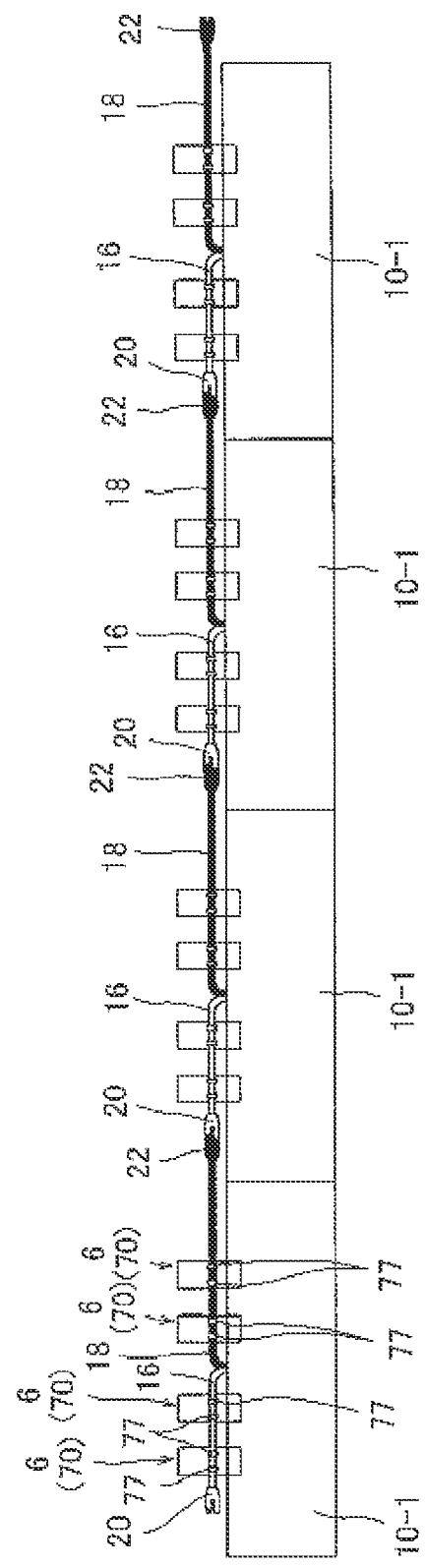
FIG. 41 is a plan view showing a state of mounting and cabling of the solar cell modules of the first row.

Therefore, the cables connected as shown in FIGS. 40, 41 are easily put into the hooks 77. The cables are positioned by being put in the hooks 77, so as to be prevented from deviating from the hooks 77 toward the ridge.

Subsequently, the solar cell modules 10-2 of the second row are arranged.

Figure 42:
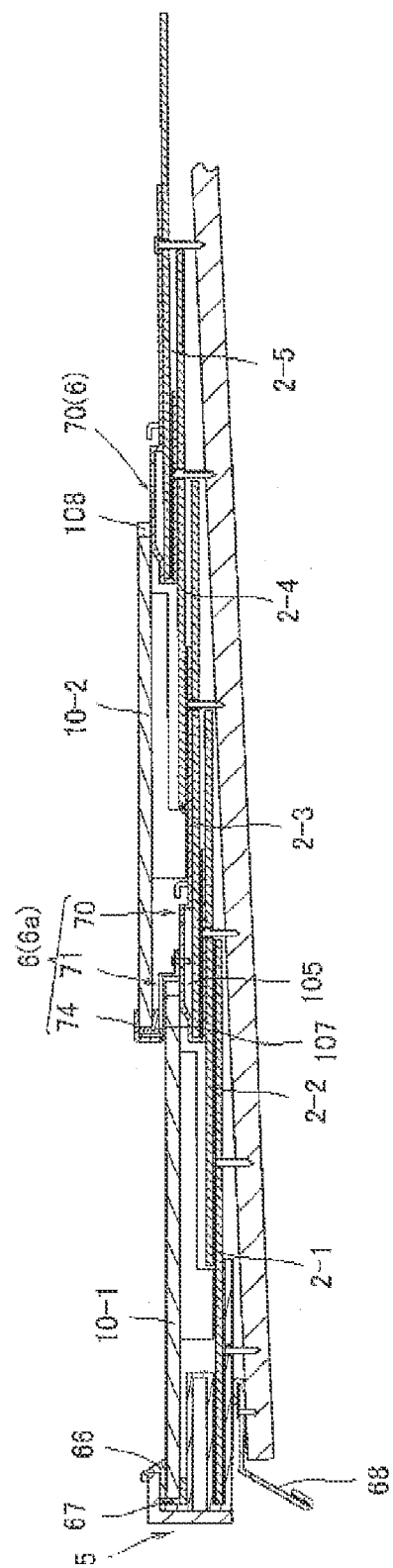
FIG. 42 is a cross section of the roof structure with the solar cell modules of a second row mounted so that the solar cell modules of the second row are put over the cables.
Figure 43:
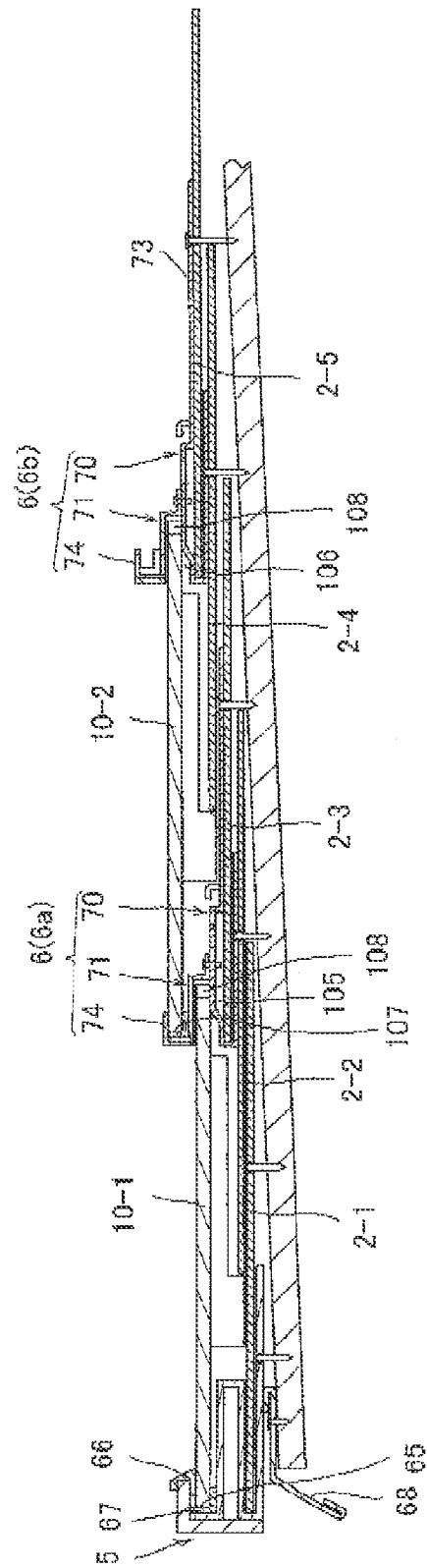
FIG. 43 is a cross section showing the roof structure with an intermediate plate (including a holding plate) of a second row attached to a holding-part composing member of a second row so that ridge-side edges of the solar cell modules of the second row are held.

As shown in FIGS. 42 and 43, each solar cell module 10-2 of the second row is arranged between the intermediate mounting brackets 6. As described above, the intermediate mounting brackets 6 are attached at every two slate tiles 2.

The solar cell module 10-2 of the second row is fixed to the intermediate mounting bracket 6 holding the previous ridge-side edge of the solar cell module 10-1 (hereinafter referred to as a lower intermediate mounting bracket 6*a*) and the intermediate mounting bracket 6 (hereinafter referred to as an upper intermediate mounting bracket 6*b*) attached at its upper side.

Specifically, the solar cell module 10-2 of the second row is engaged with the third receptacle (module holding portion) 107 of the lower intermediate mounting bracket 6*a* at its eaves-side edge. More specifically, the lower intermediate mounting bracket 6*a* has the third receptacle 107 defined by a part of the intermediate plate 71 and the holding plate 74. The third receptacle 107 opens in the same direction as that of the first receptacle 105, that is, toward the ridge.

Therefore, the eaves-side edge of the solar cell module 10-2 is slipped into the third receptacle 107 of the lower intermediate mounting bracket 6*a* from the ridge side, and whereby the solar cell module 10-2 is engaged with the third receptacle 107 of the lower intermediate mounting bracket 6*a* at its eaves-side edge.

The third receptacle 107 of the lower intermediate mounting bracket 6*a* is located in the central area B of the upper plate 73, or the upper portion. Thus, the eaves-side edge of the solar cell module 10-2 of the second row overlaps the ridge-side edge of the solar cell module 10-1 of the first row.

On the other hand, the ridge-side edge (the side from which the cables are extracted) of the solar cell module 10-2, similarly to the solar cell module 10-1 of the first row, is placed on the front part of the central area B of the above-located holding-part composing member 70 attached to the slate tile 2-4 of the fourth row (FIG. 42).

Then, with the ridge-side edge of the solar cell module 10-2 placed on the central area B, the intermediate plate 71 and the holding plate 74 is attached to the holding-part composing member 70, so that the rear surface of the intermediate plate 71 presses the ridge-side edge. That forms the second receptacle 106 defined by the front end area A and the central area B of the upper plate 73 of the upper intermediate mounting bracket 6*b* and the intermediate plate 71 placed on the upper plate 73. With the second receptacle 106 the solar cell module 10-2 is engaged at its ridge-side edge, so as to be held at its opposed sides. That avoids the solar cell module 10-2 from being disengaged with the fundamental roof structure.

Further, the sealing member 110 (omitted in FIGS. 42 and 43 for convenience of drawing, see FIGS. 10 and 14) is attached to the third receptacle 107, with which the eaves-side edge of the solar cell module 10-2 is engaged, thereby protecting the eaves-side edge of the solar cell module 10-2 from being damaged and shaking.

Similarly, the elastomeric foam 108 and the sealing member 109 are attached to the second receptacle 106 of the upper intermediate mounting bracket 6b, thereby protecting the ridge-side edge of the solar cell module 10-2 from being damaged and shaking.

Figure 44:
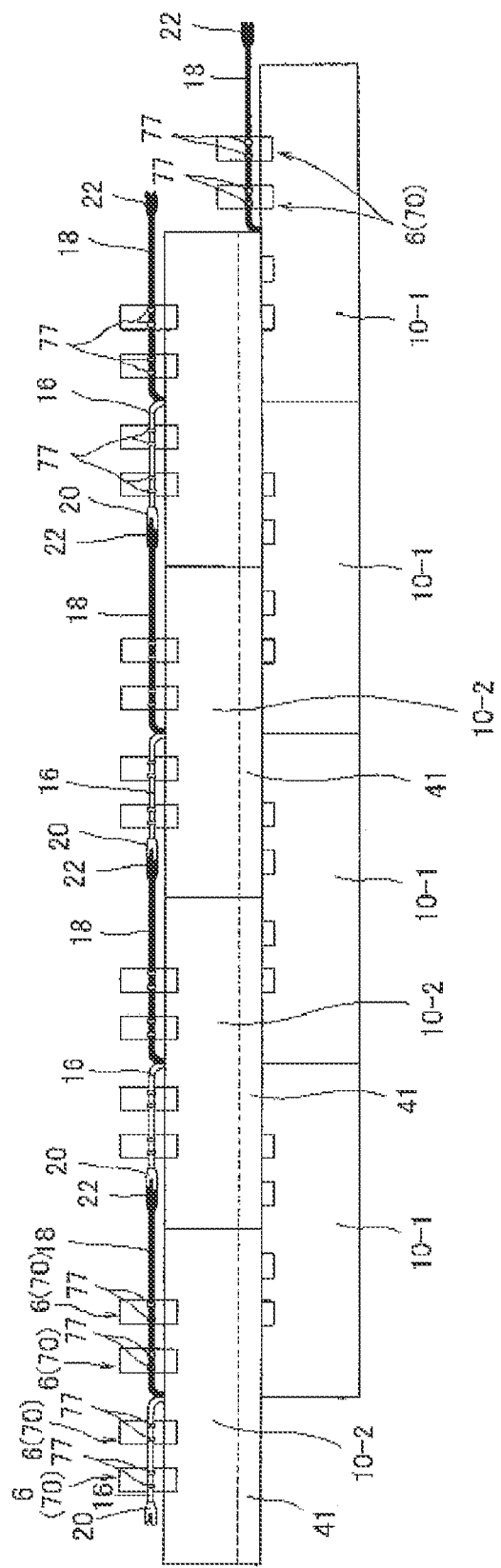
FIG. 44 is a plan view showing a state of cabling of the solar cell modules of the second row.

Referring to FIG. 44, the previously-wired cables 16 and 18 of the solar cell modules 10-1 of the first row are put in the hooks 77 formed in the upper plate 73 of the lower intermediate mounting bracket 6a, being housed in the wiring storage space 41 at the back of the solar cell module.

Specifically, as described above, the solar cell module 10 has the heat-insulating and reinforcing member 23 at its back, but no heat-insulating and reinforcing member 23 adjacent to its eaves-side edge, having a predetermined space. In this embodiment, the cables are put in the hooks 77 projecting from the vicinity of the fundamental roof structure, so as to be prevented from deviating excessively to the ridge. Therefore, when the solar cell module 10-2 of the second row is arranged, the heat-insulating and reinforcing member 23 of the solar cell module 10-2 of the second row is prevented from compressing the cables of the solar cell module 10-1 of the first row.

Figure 45:
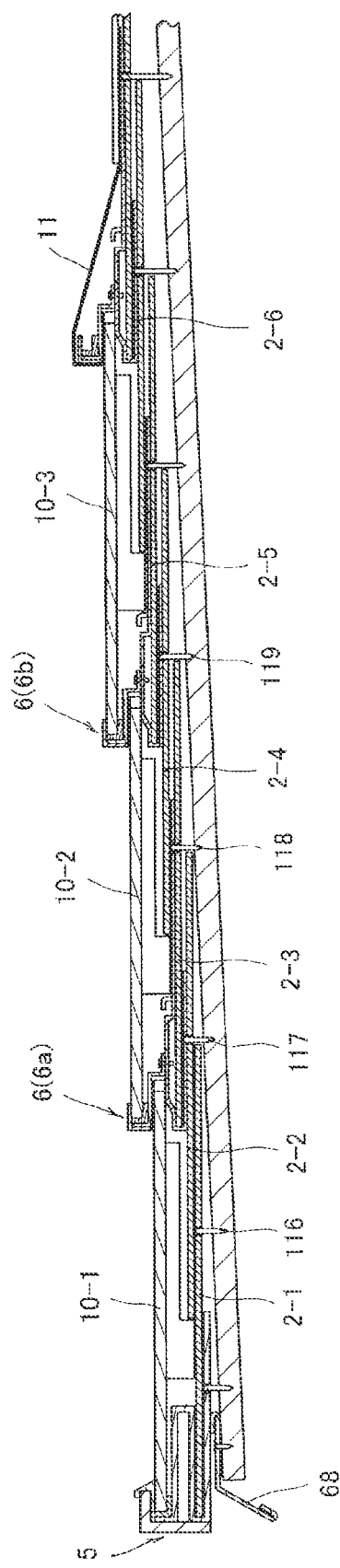
FIG. 45 is a cross section showing a state with flashing boards attached to ridge sides of the solar cell modules of the third row.

Upon completion of the arrangement of all the solar cell modules 10-2 of the second row in this way, the cables are wired similarly to the foregoing case and put in the hooks 77. Then, the solar cell modules 10-3 of the third row are further arranged. The solar cell modules 10 are sequentially arranged in this manner. Upon completion of the arrangement of the predetermined number of rows, the flashing boards 11 are attached to the ridge-side edges of the solar cell modules 10 of the top row, and whereby the work is accomplished (FIG. 45).

In case of the roof structure 1 suffering from rain, most of rainwater flows on the solar cell modules 10 to the eaves, and then falls from the eaves.

Though some rainwater enters under the solar cell modules 10, the slate tiles 2 are arranged below the solar cell modules 10, thereby preventing rainwater from seeping into the building. Further, every above-located slate tile 2 covers all the attaching holes of the intermediate mounting brackets 6, thereby keeping the attaching holes from water rain seepage.

The description will be made, making reference to FIG. 29, of the roof member (slate tile 2-3) whose eaves-side edge is inserted into the first receptacle 105 of the intermediate mounting bracket referred to as a "specific roof member," the roof member (slate tile 2-2) located under the lower plate 72 of the intermediate mounting bracket 6 and placed under the "specific roof member" referred to as an "underlying roof member," and the roof member (slate tile 2-4) overlapping the "specific roof member" with a free eaves-side edge located on the "specific roof member" referred to as an "overlying roof member."

The intermediate mounting bracket 6 is attached to the end part of the "specific roof member" with its lower plate 72 arranged between the "specific roof member" and the "underlying roof member." The screw or the like (fastening element) 117 is inserted into the hole 100 (either one of the holes 100a, 100b) of the lower plate 72 and further into the attaching hole 12 of the "underlying roof member," thereby fixing the lower plate 72 of the intermediate mounting bracket 6 to the roof.

As described above, the roof members (slate tiles 2) are arranged outspread planarly in a row to form a plurality of rows like fish scales, and are each partly overlapped by the adjacent roof member (slate tile 2) and partly exposed (see FIG. 32), so that the "specific roof member" is placed on the "underlying roof member" into which the screw or the like (fastening element) 117 is driven. Therefore, the "specific roof member" covers the attaching holes 12 of the "underlying roof member," thereby protecting the attaching holes 12 from rainwater seepage.

Further, the upper plate 73 overlaps the "specific roof member" with the screw or the like (fastening element) 118 inserted into the attaching hole 80 (either one of the attaching holes 80a, 80b) of the upper plate 73 and further into the attaching hole 12 of the "specific roof member," the screw or the like (fastening element) 118 fixing the upper plate 73 of the intermediate mounting bracket 6 to the base roof structure.

Further, the "overlying roof member" is placed over the "specific roof member" into which the screw or the like 118 is inserted, so as to cover the attaching holes of the "specific roof member," thereby protecting the attaching holes 12 from rainwater seepage.

The same can be said of the attaching holes 59 of the eaves-side mounting bracket 5, so that the slate tiles 2-1 of the first row cover those, thereby protecting the attaching holes 59 from rainwater seepage (FIG. 19).

Figure 47:
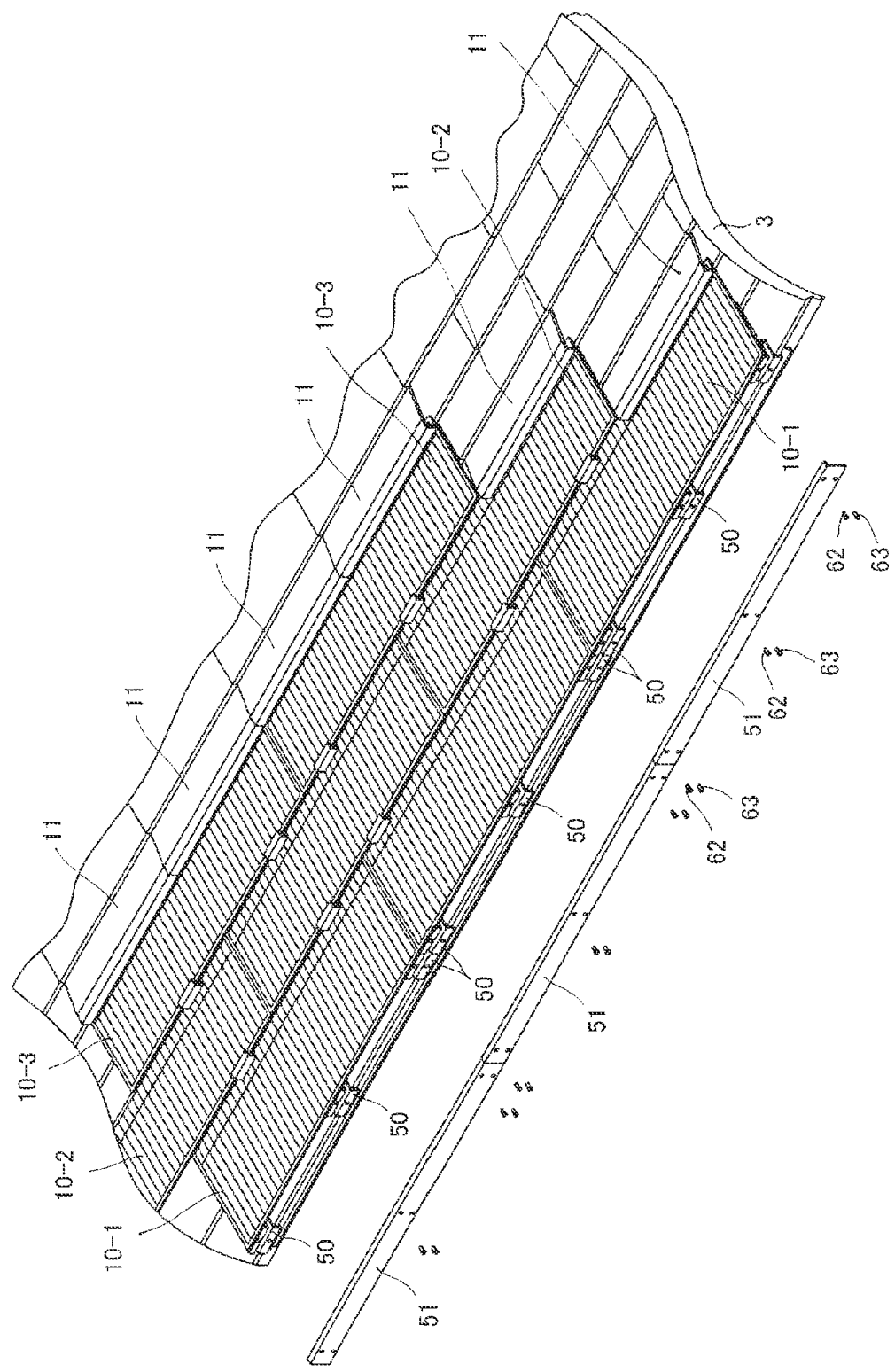
FIG. 47 is a perspective view in detaching connecting pieces from the state in FIG. 1.

Therefore, rainwater entering under the solar cell modules 10, flows on the slate tiles 2, and then reaches the eaves. Herein, the fixing pieces 50 of the eaves-side mounting bracket 5 are attached at appropriate intervals, so that large gaps are formed between adjacent fixing pieces 50. Thus, the rainwater falls under the eaves through the gaps (FIG. 47).

Consequently, rainwater will never remain in the roof.

In terms of how the slate tiles 2 overlap in the present embodiment, it can be said that the terminal box 14 in the back of each solar cell module 10 is positioned ideally.

Figure 46:
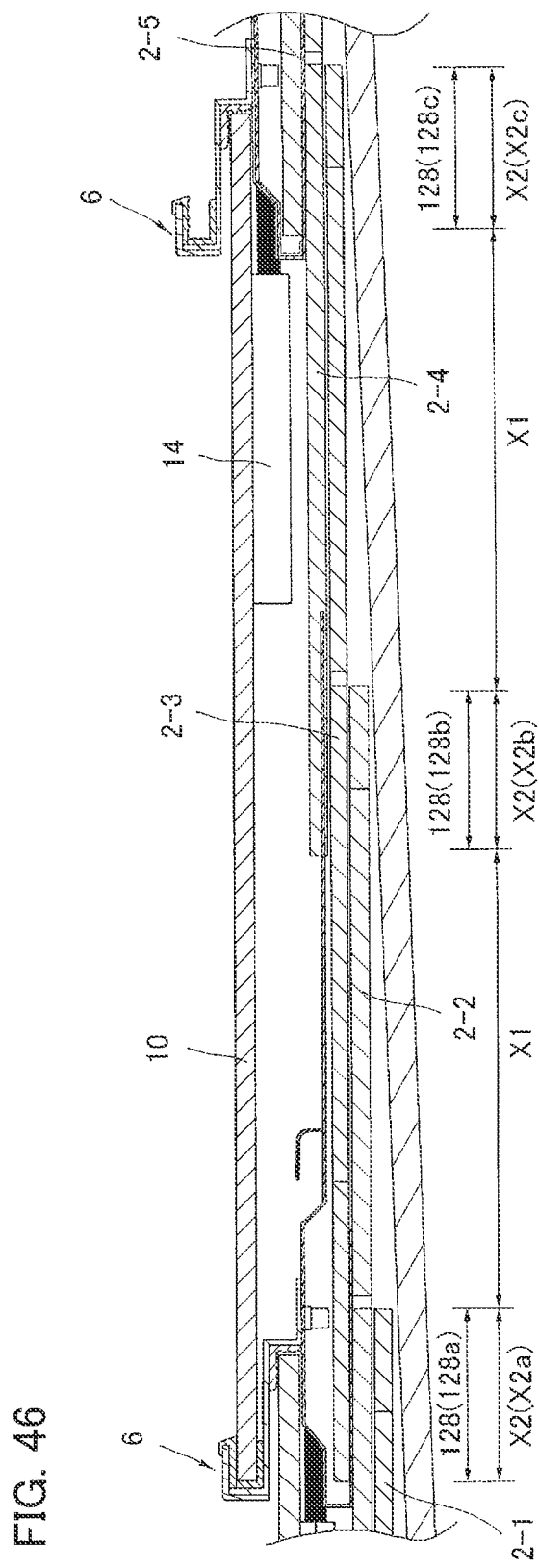
FIG. 46 is a cross section showing a state with the solar cell modules mounted on the roof structure.

As described above, the slate tiles 2 overlap in each row by 50% or more of the length of the slate tile 2 in the shorter direction. Referring to FIG. 46, there are portions X1 where two slate tiles 2 overlap and portions X2 where three slate tiles overlap on the roof base.

More specifically, each slate tile 2 is exposed at its eaves-side distal end portion 128, which is always situated in the portion X2 (The eaves-side distal end portion 128 of the slate tile 2-3 is situated in the portion X2a, for example). The three depicted eaves-side distal end portions of the slate tiles are labeled 128a, 128b, and 128c, respectively. In contrast, another portion of each slate tile 2 beyond the portion 128 (toward the eaves) is situated in the portion X1.

Thus, as to the height projecting upward from the roof base, the portion (X2) where three slate tiles 2 overlap projects largely, while the portion (X1) where two slate tiles 2 overlap projects a little. In other words, the fundamental roof structure 3 has a patterned indented surface, being most convex at the eaves-side distal end portion 128 of each slate tile 2 and being most concave therebeyond.

On the other hand, the overlapped solar cell modules 10 each are of a plate-like shape. Further, the solar cell modules 10 each have a length in the shorter direction longer than that of the slate tile 2, so as to be arranged over the exposed parts of two slate tiles 2 (slate tiles 2-3, 2-4).

Thus, a gap between the solar cell module 10 and the surface of the slate tile 2 varies with location, the portion (X1) where two slate tiles 2 overlap having a large gap and the portion (X2) where three slate tiles 2 overlap having a small gap.

Figure 5:
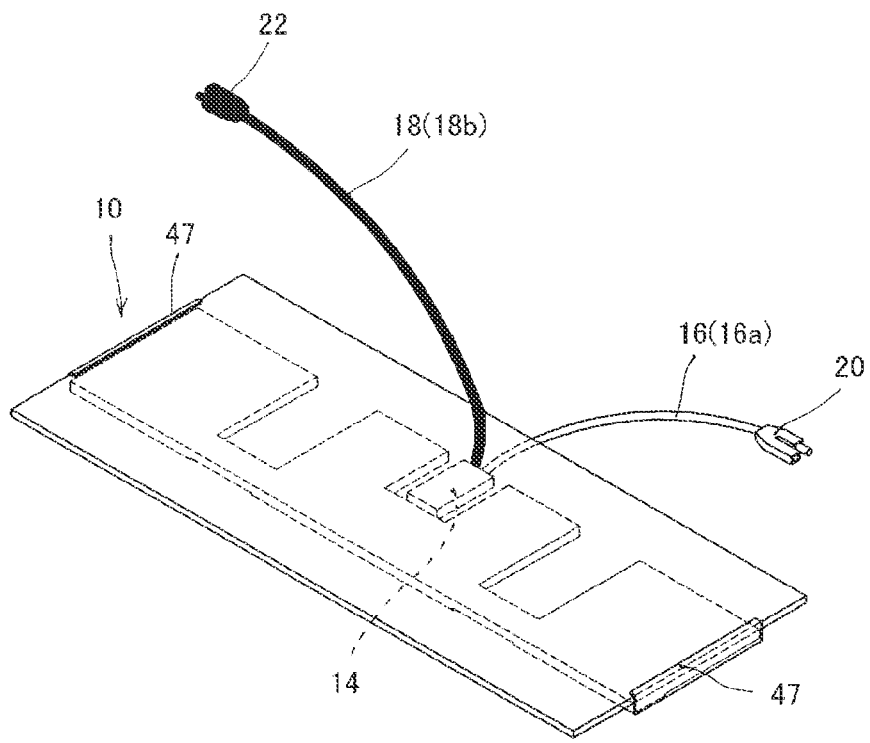
FIG. 5 is a perspective view of the solar cell module in FIG. 3A seen from the front, showing a back structure by dashed lines.
Figure 6:
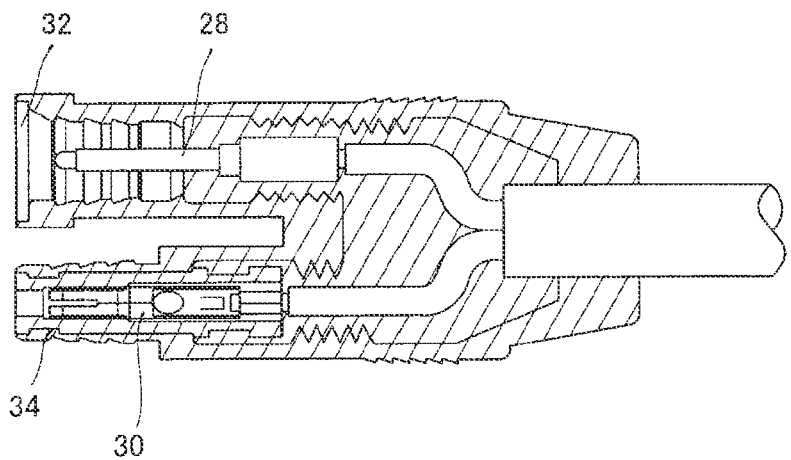
FIG. 6 is a cross section of the connector of the solar cell module in FIGS. 3B and 3C.

In this embodiment, the terminal box 14 is fixed to the back of the solar cell module 10 with a glue or the like in substantially the central part of the longer edge of and near the upper part of the solar cell module 10 (FIG. 5)

The solar cell module 10 is held at its upper edge by the intermediate mounting bracket 6 attached to the distal end of the slate tile 2-4, so that the upper edge of the solar cell module 10 is situated at the portion (X2c) where three slate tiles overlap. Consequently, the upper edge of the solar cell module 10 is situated at the portion with the smallest gap between that and the surface of the slate tile.

The solar cell module 10 is also held at its lower edge by the intermediate mounting bracket 6, so that the lower edge of the solar cell module 10 is also situated at the portion (X2a) where three slate tiles overlap. Consequently, the lower edge of the solar cell module 10 is situated at the portion with the smallest gap between that and the surface of the slate tile.

In this embodiment, the solar cell module 10 is arranged over the exposed parts of two slate tiles 2-3, 2-4, so that the distal end of the slate tile 2-4 also lies just under the solar cell module 10. Consequently, the central part of the solar cell module in the shorter direction is situated at the portion (X2b) where three slate tiles overlap. Therefore, the central part of the solar cell module 10 is also situated at the portion with the smallest gap between that and the surface of the slate tile.

In contrast, other portions than the portions adjacent to the upper and lower edges and to the central part are situated at the portions (X1) where two slate tiles overlap, having large gaps between the back of the solar cell module 10 and the surfaces of the slate tiles.

In this embodiment, the terminal box 14 is situated at the portion having the large gap.

In sum, the terminal box 14 of the solar cell module is, as shown in FIG. 5, attached to a position in the substantially center of the longer edge of the solar cell panel 13, adjacent to the upper edge, and slightly inside of the upper edge.

This position is located at the portion (X1) where two slate tiles overlap with a large gap between the back of the solar cell module 10 and the surface of the slate tile.

Therefore, according to the present embodiment, a height of the solar cell modules 10 at its surface is made close to a height of the slate tiles (base) at its surface, which achieves a sense of unity of the solar cell modules 10 with the slated base roof.

Consequently, the roof structure in the present embodiment is beautiful in appearance.

In other words, the solar cell modules 10 employed in the present embodiment are thin, thereby easily bringing a sense of unity with other portions of the roof in being arranged on the roof.

Now, a procedure for maintenance of the roof structure 1 in the present embodiment will be described below.

In case of failure of one of the solar cell modules 10 for some reason, one of the solar cell modules 10 needs to be replaced. In the roof structure 1 in the present embodiment, any solar cell module 10 at a discretionary position can be demounted without difficulty.

In case of failure of one solar cell module 10 of the first row, for example, the connecting pieces 51 of the eaves-side mounting brackets 5 are detached as shown in FIG. 47. As described above, the connecting pieces 51 are attached to the fixing pieces 50 with the screws 62, 63. The screws 62, 63 are unscrewed, so that only the connecting pieces 51 are detached with the fixing pieces 50 remaining on the fundamental roof structure 3, as shown in FIG. 47.

Detachment of the connecting pieces 51 takes off upper sides of the module holding receptacles 65 (see FIG. 9, etc.), thereby demounting the solar cell module.

Figure 48:
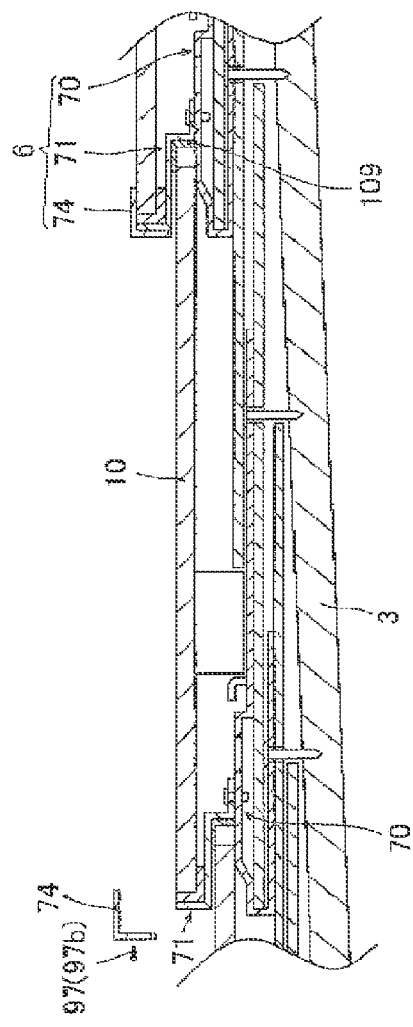
FIG. 48 is a cross section in detaching the solar cell modules from the state in FIG. 45.
Figure 49:
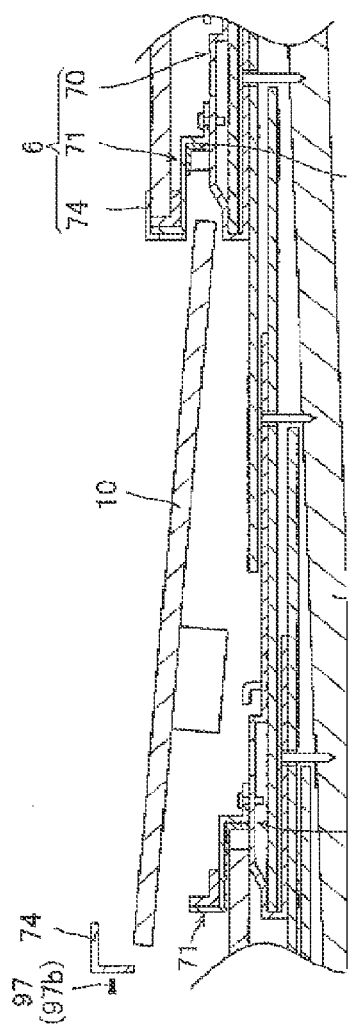
FIG. 49 is a cross section showing a process following FIG. 48.

In case of failure of one solar cell module 10 of one row following the second row, the holding plates 74 of the intermediate mounting brackets 6 are detached, as shown in FIGS. 48 and 49. As described above, the holding plates 74 are attached to the intermediate plates 71 with the screws 97a, 97b. The screws 97a, 97b are unscrewed, so that only the holding plates 74 are detached, with the intermediate plates 71 remaining on the fundamental roof structure 3, as shown in FIG. 48.

Detachment of the holding plates 74 takes off upper sides of the third receptacles 107, thereby demounting the solar cell module 10 upward, as shown in FIG. 49.

The intermediate mounting bracket 6 employed in the present embodiment is designed for the purpose of being attached to a roof in construction of the fundamental roof structure 3, as described above, but also of being attachable on the existing roof.

In the intermediate mounting bracket 6 employed in the present embodiment, the lower plate 72 has the holes 100, 101 in two rows and two columns as described above (see FIGS. 11, 12, and 13). As previously mentioned, the intermediate mounting bracket 6 is attached by using the two holes 100a, 100b, which are formed near the forward end (near the erecting portion 75) among the four holes 100a, 100b, 101a, 101b in total in two rows and two columns, and the attaching holes 80a, 80b, which are formed near the rear end (farther from the erecting portion 75) of the upper plate 73.

In contrast, in a case of attachment of the intermediate mounting bracket 6 to the existing roof, the two holes 101a, 101b near the rear end among the four holes 100a, 100b, 101a, 101b, which are formed in two rows and two columns in the lower plate 72, are used without using the attaching holes 80a, 80b near the rear end.

Now, a method of attachment of the intermediate mounting brackets 6 to the existing roof will be described below.

In the existing roof, slate tiles 2 or the like have been arranged outspread planarly in a row to form a plurality of rows on a roof base, each of these being partly overlapped by the adjacent roof member and exposed at a remaining part, like fish scales.

Figure 50:
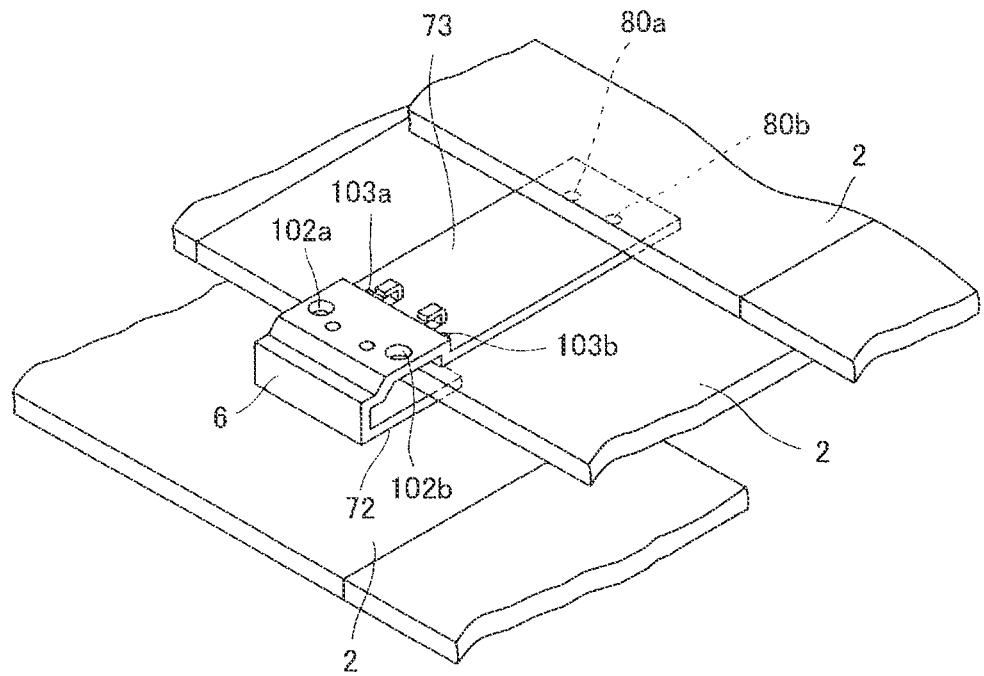
FIG. 50 is a perspective view in attaching the holding-part composing members to an existing roof structure.

In attachment of the intermediate mounting bracket 6 to the completed roof in this way, the lower plate 72 of the intermediate mounting bracket 6 is inserted into an overlapping part of the slate tiles 2, as shown in FIG. 50.

Figure 51:
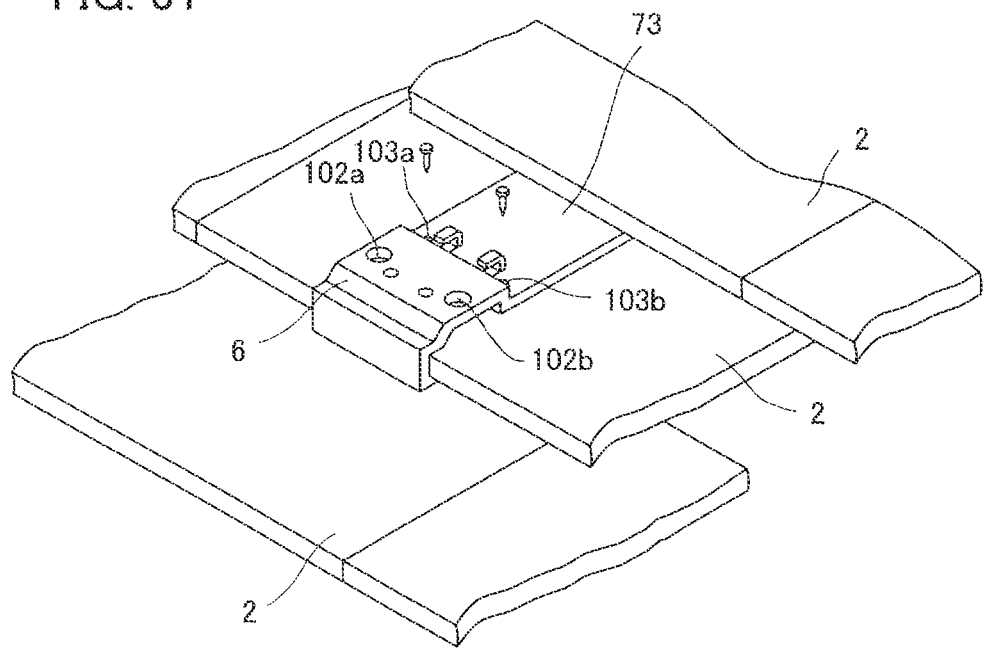
FIG. 51 is a perspective view showing a process following FIG. 50.

That makes the lower plate 72 of the intermediate mounting bracket 6 to slip under a specific slate tile 2 as shown in FIG. 51 and thus to be invisible externally. On the other hand, the upper plate 73 is exposed on the specific slate tile 2 at its forward part and slipped under a tile overlapping the specific slate tile 2 at its rear part.

Consequently, among the six holes 102a, 102b, 103a, 103b, 80a, 80b formed in the upper plate 73, the attaching holes 80a, 80b near the rear end are covered with the slate tile 2, but 102a, 102b, 103a, 103b formed in two rows and two columns in the forward part are exposed outside.

Then, the holes 103a, 103b near the rear end among the exposed holes 102a, 102b, 103a, 103b in two rows and two columns are used for the attachment of the intermediate mounting bracket 6 to the existing roof. Specifically, fastening elements such as screws or nails are directly inserted into the holes 103a, 103b. Naturally, prepared holes may be drilled if needed.

When the screws or nails are driven in the holes 103a, 103b, the tips of those penetrate through the slate tile 2 into the lower plate 72 of the intermediate mounting bracket 6.

Herein, in the intermediate mounting bracket 6 employed in the present embodiment, the lower plate 72 just below the holes 103a, 103b formed in the upper plate 73 has the holes 101a, 101b (see FIG. 13). Therefore, when the nails or the like are driven from the upper plate 73, the tips of the nails or the like penetrate through the holes 101a, 101b of the lower plate 72 way down, so as to be engaged with the roof base. That ensures a stiff attachment of the intermediate mounting bracket 6.

Figure 52A:
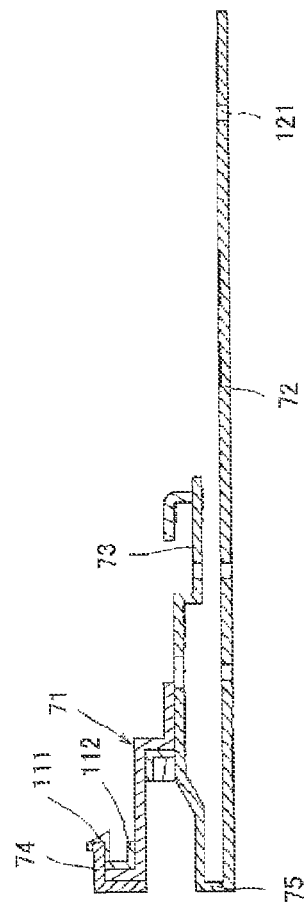
FIGS. 52A and 52B each are a cross section of an intermediate mounting bracket of another embodiment from that in FIG. 10, FIG. 52A showing an intermediate mounting bracket with a lower plate longer than an upper plate and FIG. 52B showing an intermediate mounting bracket with a lower plate and an upper plate having the same length.
Figure 52B:
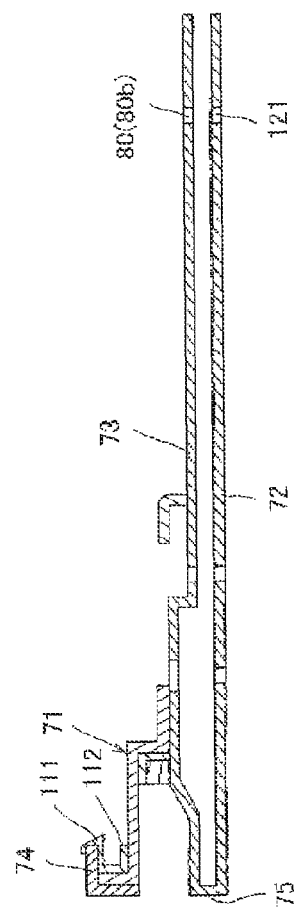

In the illustration of the embodiment described above, the intermediate mounting bracket 6 has the upper plate 73 longer than the lower plate 72, but may have those with the same length as shown in FIG. 52B. In employment of such a configuration, the lower plate 72 needs to have holes 121 just below the attaching holes 80a, 80b near the rear end of the upper plate 73. Further, as shown in FIG. 52A, the lower plate 72 may be longer. In employment of such a configuration, the lower plate 72 needs to have holes 121 near its rear end.

In the above-mentioned embodiment, the solar cell module 10 has such a size as to be arranged over exposed parts of two slate tiles 2. However, the solar cell module 10 may have a discretionary size, and may have the same size as that of the slate tile 2 or such a size to be arranged over exposed parts of three slate tiles 2.

However, since the present embodiment has a basic configuration in which the solar cell modules 10 are attached to the intermediate mounting brackets 6 attached to the eaves-side edges of the slate tiles 2, the solar cell modules 10 each have such a length in the shorter direction as the length of the exposed parts of a plurality of slate tiles 2 and the length of the overlapping part of the solar cell modules 10 combined.

The solar cell module 10 in the above-mentioned embodiment has the dividing groove 21 crossing each unit solar cell 17 as a specific configuration (see FIG. 3). The area (area B) above the dividing groove 21 is not connected to the terminal box 14.

This configuration is recommended for a lengthy life of the solar cell modules 10. Specifically, the area B described above is a part that falls under shadow due to being covered with the solar cell module 10 of a ridge-side row, contributing to a lack of electric generation. Thus, no inconvenience is caused in employing a configuration such that the area (area B) above the dividing groove 21 provided in the solar cell module 10 is not connected to the terminal box 14.

This area forms a gap between the solar cell modules 10 as shown in FIG. 1, resulting in anticipating the possibility of unexpected failure caused by the entry of bugs, spiders, birds, and the like.

Specifically, in this embodiment, each solar cell module 10 is mounted via the intermediate mounting brackets 6. The intermediate mounting brackets 6 each have a certain amount of thickness, which inevitably forms a gap between the free eaves-side edge of each solar cell module 10 and the underlying solar cell module 10, resulting in letting bugs and the like invade into the gap. There is fear, for example, that bees or ants might invade, so as to build their nests.

Some fluids secreted by bugs, spiders, and the like cause unexpected negative effects over the years. Formic acid secreted by ants, for example, which is a strong acid, might corrode the solar cell modules 10 partly due to long-term contact therewith.

Furthermore, the area B falls under shadow due to being covered with the solar cell module 10 and is hidden from outside. That might allow mice to invade through a gap under the flashing board 11, for example, the mice gnawing the solar cell modules 10.

The area (area B) above the dividing groove 21 has a possibility of an unexpected short circuit, breaking of wire, or electric leakage. Additionally, since this area is invisible externally, it is difficult to identify the cause of failure in case of failure. That causes concerns over needing to replace all the solar cell modules 10 as a result.

Thus, in this embodiment, the area that falls under shadow due to being covered by the solar cell module 10 of the ridge-side row is electrically separated by the dividing groove 21, which addresses the concerns over these accidents.

The configuration provided with the dividing groove 21 crossing each unit solar cell 17 in this way is recommended, but is not essential in the present invention and may be employed at one's discretion.

Figure 53:
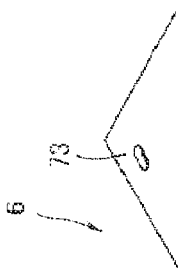
FIG. 53 is a perspective view of an intermediate mounting bracket provided with a holding plate other than that in FIG. 10.

In the above-mentioned embodiment, the holding plate 74 of the intermediate mounting bracket 6 is a member having an "L" shaped cross section, but is not limited thereto. It is possible to employ a holding plate 114 having a rectangular "U" shaped cross section, for example, as shown in FIG. 53. The holding plate may be appropriately modified in shape.

Figure 54:
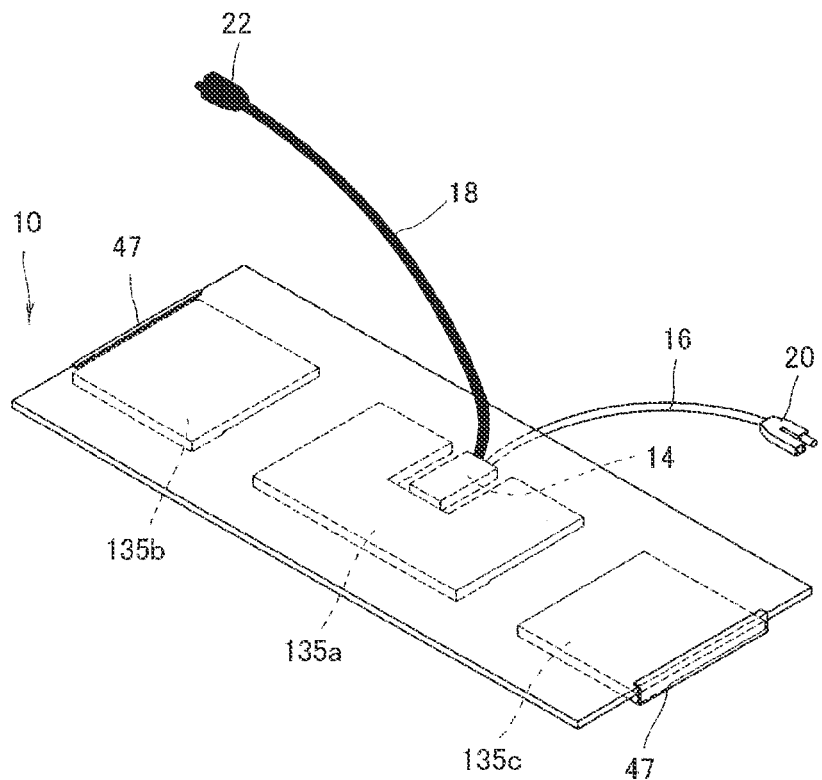
FIG. 54 is a perspective view of a solar cell module provided with a heat-insulating and reinforcing member other than that in FIG. 5, seen from the front and showing a back structure by dashed lines.

Further, in the above-mentioned embodiment, the solar cell module 10 is provided with the heat-insulating and reinforcing members 23 having trough-like portions 46, but the shape and the number of the heat-insulating and reinforcing members are not limited thereto. As shown in FIG. 54, for example, the solar cell module 10 may be provided with a heat-insulating and reinforcing member 135a of a rectangular "U" shape seen from the front at its central part and members 135b, 135c of a substantially square shape seen from the front at its both ends in the longer direction. The heat-insulating and reinforcing members may be modified in shape and number.

Furthermore, the above-mentioned embodiment illustrates that the solar cell module 10 is mounted to the fundamental roof structure 3 by using the two intermediate mounting brackets 6, but may be mounted by using more than two mounting brackets depending on the intervals of either two of the attaching holes 12 of the slate tile 2 or an amount of the overlapping part OW of the slate tiles 2.

Furthermore, the above-mentioned embodiment illustrates that the lower plate 72, which is a part of the holding-part composing member 70, is sandwiched between the slate tiles 2 overlapping in a step-like fashion, but the holding-part composing member 70 is not limited thereto in shape. The holding-part composing member 70 may be one plate so as to be entirely sandwiched between the overlapping part of the roof members.

Figure 55:
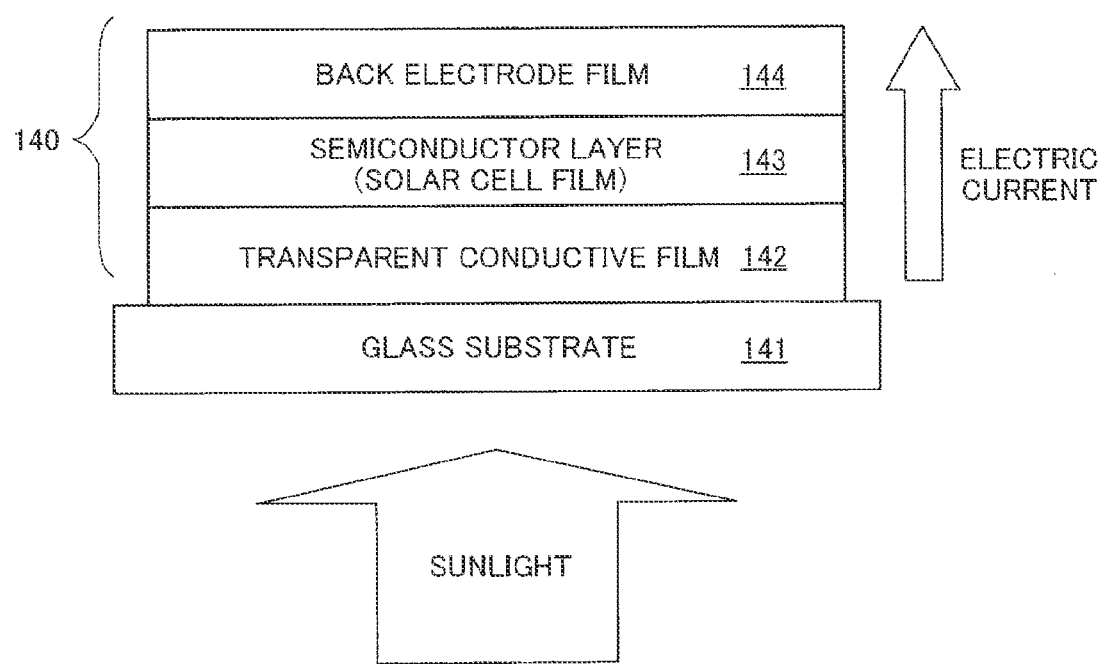
FIG. 55 is a representation conceptually explaining a layer structure of an integrated solar cell involved in a solar cell panel employed in the present embodiment.

Now, a cross-sectional structure of the unit solar cell 17 of the solar cell panel 13 in the above-mentioned embodiment will be described below. FIG. 55 shows one example of a conceptual diagram of a solar cell for simply explaining a layer structure of the solar cell panel 13.

The solar cell panel 13, as shown in FIG. 55, consists of a transparent conductive film 142, a semiconductor layer 143, and a back electrode film 144 sequentially laminated on a glass substrate 141. A potential difference occurs between the transparent conductive film 142 and the back electrode film 144. In short, the transparent conductive film 142, the semiconductor layer 143, and the back electrode film 144 constitute a solar cell 140.

However, a voltage generated by one solar cell 140 is extremely low, failing to reach a practical voltage by only one solar cell 140. Hence, the embodiment devices measures to increase to a practical voltage by forming a plurality of grooves 15 in a thin film of the solar cell 140, so as to divide it into a number of one-cell batteries (unit solar cells 17) and electrically connect them in series. Such a solar cell is referred to as an integrated solar cell.

Figure 56:
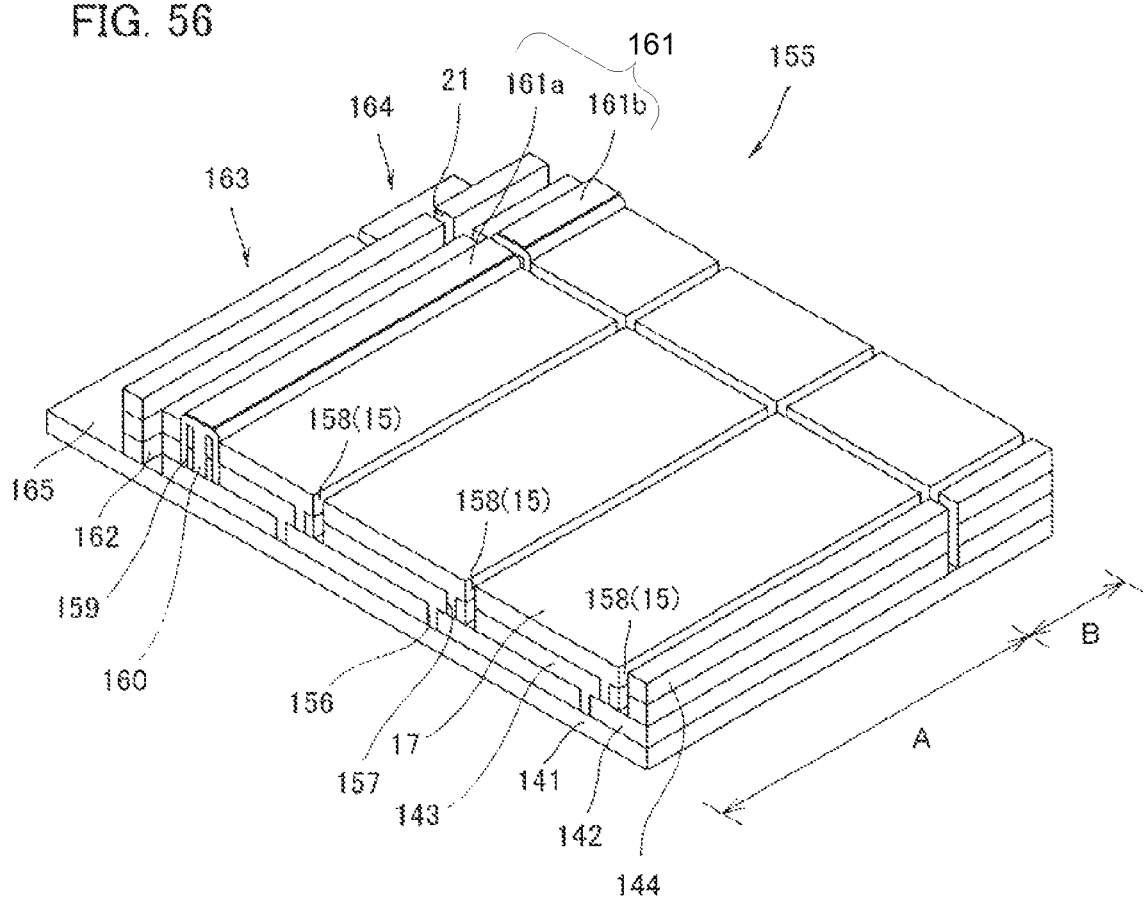
FIG. 56 is a perspective view showing an overlapping state of the solar cell modules.

FIG. 56 is a conceptual diagram explaining conceptually a layer structure of an integrated solar cell constituted in the solar cell panel 13 employed in this embodiment.

The layer structure of an integrated solar cell 155 of the solar cell panel 13 consists of the transparent conductive film 142, the semiconductor layer 143, and the back electrode film 144 sequentially laminated on the glass substrate 141, with grooves 156, 157, 158 formed in the respective layer.

Specifically, the first grooves 156 are formed in the transparent conductive film 142, which is divided into a plurality of pieces. The second grooves (electrical connection grooves) 157 are formed in the semiconductor layer 143, which is divided into a plurality of pieces, further with a part of the back electrode film 144 penetrating inside of each second groove 157 to have contact with the transparent conductive film 142 at the bottom of the groove.

Additionally, there are provided the third grooves 158 formed by cutting the back electrode film 144 and the semiconductor layer 143 and reaching the surface of the transparent conductive film 142.

Further, adjacent to an end portion of the integrated solar cell 155, there are provided three rows of electrode connection grooves 159 formed by cutting the back electrode film 144 and the semiconductor layer 143 and reaching the transparent conductive film 142. Solder 160 is introduced into the electrode connection grooves 159, to which a lead 161 arranged on the laminated body is connected. The lead 161 is communicated with the transparent conductive film 142 via the solder 160. Though not shown, the back electrode film 144 is also electrically communicated via another lead 161 and another solder 160.

There is provided a separation groove 162 formed outside the electrode connection groove 159. The separation groove 162 is, as shown in FIG. 56, formed by cutting all three of the transparent conductive film 142, the semiconductor layer 143, and the back electrode film 144.

Furthermore, the dividing groove 21 crossing the unit solar cells 17 is formed. The dividing groove 21 is, as shown in FIG. 56, also formed by cutting all three of the transparent conductive film 142, the semiconductor layer 143, and the back electrode film 144.

Further, the glass substrate 141 has a bare area 165 with the laminated body removed at the outermost portion.

Additionally, a further back surface of the above-mentioned back electrode film 144 is covered with a covering film not shown.

In the integrated solar cell 155 constructed in the solar cell panel 13, independent cells are formed by zoning each thin film by the first groove 156 formed in the transparent conductive film 142 and the third groove 158 formed in the semiconductor layer 143 (specifically including a p layer, an i layer, and an n layer) and the back electrode film 144. As described above, a part of the back electrode film 144 penetrates into each second groove 157, so as to have contact with the transparent conductive film 142, so that one cell is electrically connected to its adjacent cell in series.

Specifically, an electric current generated in the semiconductor layer (solar cell film) 143 flows from the transparent conductive film 142 toward the back electrode film 144. At this time, since a part of the back electrode film 144 has contact with the transparent conductive film 142 via the second groove 157, the electric current generated in the first cell flows to the transparent conductive film 142 of its adjacent cell. In this manner, the adjacent cells are electrically connected in series, and the voltages of the adjacent cells are added to each other.

Herein, the dividing groove 21 crossing each unit solar cell 17 is formed as described above, thereby constituting large and small integrated solar cells 163, 164. Since the dividing groove 21 is formed by cutting all three of the transparent conductive film 142, the semiconductor layer 143, and the back electrode film 144 as described above, the large and small integrated solar cells 163, 164 are electrically insulated. Only the integrated solar cell 163 in an area A (operational area) on the lower side of the figure is connected to the terminal box 14. Meanwhile, the integrated solar cell 164 in an area B (non-operational area) is not connected to the terminal box 14

Specifically, the lead 161a in the area A (operational area) provided in the end portion is connected to the terminal box 14, whereas the lead 161b in the area B (non-operational area) is not connected to the terminal box 14.

Each groove described above is formed by laser-scribing using a laser beam machine. The bare area 165 is formed by a method such as sandblasting.

It is preferable to use the above-mentioned integrated solar cell or the solar cell called a thin-film solar cell as the solar cell module 10 in the present invention because the solar cell module 10 can be designed thinly.

However, the solar cell used for the solar cell module 10 in the present invention is not limited to such a thin-film solar cell or an integrated solar cell. It may be replaced with a discretionary solar cell.

BRIEF DESCRIPTION OF NUMERALS 1. roof structure
2. slate tile (roof member)
3. fundamental roof structure
5. eaves-side mounting bracket (eaves-side clamp)
6. intermediate mounting bracket (clamp)
10. solar cell module
50. fixing piece
51. connecting piece
52. lower plate
53. first front erecting portion
55. upper plate
56. rear erecting portion
57. supporting plate
58. second front erecting portion
60. front portion
61. cover-plate composing part
64. roof-member holding receptacle
65. module holding receptacle
70. holding-part composing member
71. intermediate plate
72. lower plate
73. upper plate
74. holding plate
75. erecting portion (erecting wall)
85. first flat plate
87. second flat plate
88. second step (front erecting wall)

94. front plate
95. folded part
108. elastomeric foam (cushioning)
109. sealing member (seal material)
111, 112. sealing piece (seal material)

The invention claimed is:

1. A roof structure having a fundamental roof structure and a plurality of solar cell modules arranged on the fundamental roof structure,
   wherein the fundamental roof structure is formed by a plurality of roof members each provided with an attaching hole, and
   wherein the plurality of roof members are arranged outspread planarly in a row to form a plurality of rows on a roof base, are each partly overlapped with an adjacent roof member and partly exposed, and are each fixed to the roof base by a fastening element driven into the attaching hole,
   the roof structure comprising a plurality of clamps,
   wherein the plurality of clamps each comprise a holding part having a throughhole, the holding part being partly or entirely sandwiched between adjacent roof members at an overlapping part and the fastening element being driven into the attaching hole of the roof member located below the holding part through the throughhole, so that an overlying roof member located above covers the throughhole with at least a part other than the attaching hole, and
   the plurality of solar cell modules being mounted on the fundamental roof structure via the clamps, and
   wherein the holding part consists essentially of a lower plate and an upper plate, the lower plate and the upper plate being integrated with a gap therebetween, the upper plate being longer than the lower plate, and
   wherein the clamp is attached either to or near an end portion of a specific roof member so that the lower plate is positioned between the specific roof member and an underlying roof member located below at least a part of the specific roof member, and
   wherein the lower plate has a hole that forms the throughhole and the upper plate has a hole that forms an additional throughhole,
   the fastening element being driven in the hole of the lower plate so as to be driven into the attaching hole of the underlying roof member located below the specific roof member, so that the specific roof member covers the hole of the lower plate with at least a part other than the attaching hole, and
   the upper plate being positioned between the specific roof member and the overlying roof member located above the specific roof member and an additional fastening element being driven into the hole of the upper plate so as to be driven in an attaching hole of the specific roof member, so that the overlying roof member located above the specific roof member covers the hole of the upper plate with at least a part other than the attaching hole.

2. The roof structure as defined in claim 1,
   the lower plate and the upper plate each having a plurality of holes, and
   the fastening element driven in the lower plate being arranged at a shifted position column-wise relative to the additional fastening element driven in the upper plate.

3. The roof structure as defined in claim 1,
   wherein the clamp has an intermediate plate located on the upper plate and a holding plate located on the intermediate plate,
   the lower plate and the upper plate defining a first receptacle opening in one direction relative to the clamp,
   a part of the upper plate and the intermediate plate defining a second receptacle opening in a direction opposite to that of the first receptacle, and
   a part of the intermediate plate and the holding plate defining a third receptacle opening in the same direction as that of the first receptacle, so that the first receptacle holds an eaves-side edge of the specific roof member, the second receptacle holds a ridge-side edge of a solar cell module, and the third receptacle holds an eaves-side edge of the solar cell module of a row located adjacently toward a ridge.

4. The roof structure as defined in claim 3,
   the holding plate being fixed to the intermediate plate and being detachable from the intermediate plate.

5. The roof structure as defined in claim 3,
   the intermediate plate being fixed to the upper plate and being detachable from the upper plate.

6. The roof structure as defined in claim 3,
   wherein the upper plate and the lower plate are continuous with each other via an erecting wall extending substantially upward in a vertical direction from the lower plate,
   the upper plate having a lower portion and an upper portion continuous with the lower portion via a step or a slope, both the lower portion and the upper portion being formed of flat plates, and
   the intermediate plate having a first flat plate and a second flat plate located above a level of the first flat plate, the first flat plate and the second flat plate being arranged substantially in parallel, so that the upper portion of the upper plate and the first flat plate of the intermediate plate are attachable so as to slidably move in a horizontal direction.

7. The roof structure as defined in claim 6,
   the intermediate plate having a front erecting wall extending substantially upward in a vertical direction from a front end of the second flat plate, and
   the holding plate being formed by a front plate of a flat-plate shape and a folded part of a flat-plate shape extending in a horizontal direction from an upper edge of the front plate in a substantially L-shaped cross section, so that the holding plate is attachable to the front erecting wall from the front side.

8. The roof structure as defined in claim 3,
   wherein at least one of a seal material and cushioning material is included in at least one of the first receptacle, the second receptacle, and the third receptacle; and
   the upper plate having hooks for hanging a cable,
   the fastening element being a screw, and
   the roof member being a slate tile.

* * * * *